(12) United States Patent
Momose et al.

(10) Patent No.: US 8,049,042 B2
(45) Date of Patent: Nov. 1, 2011

(54) RESIST POLYMER, RESIST COMPOSITION, PROCESS FOR PATTERN FORMATION, AND STARTING COMPOUNDS FOR PRODUCTION OF THE RESIST POLYMER

(75) Inventors: Hikaru Momose, Yokohama (JP); Atsushi Ootake, Saitama (JP); Tadashi Nakamura, Yokohama (JP); Akifumi Ueda, Yokohama (JP)

(73) Assignee: Mitsubishi Rayon Co., Ltd., Tokyo (JP)

( * ) Notice: Subject to any disclaimer, the term of this patent is extended or adjusted under 35 U.S.C. 154(b) by 1 day.

(21) Appl. No.: 12/411,703

(22) Filed: Mar. 26, 2009

(65) Prior Publication Data

US 2009/0198065 A1 Aug. 6, 2009

Related U.S. Application Data

(62) Division of application No. 10/592,057, filed as application No. PCT/JP2005/004402 on Mar. 8, 2005.

(30) Foreign Application Priority Data

| Mar. 8, 2004 | (JP) | 2004-063616 |
| Mar. 15, 2004 | (JP) | 2004-073183 |
| Jun. 28, 2004 | (JP) | 2004-189889 |
| Jul. 28, 2004 | (JP) | 2004-220036 |
| Aug. 31, 2004 | (JP) | 2004-253002 |
| Dec. 27, 2004 | (JP) | 2004-376738 |
| Jan. 11, 2005 | (JP) | 2005-004315 |

(51) Int. Cl.
*C07C 321/02* (2006.01)
*C07C 321/26* (2006.01)
*C07C 31/18* (2006.01)
*C07C 19/075* (2006.01)
*C07D 221/00* (2006.01)

(52) U.S. Cl. ............ 568/66; 568/61; 568/62; 568/63; 568/64; 568/67; 568/69; 568/700; 568/715; 568/807; 568/808; 568/811; 568/817; 568/818; 568/822; 568/838; 568/840; 568/852; 546/184; 546/186; 546/189; 546/190; 570/101; 570/181; 570/186; 430/270.1

(58) Field of Classification Search .................. None
See application file for complete search history.

(56) References Cited

U.S. PATENT DOCUMENTS

| 6,630,282 B2 | 10/2003 | Oomori et al. |
| 2002/0034704 A1 | 3/2002 | Oomori et al. |
| 2004/0063030 A1 | 4/2004 | Barr et al. |
| 2004/0242798 A1 | 12/2004 | Sounik et al. |
| 2004/0248039 A1 | 12/2004 | Sounik et al. |

FOREIGN PATENT DOCUMENTS

| CN | 1514302 A | 7/2004 |
| EP | 1 403 708 | 3/2004 |
| EP | 1 479 700 | 11/2004 |
| JP | 3-134669 | 6/1991 |
| JP | 2000-214587 | * 8/2000 |
| JP | 2002-62656 | 2/2002 |
| JP | 2002-72481 | 3/2002 |
| JP | 2002-303984 | 10/2002 |

(Continued)

OTHER PUBLICATIONS

Rothstein (Chemical Abstract No. 1925:10431, an English abstract for "Trimethylenebisthioglycolic acid", Berichte der Deutschen Chemischen Gesellschaft [Abteilung] B: Abhandlungen (1925), 58B, p. 53-56).*

(Continued)

*Primary Examiner* — Sin J. Lee
(74) *Attorney, Agent, or Firm* — Oblon, Spivak, McClelland, Maier & Neustadt, L.L.P.

(57) ABSTRACT

To provide a resist polymer comprising, as a structural unit, an acid-decomposable unit having a structure represented by formula (1) or (2) which exhibits a small line edge roughness and produces little defects in DUV excimer laser lithography or the like.

$$J \text{---} \left[ \left\{ (K^1)_{k1} \right\}^n \left\{ (L^1)_{l1} \right\}^n \left\{ (M^1)_{m1} \right\}^n (Y)^n \text{---} \right. \tag{1}$$

$$\left. \text{---} \left\{ (M^2)_{m2} \right\}^n \left\{ (L^2)_{l2} \right\}^n \left\{ (K^2)_{k2} \right\}^n (E)^n \right]_n$$

$$R^1 \text{---} \overset{|}{\underset{CH_2}{\text{C}}} \text{---} (K^1)_{k1} (L^1)_{l1} (M^1)_{m1} \text{---} Y^1 \text{---} (M^2)_{m2} (Y^2)_{n1} \tag{2}$$

$$\text{---} (M^3)_{m3} (L^2)_{l2} (K^2)_{k2} \text{---} S \text{---}$$

In formulas (1) and (2), n represents an integer of 2 to 24; J represents a single bond or a divalent hydrocarbon group which may have a substituent/heteroatom when n=2, or represents an n-valent hydrocarbon group which may have a substituent/heteroatom when n≧3; E represents a residue of a polymerization terminator, a chain transfer agent or a polymerization initiator; $K^1$ and $K^2$ each represent at least one selected from alkylene, cycloalkylene, oxyalkylene, arylene, a divalent thiazoline ring, a divalent oxazoline ring and a divalent imidazoline ring; $L^1$ and $L^2$ each represent at least one selected from —C(O)O—, —C(O)— and —OC(O)—; $M^1$, $M^2$ and $M^3$ each represent at least one selected from alkylene, cycloalkylene, oxyalkylene and arylene; Y, $Y^1$ and $Y^2$ each represent an acid-decomposable linkage; k1, k2, l1, l2, m1, m2, and m3 each represent 0 or 1; and $R^1$ represents H or a methyl group.

13 Claims, No Drawings

FOREIGN PATENT DOCUMENTS

| | | |
|---|---|---|
| JP | 2003-122007 | 4/2003 |
| JP | 2003-280200 | 10/2003 |
| JP | 2003-342306 | 12/2003 |
| JP | 2003-344994 | 12/2003 |
| JP | 2004-151691 | 5/2004 |
| JP | 2004-352989 | 12/2004 |
| KR | 2004030341 | 4/2004 |

OTHER PUBLICATIONS

JPO English abstract for JP2000-214587.*

Nedolya, et al., Zhurnal Organicheskoi Khimii, vol. 23, No. 6, 1987, 2 cover pages and pp. 1180-1185.

U.S. Appl. No. 13/032,299, filed Feb. 22, 2011, Momose, et al.

* cited by examiner

RESIST POLYMER, RESIST COMPOSITION, PROCESS FOR PATTERN FORMATION, AND STARTING COMPOUNDS FOR PRODUCTION OF THE RESIST POLYMER

CROSS REFERENCE TO RELATED APPLICATION

This application is a divisional of U.S. application Ser. No. 10/592,057, filed on Sep. 8, 2006, which is a 371 of PCT/JP05/004402, filed on Mar. 8, 2005, and claims priority to the following applications: Japanese Patent Application No. 2004-063616, filed on Mar. 8, 2004; Japanese Patent Application No. 2004-073183, filed on Mar. 15, 2004; Japanese Patent Application No. 2004-189889, filed on Jun. 28, 2004; Japanese Patent Application No. 2004-220036, filed on Jul. 28, 2004; Japanese Patent Application No. 2004-253002, filed on Aug. 31, 2004; Japanese Patent Application No. 2004-376738, filed on Dec. 27, 2004; and Japanese Patent Application No. 2005-004315, filed on Jan. 11, 2005.

TECHNICAL FIELD

The present invention relates to resist polymers, resist compositions and a patterning process, particularly to chemically amplified resist compositions suitable for microfabrication using excimer lasers, electron beams and X-rays. The present invention also relates to new raw material compounds for producing resist polymers.

BACKGROUND ART

In recent years, in the field of microfabrication in the manufacture of semiconductor devices and liquid crystal devices, a finer fabrication technique is rapidly advancing due to the progress of a lithography technology. Typically, shorter wavelength of irradiation light has been used as the finer fabrication technique. Specifically, the irradiation light has been changed from conventional ultraviolet rays typified by the g-line (wavelength: 438 nm) and the i-line (wavelength: 365 nm) to DUV (Deep Ultra Violet) rays.

Presently, KrF excimer laser (wavelength: 248 nm) lithography technology has been introduced into the market, and ArF excimer laser (wavelength: 193 nm) lithography technology, which is directed toward a laser with a shorter wavelength, is being introduced. Moreover, $F_2$ excimer laser (wavelength: 157 nm) lithography technology is studied as a next generation technology. Furthermore, electron beams lithography technology and EUV lithography technology using an extreme ultra violet light (EUV light) around a wavelength of 13.5 nm are also intensively studied as lithography technologies somewhat different from the technologies.

As a resist with high resolution for such an irradiation light with a short wavelength or electron beams, a "chemically amplified resist" containing a photo acid generator has been proposed, and at present, improvement and development of a chemically amplified resist have vigorously been progressing.

As a resist resin used in ArF excimer laser lithography, an acryl resin that is transparent to a light with a wavelength of 193 nm has received attention. As such an acrylic resin, Patent Document 1 discloses a chemically amplified resist composition containing a polymer which exhibits alkali solubility by the decomposition of a side chain thereof.

However, when such a polymer is used as a resist composition for ArF excimer laser lithography, there is a problem in the solubility thereof in a developer. The problem causes defects and large line edge roughness.

On the other hand, in KrF excimer laser lithography, Patent Document 2 describes a resist composition having high resolution and excellent etching resistance. In this document, a hydroxylstyrene resin prepared by copolymerizing a crosslinking agent having an acid-decomposing tertiary ester structure is used as a raw material.

However, since the resin described in Patent Document 2 is a styrene resin, it cannot be used for ArF excimer laser lithography. An acrylic resin prepared by copolymerizing the crosslinking agent having a tertiary ester structure as described in Patent Document 2 may be used. However, line edge roughness or defects cannot sufficiently be improved even if the crosslinking agent having an acid-decomposing tertiary ester structure is simply copolymerized with an acrylic resin.

Patent Document 1: Japanese Patent Laid-Open No. 2003-122007
Patent Document 2: Japanese Patent Laid-Open No. 2002-62656

DISCLOSURE OF THE INVENTION

Problems to be Solved by the Invention

It is an object of the present invention to provide a resist polymer and a resist composition which exhibit a small line edge roughness and produce little defects when used in DUV excimer laser lithography or electron beam lithography or the like, to provide a patterning process using the resist composition, and to provide a compound which is one of the raw materials for producing the resist polymer.

Means for Solving the Problems

A first aspect of the present invention relates to a resist polymer comprising, as a structural unit, an acid-decomposable unit having a structure represented by the following formula (1) or (2):

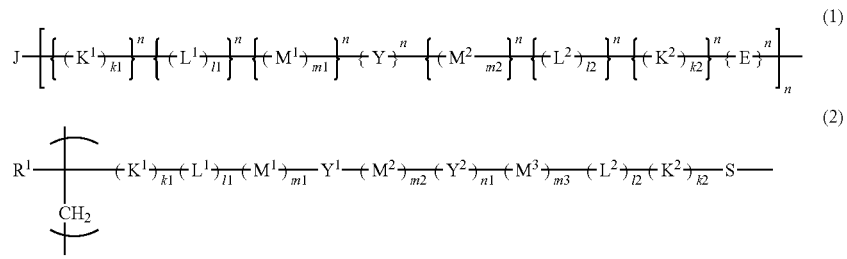

wherein n represents an integer of 2 to 24; J represents a single bond or a divalent hydrocarbon group which may have a substituent and/or a heteroatom when n=2 or represents an n-valent hydrocarbon group which may have a substituent and/or a heteroatom when n≧3; E represents a residue of a polymerization terminator, a chain transfer agent or a polymerization initiator; $K^1$ and $K^2$ each independently represent at least one selected from the group consisting of alkylene, cycloalkylene, oxyalkylene, arylene, a divalent thiazoline ring, a divalent oxazoline ring and a divalent imidazoline ring; $L^1$ and $L^2$ each independently represent at least one selected from the group consisting of —C(O)O—, —C(O)— and —OC(O)—; $M^1$, $M^2$ and $M^3$ each independently represent at least one selected from the group consisting of alkylene, cycloalkylene, oxyalkylene and arylene; Y, $Y^1$ and $Y^2$ each independently represent an acid-decomposable linkage; k1, k2, l1, l2, m1, m2 and m3 each represent the number of $K^1$, $K^2$, $L^1$, $L^2$, $M^1$, $M^2$ and $M^3$, respectively, and are each independently 0 or 1; $R^1$ represents a hydrogen atom or a methyl group; and S represents a sulfur atom.

A second aspect of the present invention relates to an acrylic resist polymer comprising an acid-decomposable unit having a structure represented by the following formula (3) and a unit having a hydrophilic group, as a structural unit:

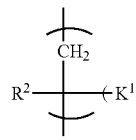 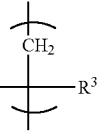 (3)

wherein $K^1$ and $K^2$ each independently represent at least one selected from the group consisting of alkylene, cycloalkylene, oxyalkylene, arylene, a divalent thiazoline ring, a divalent oxazoline ring and a divalent imidazoline ring; $L^1$ and $L^2$ each independently represent at least one selected from the group consisting of —C(O)O—, —C(O)— and —OC(O)—; $M^1$, $M^2$ and $M^3$ each independently represent at least one selected from the group consisting of alkylene, cycloalkylene, oxyalkylene and arylene; $Y^1$ and $Y^2$ each independently represent an acid-decomposable linkage; k1, k2, l1, l2, m1, m2, m3 and n1 each represent the number of $K^1$, $K^2$, $L^1$, $L^2$, $M^1$, $M^2$, $M^3$ and $Y^2$, respectively, and are each independently 0 or 1; and $R^2$ and $R^3$ each independently represent a hydrogen atom or a methyl group.

A third aspect of the present invention relates to a resist composition containing a resist polymer of the first or second aspect of the present invention as described above.

A fourth aspect of the present invention relates to a patterning process comprising the steps of applying a composition containing a resist composition of the third aspect of the present invention as described above and a photo acid generator on the substrate to be processed, exposing the coated product and developing the exposed product with a developer.

A fifth aspect of the present invention relates to a compound represented by the following formula (6):

wherein n represents an integer of 2 to 24; J represents a single bond or a divalent hydrocarbon group which may have a substituent and/or a heteroatom when n=2 or represents an n-valent hydrocarbon group which may have a substituent and/or a heteroatom when n≧3; $E^1$ represents a functional group having polymerization termination ability or chain transfer ability; $K^1$ and $K^2$ each independently represent at least one selected from the group consisting of alkylene, cycloalkylene, oxyalkylene, arylene, a divalent thiazoline ring, a divalent oxazoline ring and a divalent imidazoline ring; $L^1$ and $L^2$ each independently represent at least one selected from the group consisting of —C(O)O—, —C(O)— and —OC(O)—; $M^1$ and $M^2$ each independently represent at least one selected from the group consisting of alkylene, cycloalkylene, oxyalkylene and arylene; Y represents an acid-decomposable linkage; and k1, k2, l1, l2, m1 and m2 each represent the number of $K^1$, $K^2$, $L^1$, $L^2$, $M^1$ and $M^2$, respectively, and are each independently 0 or 1, the compound used for producing a resist polymer of the first aspect of the present invention as described above.

Effects of the Invention

When a resist polymer of the present invention is used as a resist resin in DUV excimer laser lithography or electron beam lithography, the resist polymer has the effect of improving solubility in a developer, suppressing production of defects and exhibiting a small line edge roughness, without losing high sensitivity and high resolution compared with conventional resist polymers.

BEST MODE FOR CARRYING OUT THE INVENTION

Hereinafter, the present invention will now be described, wherein "(meth)acrylic acid" means "acrylic acid or methacrylic acid", and "(meth)acrylonitrile" means "acrylonitrile or methacrylonitrile".

Moreover, in the present invention, an acid-decomposable unit refers to a unit in which the linkage of recurring units of a polymer is cleaved by the action of an acid to decompose the recurring units themselves. Moreover, a unit having an acid-eliminable group refers to a unit having a group that is eliminated by the cleavage of the linkage other than the linkage of recurring units of a polymer by the action of an acid.

A resist polymer of the present invention contains an acid-decomposable unit as a structural unit. The acid-decomposable unit is at least one of the structural units represented by the following formulas (1) to (3).

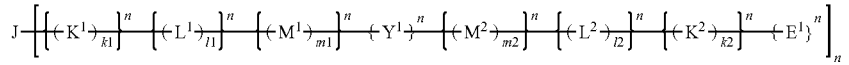 (6)

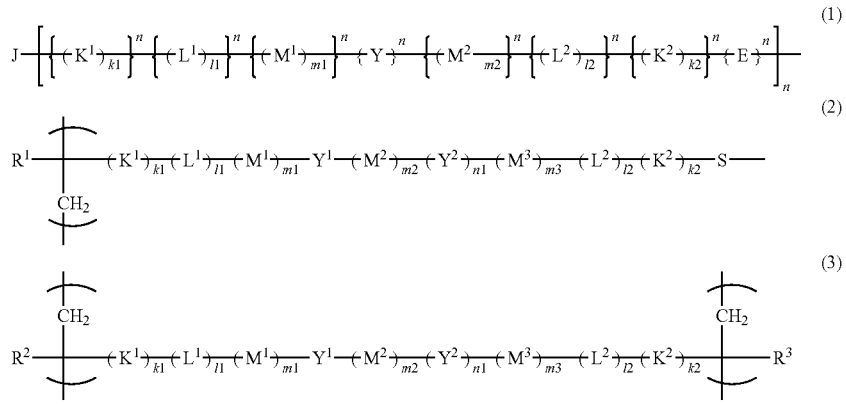

In formulas (1) to (3), $R^1$ to $R^3$ each independently represent a hydrogen atom or a methyl group; S represents a sulfur atom; and n represents an integer of from 2 to 24.

In formulas (1) to (3), $K^1$ and $K^2$ each independently represent at least one selected from the group consisting of alkylene, cycloalkylene, oxyalkylene, arylene, a divalent thiazoline ring, a divalent oxazoline ring and a divalent imidazoline ring; $L^1$ and $L^2$ each independently represent at least one selected from the group consisting of —C(O)O—, —C(O)— and —OC(O)—; and $M^1$ to $M^3$ each independently represent at least one selected from the group consisting of alkylene, cycloalkylene, oxyalkylene and arylene.

In formulas (1) and (2), $K^1$ and $K^2$ are preferably selected from alkylene, cycloalkylene and arylene; $L^1$ and $L^2$ are preferably selected from —C(O)O— and —OC(O)—; and $M^1$ to $M^3$ are preferably selected from alkylene, cycloalkylene and arylene.

Further, k1, k2, l1, l2, m1, m2 and m3 each represent the number of $K^1$, $K^2$, $L^1$, $L^2$, $M^1$, $M^2$ and $M^3$, respectively, and are each independently 0 or 1.

In formulas (1) to (3), Y, $Y^1$ and $Y^2$ each independently represent an acid-decomposable linkage.

Here, examples of the acid-decomposable linkage include, but not limited to, the following formulas (23-1) to (23-4).

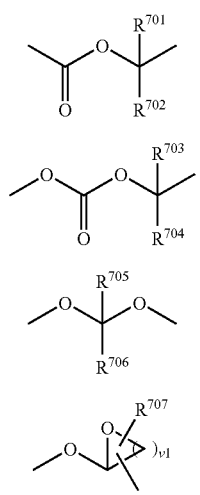

In formulas (23-1) to (23-4), $R^{701}$, $R^{702}$, $R^{703}$ and $R^{704}$ each independently represent a linear, branched or cyclic alkyl or alkenyl group having 1 to 18 carbon atoms or an aryl group. Alternatively, $R^{701}$, $R^{702}$, $R^{703}$ and $R^{704}$ each form a cyclic hydrocarbon group together with a carbon atom to which each of them is bonded.

$R^{705}$ and $R^{706}$ each independently represent a hydrogen atom, a linear or branched alkyl or alkenyl group having 1 to 18 carbon atoms or an aryl group.

$R^{707}$ represents a hydrogen atom, a linear or branched alkyl or alkenyl group having 1 to 4 carbon atoms or an aryl group, and v1 represents an integer of 1 to 5.

The action of the acid-decomposable linkage will be described using formulas (23-1) to (23-4) as examples. In the case of the linkage represented by formula (23-1), an ester linkage is decomposed to form a carboxyl group and a residue by an acid. In the case of the linkage represented by formula (23-2), a carbonate linkage is decomposed by decarboxylation. In the case of the linkages represented by formulas (23-3) and (23-4), an acetal or ketal is decomposed to form a hydroxyl group and a residue by an acid. Among others, formula (23-1) or (23-3) is preferred due to high acid-decomposability thereof.

A polymer containing the acid-decomposable unit becomes soluble in an alkali developer when it is decomposed by the action of an acid. Conventional resist polymers have been solubilized in alkali by the increase in polarity of side chain terminals due to decomposition or elimination of side chains of structural units having acid-eliminable groups. Consequently, the molecular weight was not significantly changed before and after the decomposition. On the other hand, in the case of the polymer of the present invention, the polymer itself decomposes by the action of an acid to significantly reduce the molecular weight, thereby significantly increasing the solubility in a developer compared to conventional polymers. Accordingly, such a polymer can suitably be used for a resist composition which exhibits a small line edge roughness and produces little defects.

In formula (1), J represents a single bond or a divalent hydrocarbon group which may have a substituent and/or a heteroatom, when n=2; or J represents an n-valent hydrocarbon group which may have a substituent and/or a heteroatom, when n≧3.

In formula (1), a structure represented by J combines a functional group having acid-decomposable linkage and polymerization termination ability or chain transfer ability or combines a branch containing a vinyl ether group.

In formula (1), a substituent that J itself has includes a linear, branched or cyclic alkyl group having 1 to 6 carbon atoms which may have one or more groups selected from the group consisting of a thiol group, a hydroxyl group, a carboxyl group, an acyl group having 1 to 6 carbon atoms, a carboxyl group esterified with an alcohol having 1 to 6 carbon atoms, a carboxyl group thioesterified with a thiol having 1 to 6 carbon atoms, a cyano group, an amino group, halogen and a nitroxy group; a thiol group; a hydroxyl group; a carboxyl group; an acyl group having 1 to 6 carbon atoms; an alkoxy group having 1 to 6 carbon atoms; a carboxyl group esterified with an alcohol having 1 to 6 carbon atoms; a carboxyl group thioesterified with a thiol having 1 to 6 carbon atoms; a cyano group; an amino group; halogen or a nitroxy group. Further, a heteroatom contained in J includes a sulfur atom, a nitrogen atom, an oxygen atom and a phosphorus atom. At this time, the number of the bonds from a heteroatom varies depending on the valence of the heteroatom.

Examples of J include structures represented by the following formulas (24-1) to (24-198).

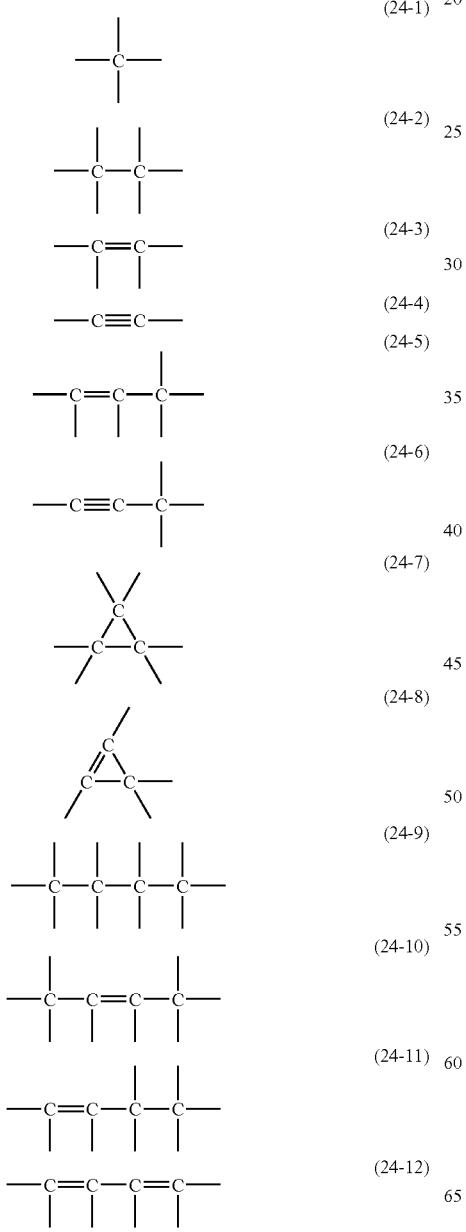
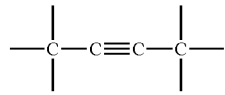
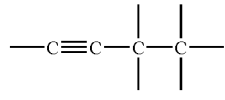
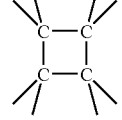
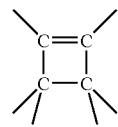
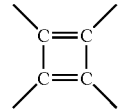
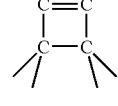
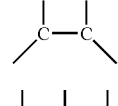
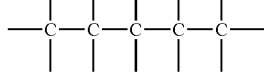
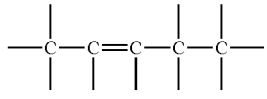
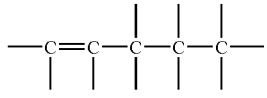
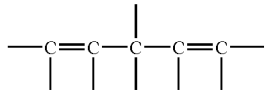
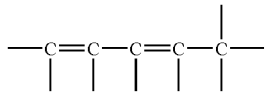
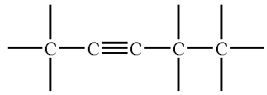
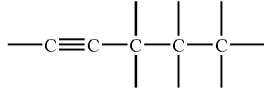

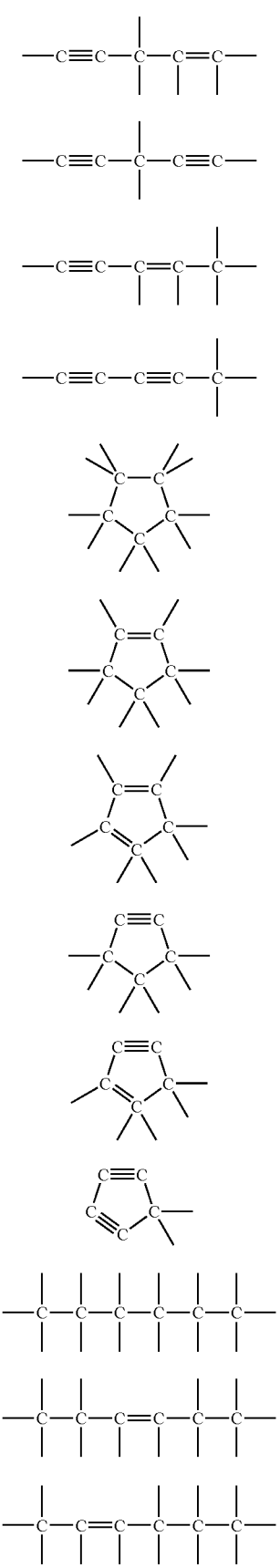
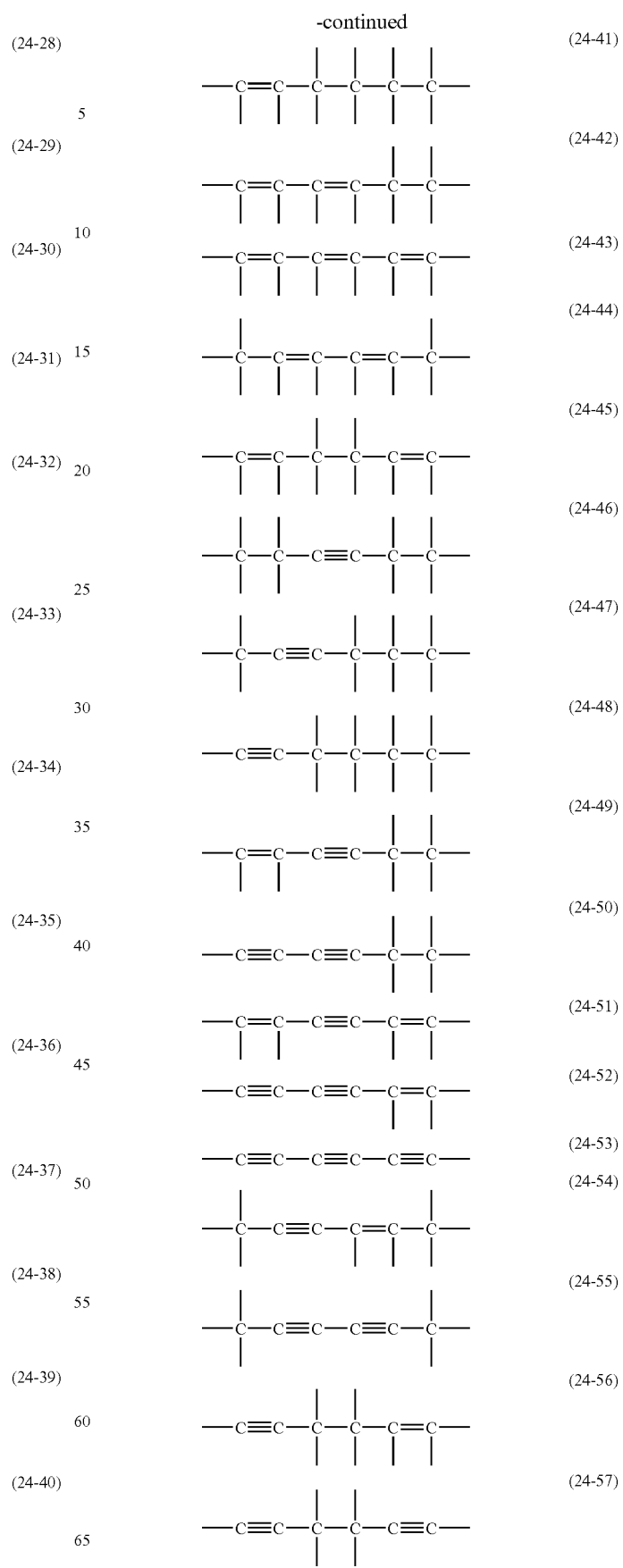

-continued
(24-58)
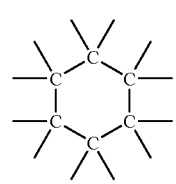
(24-59)
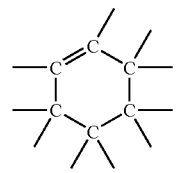
(24-60)
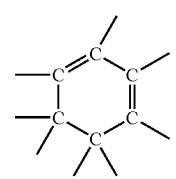
(24-61)
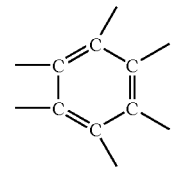
(24-62)
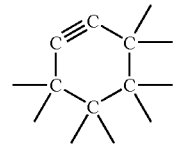
(24-63)
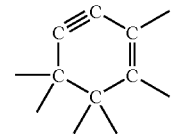
(24-64)
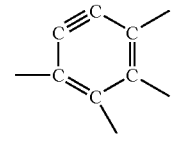
(24-65)
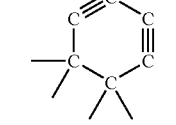
(24-66)
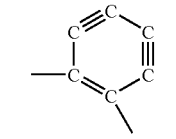
(24-67)
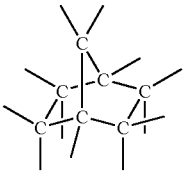
-continued
(24-68)
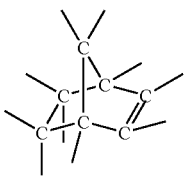
(24-69)
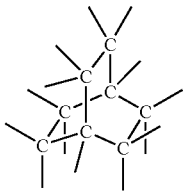
(24-70)
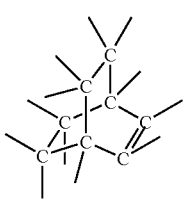
(24-71)
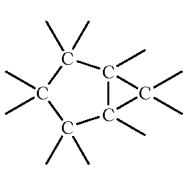
(24-72)
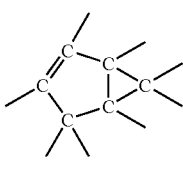
(24-73)
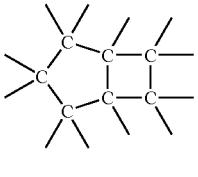
(24-74)
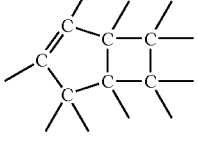
(24-75)
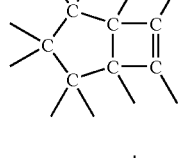
(24-76)
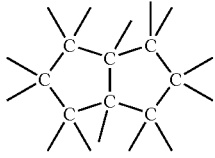

-continued
(24-77)
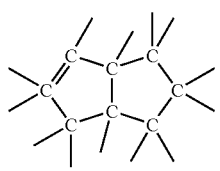
(24-78)
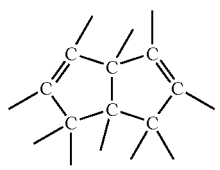
(24-79)
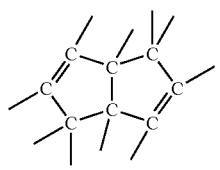
(24-80)
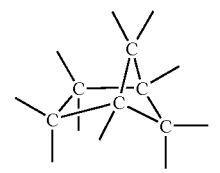
(24-81)
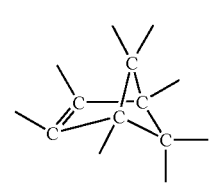
(24-82)
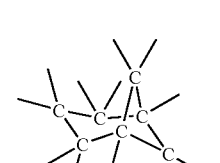
(24-83)
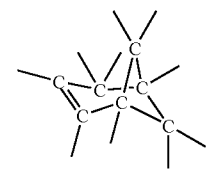
(24-84)
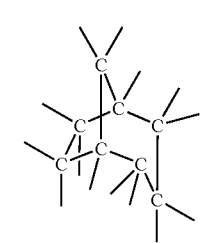
-continued
(24-85)
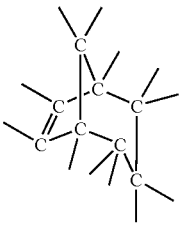
(24-86)
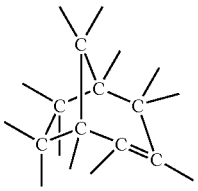
(24-87)
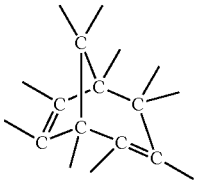
(24-88)
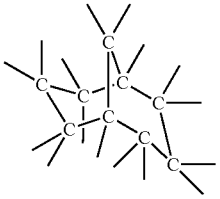
(24-89)
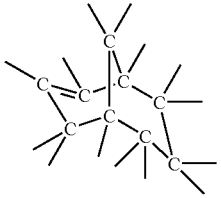
(24-90)
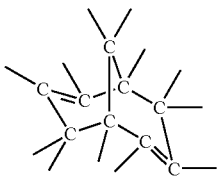
(24-91)
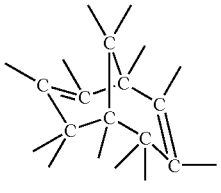
(24-92)
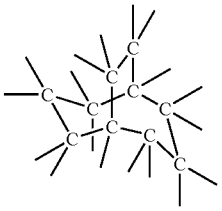

(24-93)
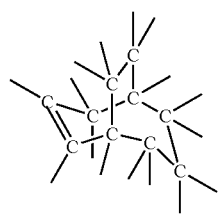
(24-94)
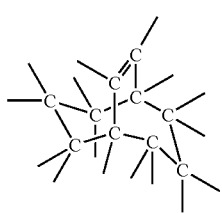
(24-95)
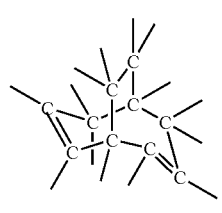
(24-96)
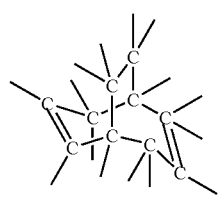
(24-97)
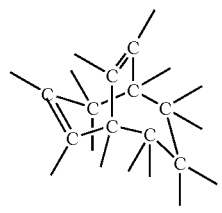
(24-98)
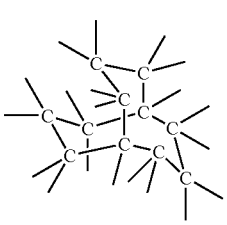
(24-99)
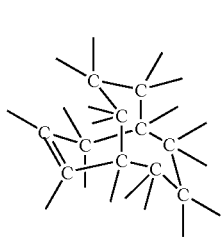
(24-100)
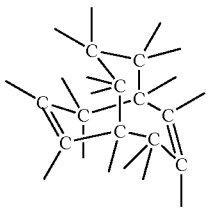
(24-101)
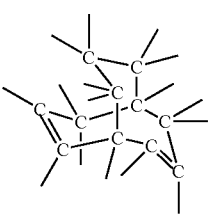
(24-102)
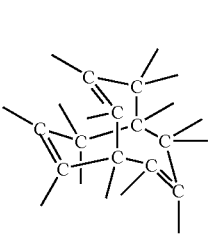
(24-103)
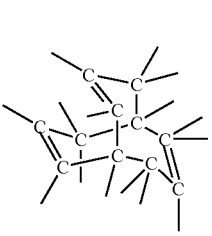
(24-104)
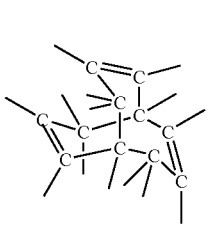
(24-105)
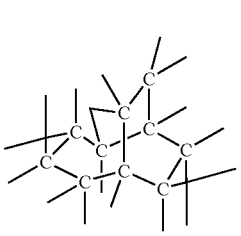
(24-106)
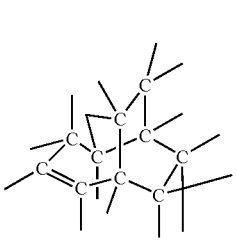

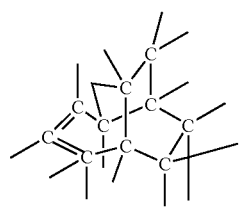
(24-107)
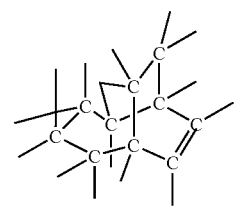
(24-108)
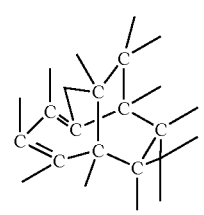
(24-109)
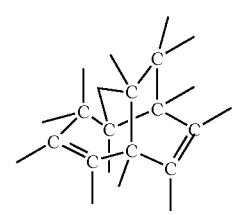
(24-110)
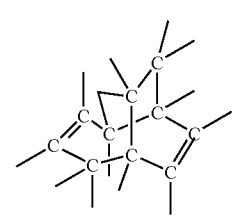
(24-111)
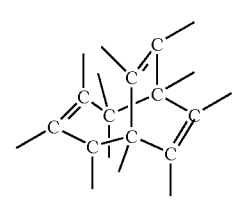
(24-112)
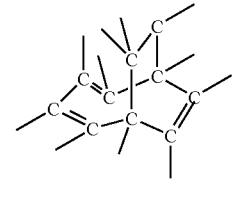
(24-113)
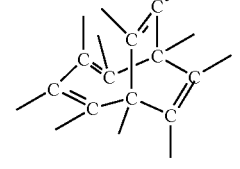
(24-114)
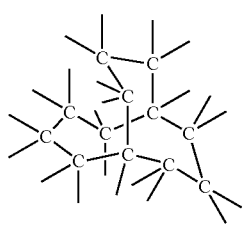
(24-115)
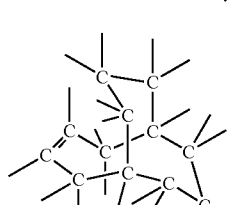
(24-116)
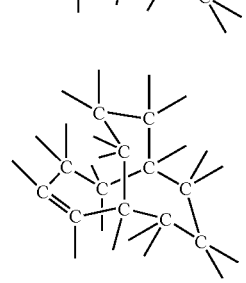
(24-117)
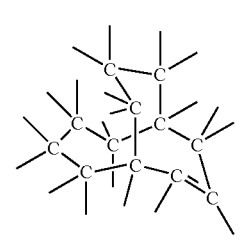
(24-118)
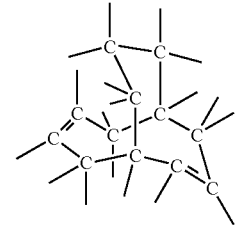
(24-119)
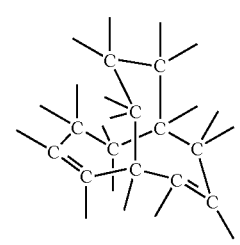
(24-120)
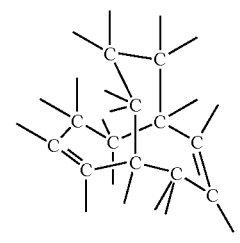
(24-121)

-continued
(24-122)
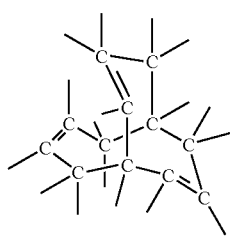
(24-123)
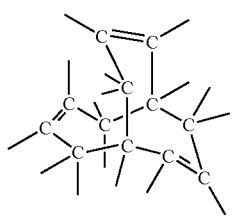
(24-124)
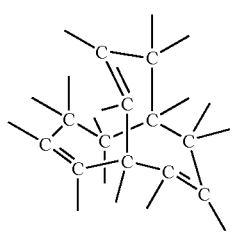
(24-125)
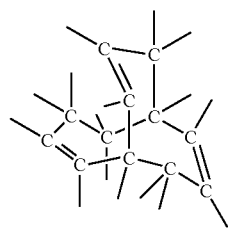
(24-126)
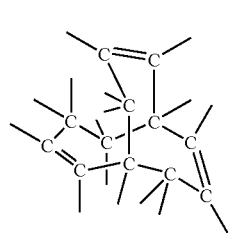
(24-127)
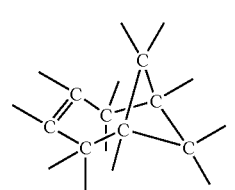
(24-128)
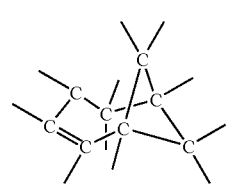
-continued
(24-129)
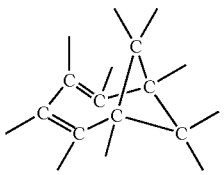
(24-130)
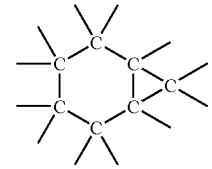
(24-131)
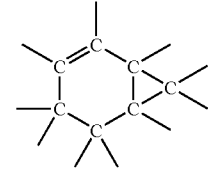
(24-132)
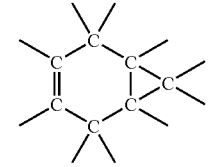
(24-133)
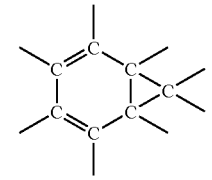
(24-134)
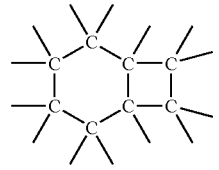
(24-135)
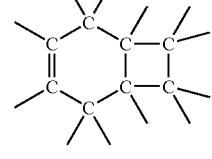
(24-136)
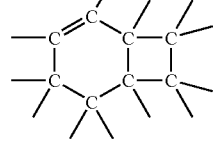
(24-137)
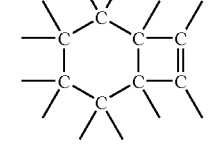

(24-138)
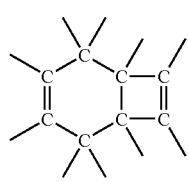
(24-139)
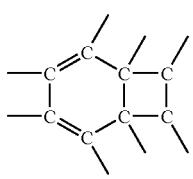
(24-140)
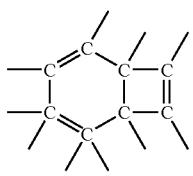
(24-141)
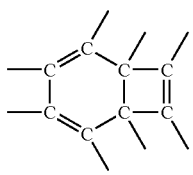
(24-142)
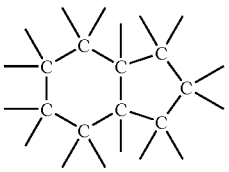
(24-143)
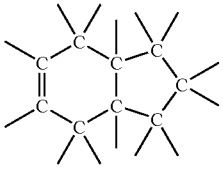
(24-144)
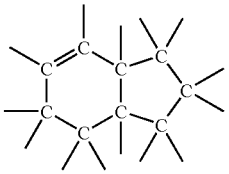
(24-145)
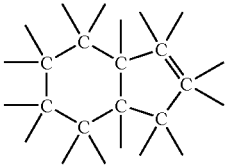
(24-146)
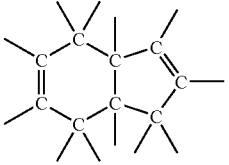
(24-147)
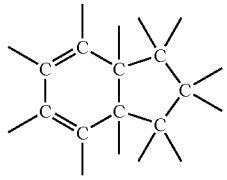
(24-148)
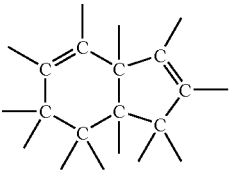
(24-149)
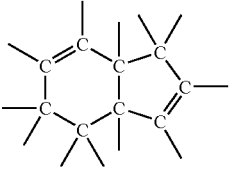
(24-150)
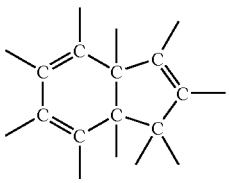
(24-151)
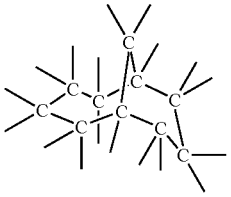
(24-152)
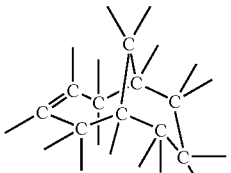
(24-153)
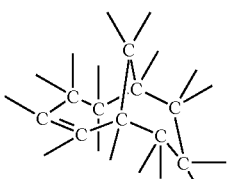
(24-154)
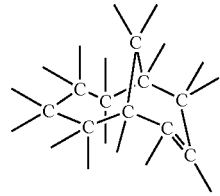

(24-155)
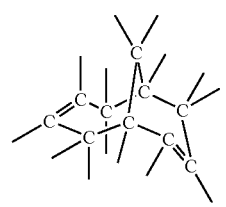
(24-156)
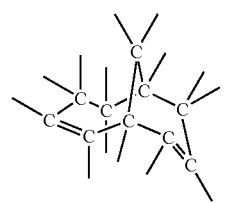
(24-157)
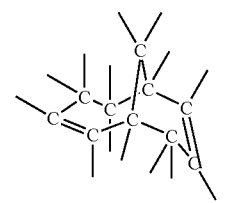
(24-158)
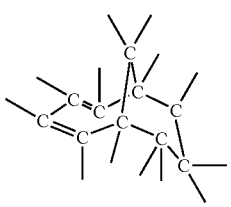
(24-159)
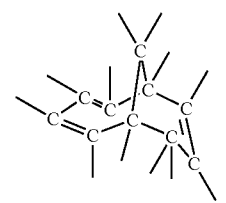
(24-160)
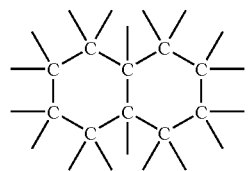
(24-161)
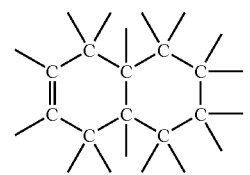
(24-162)
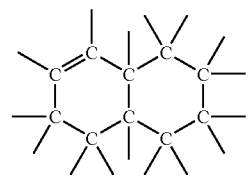
(24-163)
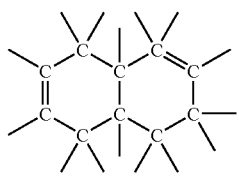
(24-164)
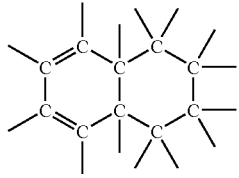
(24-165)
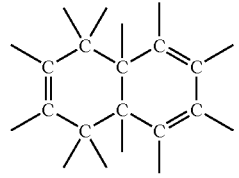
(24-166)
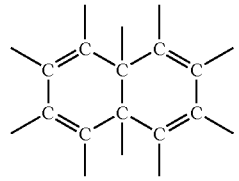
(24-167)
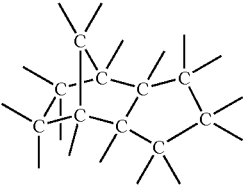
(24-168)
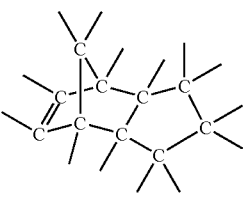
(24-169)
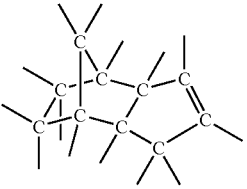
(24-170)
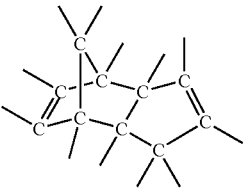

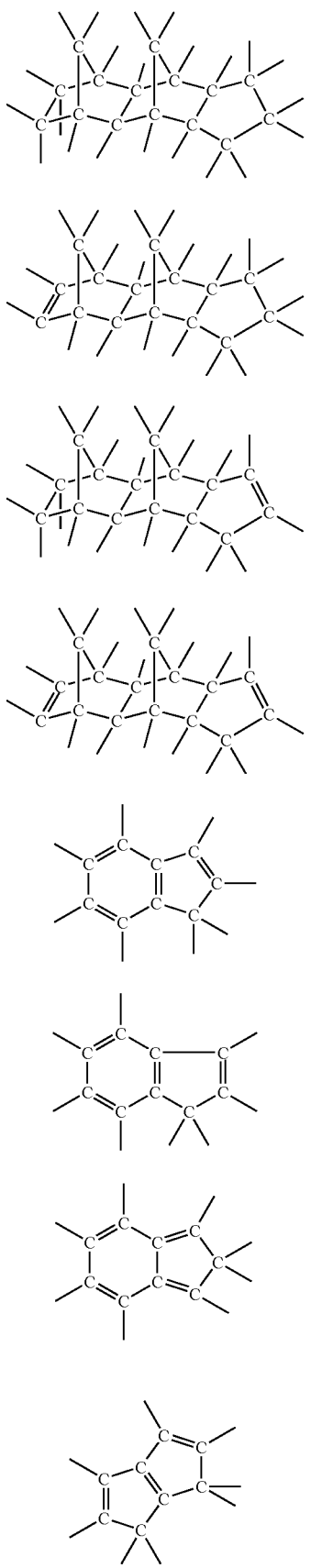
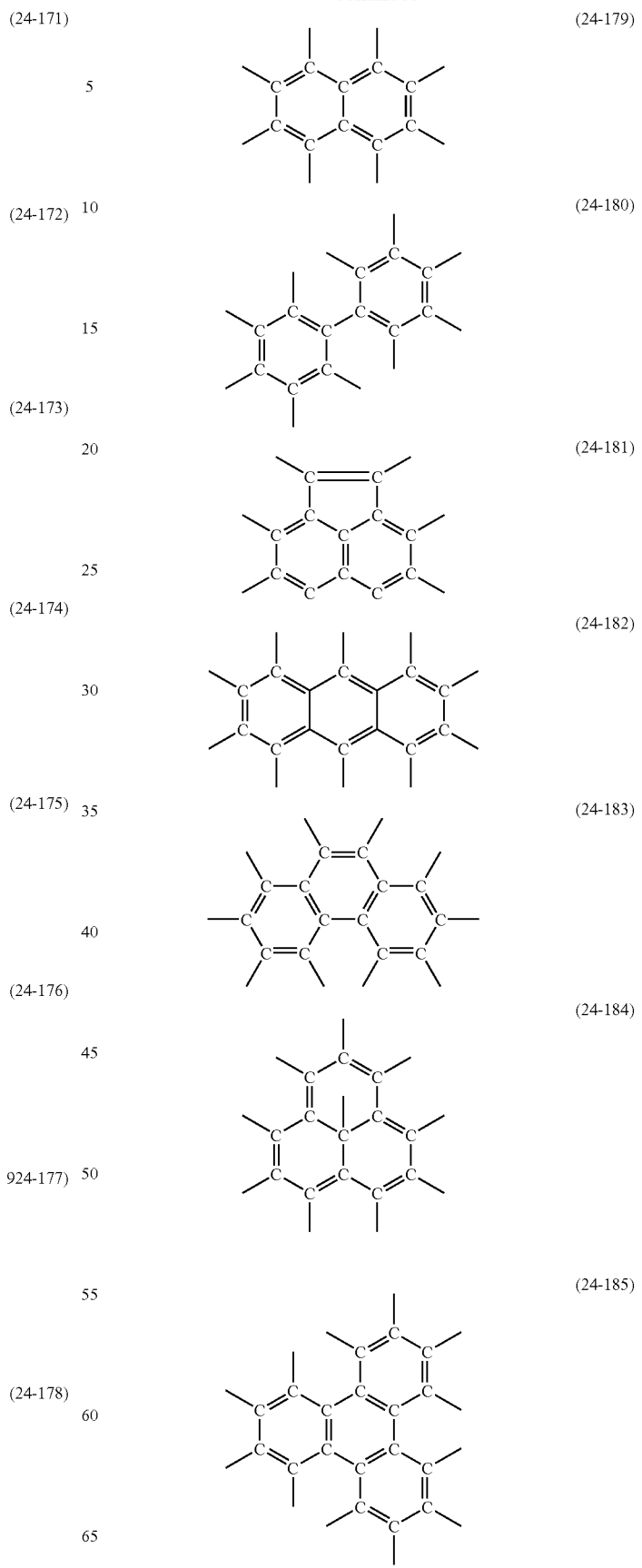

(24-186)
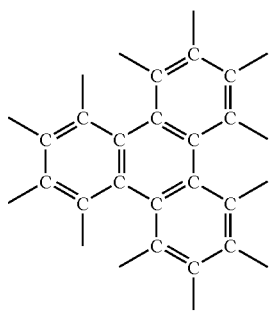

(24-187)
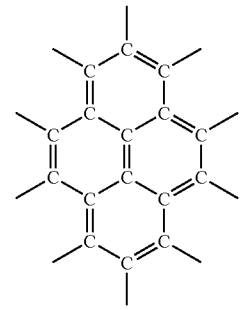

(24-188)
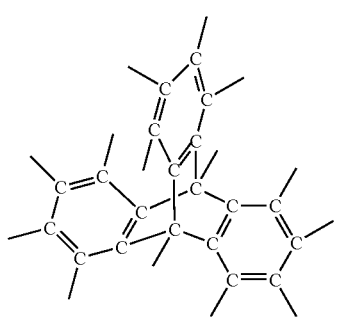

(24-189)
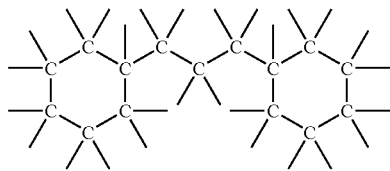

(24-190)
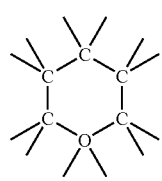

(24-191)
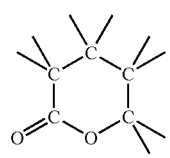

(24-192)
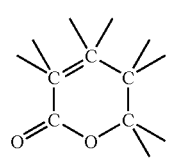

(24-193)
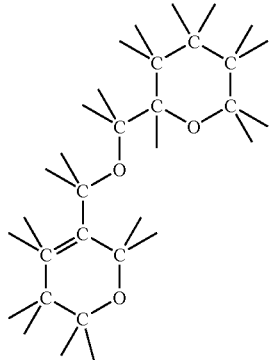

(24-194)
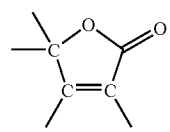

(24-195)
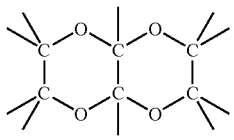

(24-196)
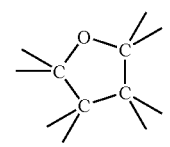

(24-197)
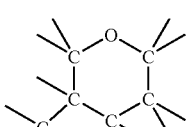

(24-198)
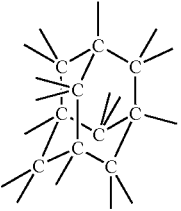

Among others, those represented by formulas (24-1), (24-61), (24-179), and (24-190) to (24-198) are preferred.

Moreover, in formula (1), E represents a residue of a polymerization terminator, a chain transfer agent or a polymerization initiator.

In formula (1), E represents —$B^{11}$—, —S—, —O—, —$NB^{12}$—O— or —$NB^{12}$—$B^{11}$—, wherein $B^{11}$ includes a linear, branched or cyclic divalent hydrocarbon group having 1 to 20 carbon atoms which may have at least one group selected from the group consisting of a carboxyl group esterified with an alcohol having 1 to 6 carbon atoms, a cyano group and an amino group. The $B^{11}$ may have a heteroatom in the main skeleton thereof, and $B^{12}$ represents a hydrogen atom, or a linear, branched or cyclic alkyl group having 1 to 10 carbon atoms.

Among others, in formula (1), when n=2 and E is —S—, formula (1) is a structure represented by the following formula (4).

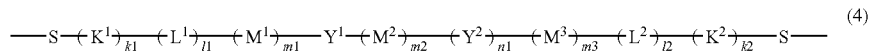
(4)

In formula (4), S represents a sulfur atom; and $K^1, K^2, L^1, L^2, M^1, M^2, M^3, Y^1, Y^2, k1, k2, l1, l2, m1, m2, m3$ and $n1$ each have the same meaning as in formula (1).

The resist polymer of the present invention shows improved defects and line edge roughness of the resist by containing the acid-decomposable unit in formulas (1) to (3) as a structural unit thereof.

In particular, the resist polymer preferably contains an acid-decomposable unit represented by formulas (1) to (3) and a unit having a hydrophilic group, because the defects and line edge roughness of the resist tend to be improved by a synergistic effect of these units.

Since the synergistic effect is large, particularly in the case of an acid-decomposable unit represented by formula (3), the unit is preferably combined with a unit having a hydrophilic group.

The resist polymer containing an acid-decomposable unit represented by formula (3) and a unit having a hydrophilic group is preferably an acrylic polymer. Here, the acrylic polymer means a polymer containing 50% by mole or more of a structural unit represented by the following formula (25).

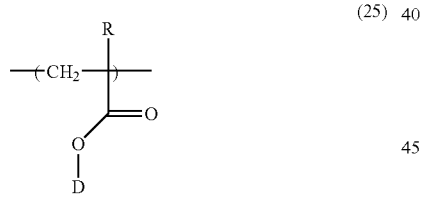
(25)

In formula (25), R represents a hydrogen atom or a methyl group; and D represents any group which composes a hydrophilic group or contains a hydrophilic group.

Here, the hydrophilic group refers to any of —C(CF$_3$)$_2$—OH, a hydroxyl group, a cyano group, a methoxy group, a carboxyl group and an amino group.

The unit having the hydrophilic group preferably includes those in which D in formula (25) is a hydrogen atom, a linear or branched alkyl group having 1 to 6 carbon atoms, a cyclic hydrocarbon group having 4 to 8 carbon atoms, a crosslinked cyclic hydrocarbon group having 4 to 16 carbon atoms or a lactone group, these groups at least having the hydrophilic group as a substituent. Specifically, the unit is preferably, but not limited to, at least one selected from the group consisting of the following formulas (26-1) to (26-7) in terms of high dry-etching resistance required for resists.

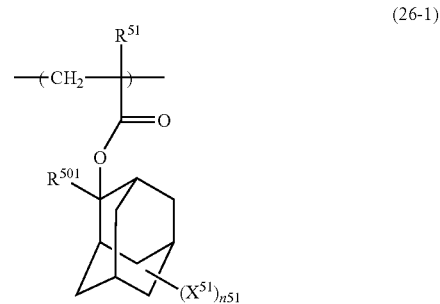
(26-1)

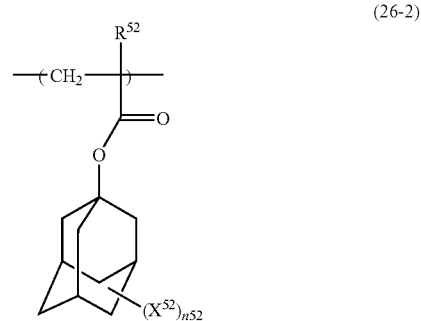
(26-2)

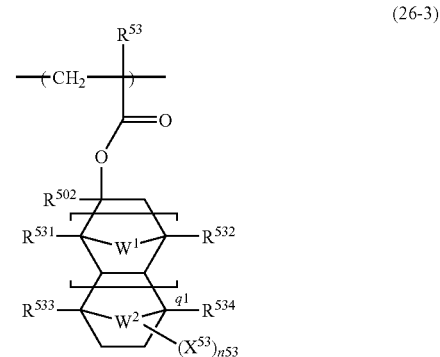
(26-3)

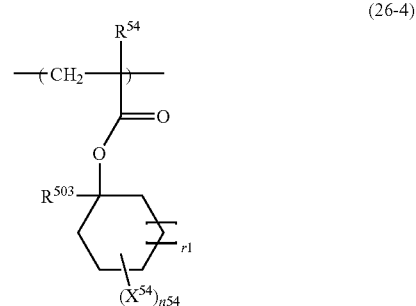
(26-4)

(26-5)

(26-6)

(26-7)

In formulas, $R^{51}$, $R^{52}$, $R^{53}$, $R^{54}$, $R^{55}$, $R^{56}$ and $R^{57}$ each independently represent a hydrogen atom or a methyl group; $R^{501}$, $R^{502}$, $R^{503}$ and $R^{506}$ each independently represent a hydrogen atom or an alkyl group having 1 to 3 carbon atoms; $R^{504}$ and $R^{505}$ each independently represent an alkyl group having 1 to 3 carbon atoms; $R^{531}$, $R^{532}$, $R^{533}$, $R^{534}$, $R^{535}$ and $R^{536}$ each independently represent a hydrogen atom or a linear or branched alkyl group having 1 to 6 carbon atoms; and $R^{571}$ and $R^{572}$ each represent a crosslinked cyclic hydrocarbon group having 4 to 16 carbon atoms or a linear or branched alkyl group having 1 to 6 carbon atoms which has a crosslinked cyclic hydrocarbon group having 4 to 16 carbon atoms and may form a crosslinked cyclic hydrocarbon group having 4 to 16 carbon atoms together with the carbon atom to which $R^{571}$ and $R^{572}$ are bonded; $W^1$, $W^2$ and $W^3$ each independently represent —O—, —S—, —NH— or a methylene chain having a chain length of 1 to 6 {—$(CH_2)_t$— (wherein t represents an integer of 1 to 6)}; $X^{51}$, $X^{52}$, $X^{53}$, $X^{54}$, $X^{55}$, $X^{56}$ and $X^{57}$ each independently represent, as a substituent, a linear or branched alkyl group having 1 to 6 carbon atoms which may have at least one group selected from the group consisting of —$C(CF_3)_2$—OH, a hydroxyl group, a cyano group, a carboxyl group, an acyl group having 1 to 6 carbon atoms, a carboxyl group esterified with an alcohol having 1 to 6 carbon atoms and an amino group, —$C(CF_3)_2$—OH, a hydroxyl group, a cyano group, a carboxyl group, an acyl group having 1 to 6 carbon atoms, an alkoxy group having 1 to 6 carbon atoms, a carboxyl group esterified with an alcohol having 1 to 6 carbon atoms or an amino group; n51, n52, n53, n54, n55 and n56 each represent an integer of 1 to 4; and q1 and q2 each represent 0 or 1. When n51, n52, n53, n54, n55 or n56 is an integer of 2 or more, a plurality of different groups may be contained as $X^{51}$, $X^{52}$, $X^{53}$, $X^{54}$, $X^{55}$ or $X^{56}$, respectively.

Here, the alkyl group and crosslinked cyclic hydrocarbon group of $R^{571}$ and $R^{572}$ may have a linear or branched alkyl group having 1 to 6 carbon atoms, and $R^{571}$ and $R^{572}$ may further have a hydroxyl group, a carboxyl group, an acyl group having 2 to 6 carbon atoms or a carboxyl group esterified with an alcohol having 1 to 6 carbon atoms.

Each of $R^{501}$ in formula (26-1), $R^{502}$ in formula (26-3), $R^{503}$ in formula (26-4) and $R^{506}$ in formula (26-6) is preferably a methyl group, an ethyl group or an isopropyl group in terms of sensitivity and resolution, or a hydrogen atom in terms of good solubility in organic solvents.

Each of n51, n52, n53, n54, n55 and n56 in formulas (26-1) to (26-6) is preferably 1 in terms of high dry-etching resistance.

Each of $X^{51}$, $X^{52}$, $X^{53}$, $X^{54}$, $X^{55}$ and $X^{56}$ in formulas (26-1) to (26-6) is preferably —$C(CF_3)_2$—OH, a hydroxyl group, a cyano group or a methoxy group in terms of good pattern shape. Preferably, $X^{57}$ in formula (26-7) is —$CH_2$—$C(CF_3)_2$—OH, a —$CH_2$—OH group, a —$CH_2$—CN group, a —$CH_2$—O—$CH_3$ group or a —$(CH_2)_2$—O—$CH_3$ group in terms of good pattern shape.

Preferably, $W^1$ and $W^2$ in formula (26-3) and $W^3$ in formula (26-6) are each —$CH_2$— or —$CH_2CH_2$— in terms of high dry-etching resistance.

Preferably, $R^{531}$, $R^{532}$, $R^{533}$ and $R^{534}$ in formula (26-3) and $R^{535}$ and $R^{536}$ in formula (26-6) are each independently a hydrogen atom, a methyl group, an ethyl group or an isopropyl group in terms of high solubility in organic solvents.

Each of q1 in formula (26-3) and q2 in formula (26-6) is preferably 1 in terms of high dry-etching resistance or 0 in terms of good solubility in organic solvents.

Preferably, r1 in formula (264) is 1 in terms of high dry-etching resistance or 0 in terms of good solubility in organic solvents.

Preferably, $R^{504}$ and $R^{505}$ in formula (26-5) are each independently a methyl group, an ethyl group or an isopropyl group in terms of sensitivity and resolution.

Preferably $R^{571}$ and $R^{572}$ in formula (26-7) together form a crosslinked cyclic hydrocarbon group having 4 to 16 carbon atoms with the carbon atom to which they are bonded in terms of high dry-etching resistance. Further, in terms of excellent heat resistance and stability, the ring contained in the crosslinked cyclic hydrocarbon group which is formed by $R^{571}$ and $R^{572}$ together with the carbon atom to which they are bonded has a camphor ring, an adamantane ring, a norbornane ring, a pinane ring, a bicyclo[2.2.2]octane ring, a tetracyclododecane ring, a tricyclodecane ring and a decahydronaphthalene ring.

In formulas (26-1) to (26-6), the position substituted with each of $X^{51}$, $X^{52}$, $X^{53}$, $X^{54}$, $X^{55}$ and $X^{56}$ may be any position in the cyclic structure.

The structural unit having a hydrophilic group may be used singly or in combination of two or more, as necessary.

The monomer as a raw material for forming the structural unit having a hydrophilic group specifically includes a monomer represented by any of the following formulas (27-1) to (27-103). In formulas (27-1) to (27-103), R represents a hydrogen atom or a methyl group.

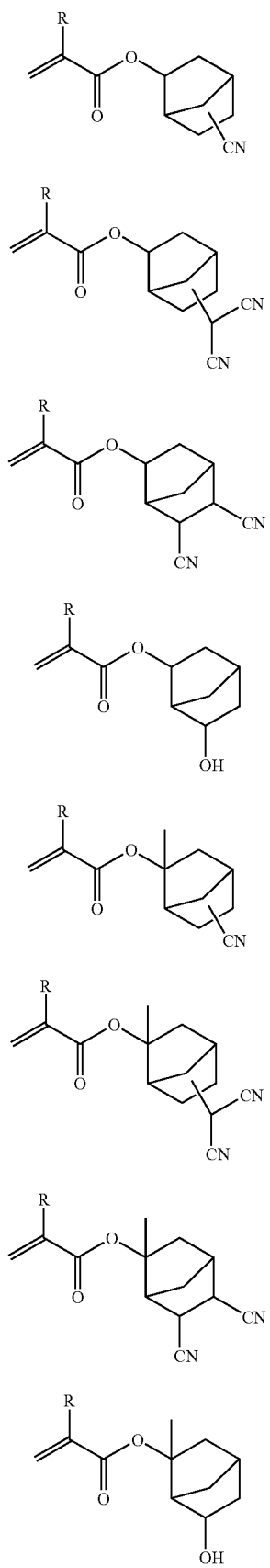
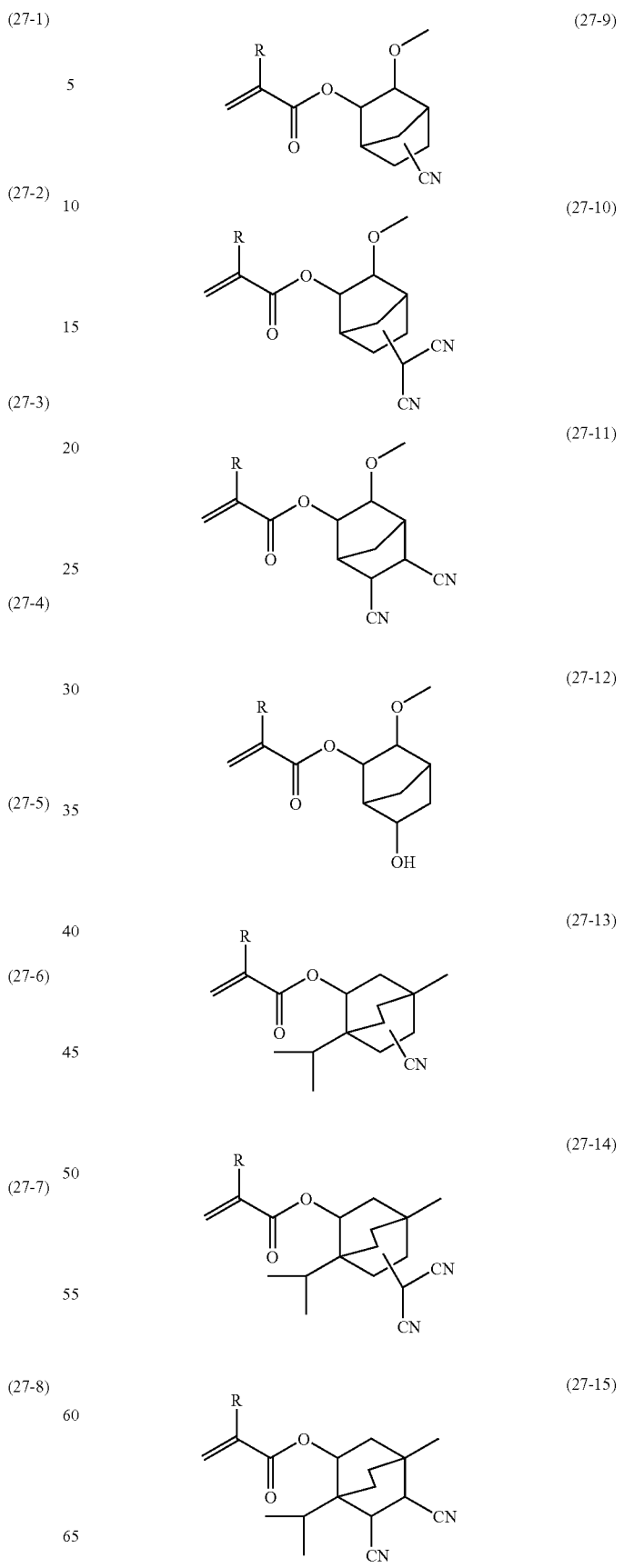

(27-16) 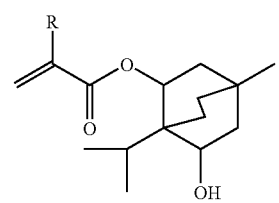
(27-17) 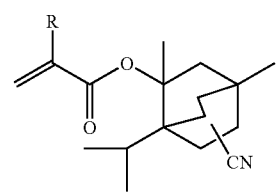
(27-18) 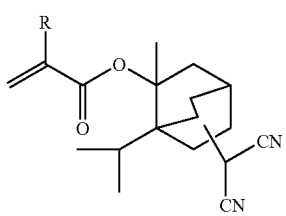
(27-19) 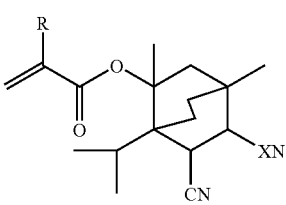
(27-20) 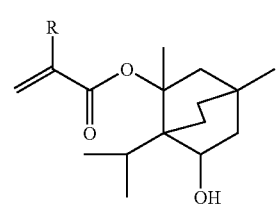
(27-21) 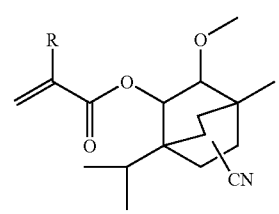
(27-22) 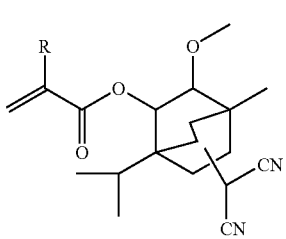
(27-23) 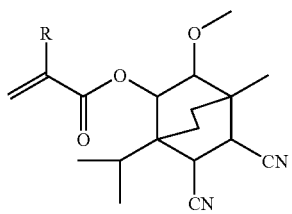
(27-24) 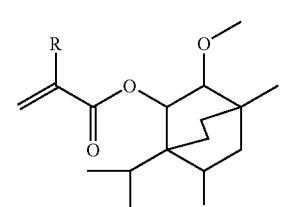
(27-25) 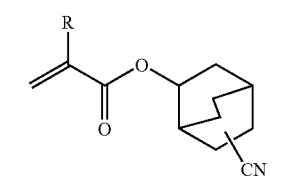
(27-26) 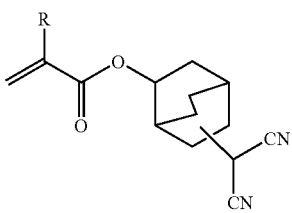
(27-27) 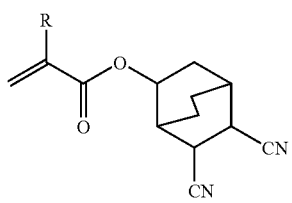
(27-28) 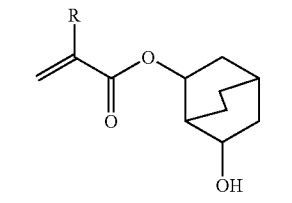
(27-29) 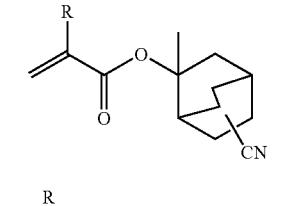
(27-30) 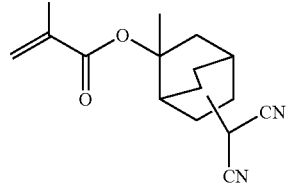

-continued
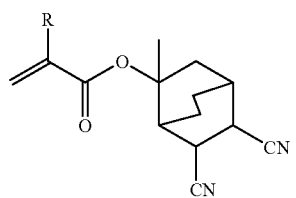
(27-31)
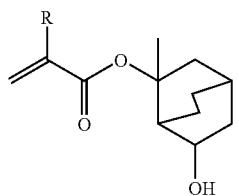
(27-32)
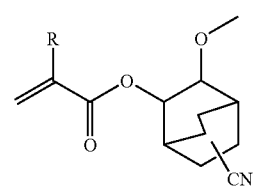
(27-33)
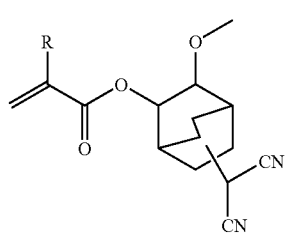
(27-34)
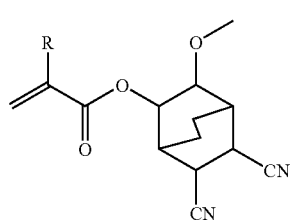
(27-35)
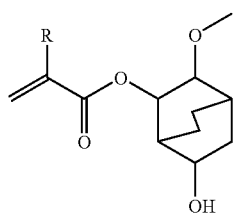
(27-36)
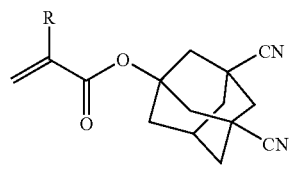
(27-37)
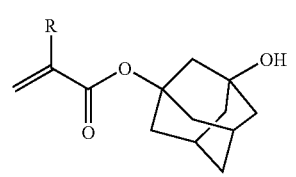
(27-38)
-continued
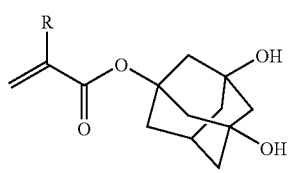
(27-39)
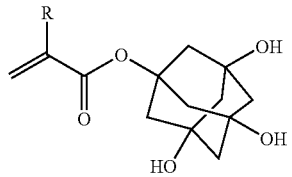
(27-40)
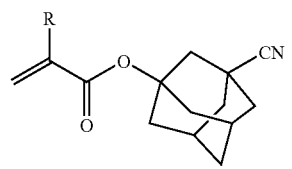
(27-41)
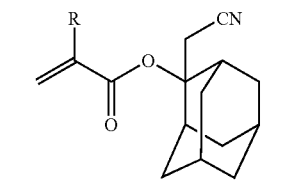
(27-42)
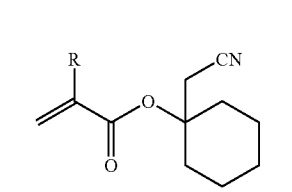
(27-43)
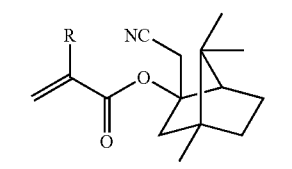
(27-44)
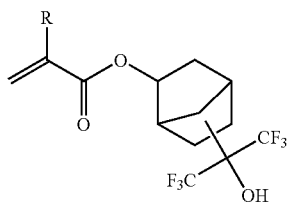
(27-45)
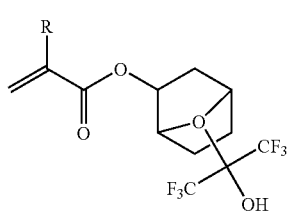
(27-46)

(27-47) 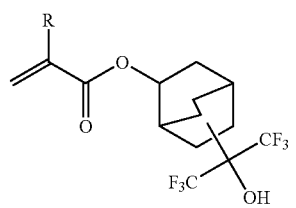
(27-48) 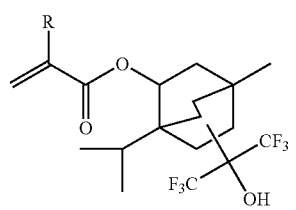
(27-49) 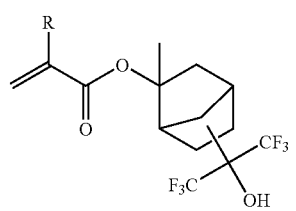
(27-50) 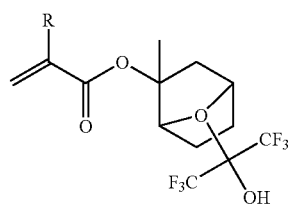
(27-51) 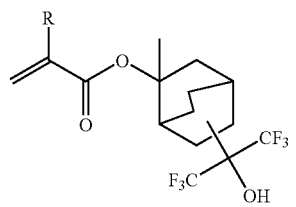
(27-52) 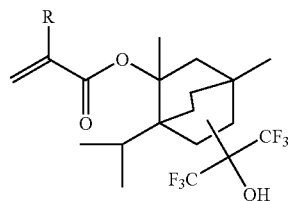
(27-53) 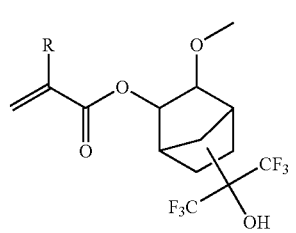
(27-54) 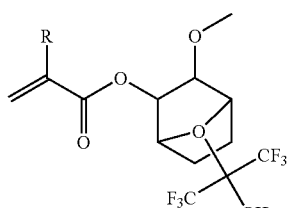
(27-55) 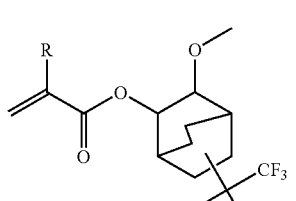
(27-56) 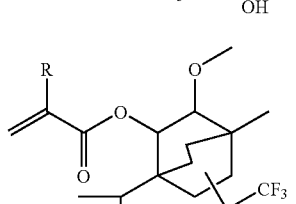
(27-57) 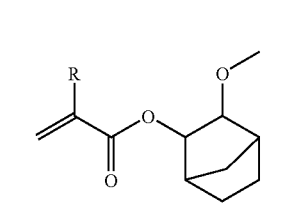
(27-58) 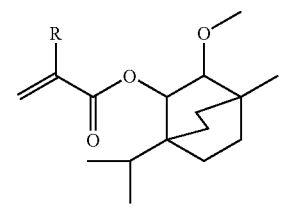
(27-59) 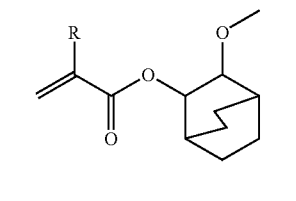
(27-60) 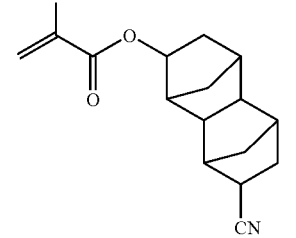

(27-61) 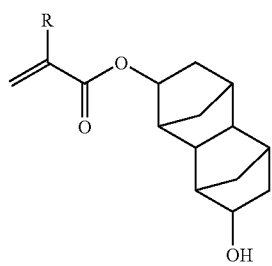
(27-62) 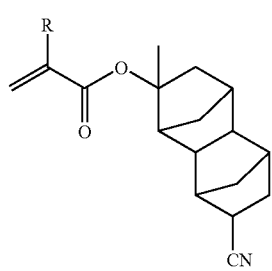
(27-63) 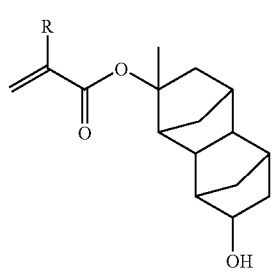
(27-64) 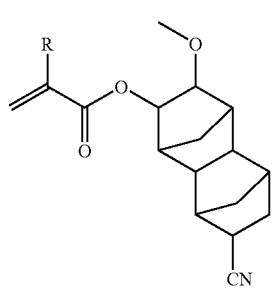
(27-65) 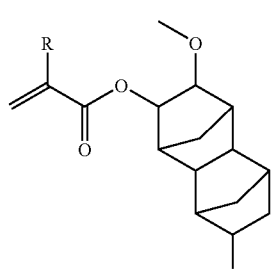
(27-66) 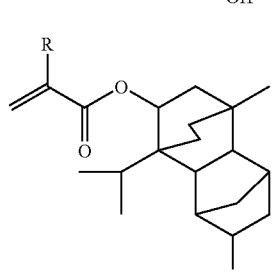
(27-67) 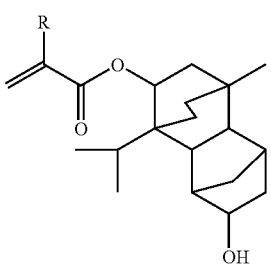
(27-68) 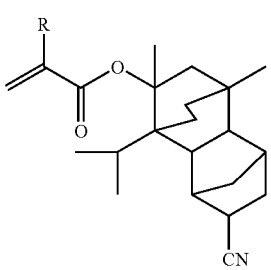
(27-69) 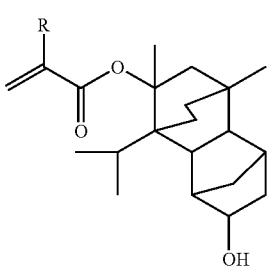
(27-70) 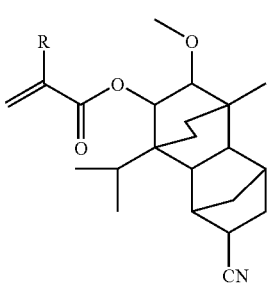
(27-71) 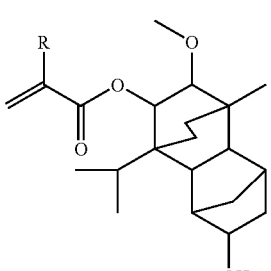
(27-72) 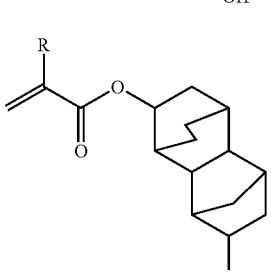

(27-73)
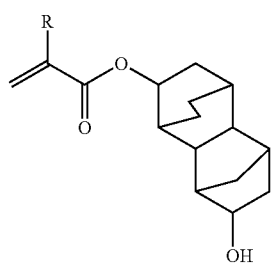
(27-74)
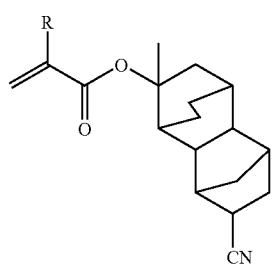
(27-75)
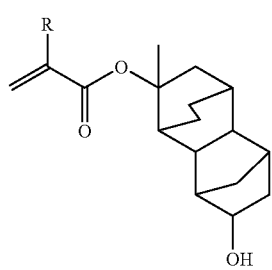
(27-76)
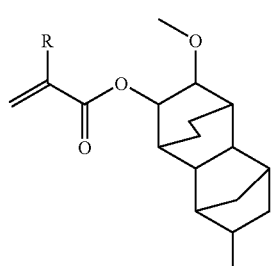
(27-77)
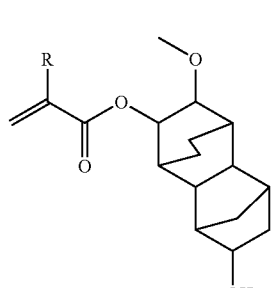
(27-78)
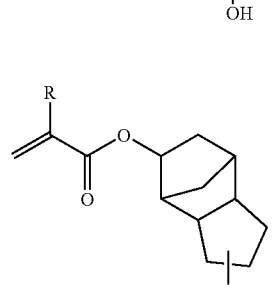
(27-79)
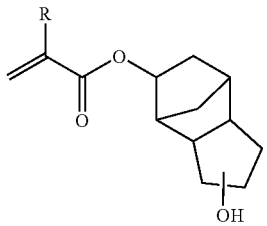
(27-80)
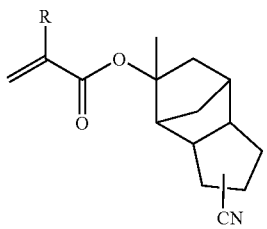
(27-81)
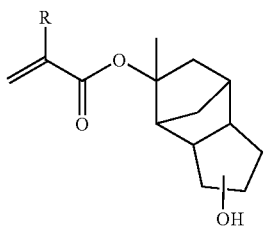
(27-82)
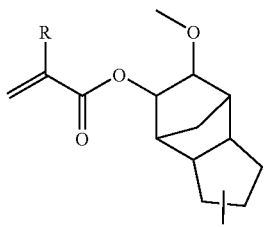
(27-83)
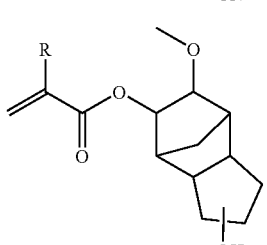
(27-84)
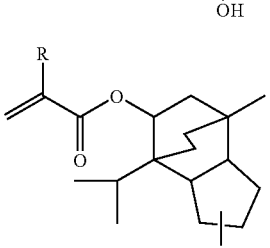
(27-85)
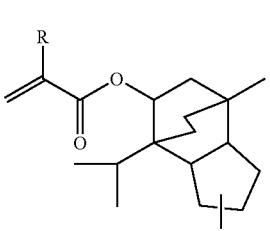

(27-86)
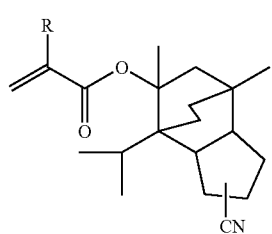
(27-87)
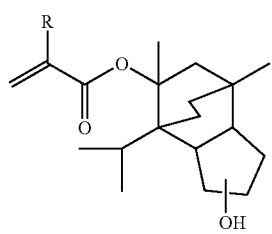
(27-88)
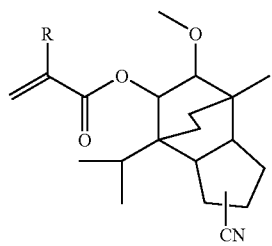
(27-89)
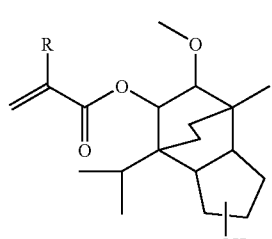
(27-90)
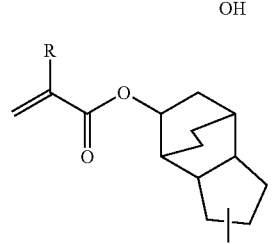
(27-91)
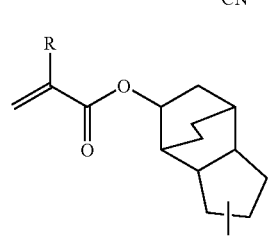
(27-92)
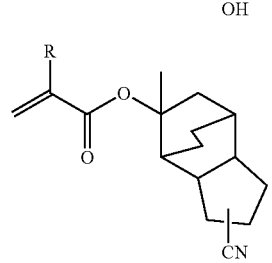
(27-93)
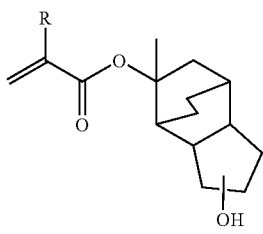
(27-94)
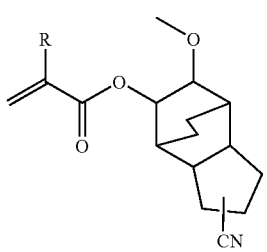
(27-95)
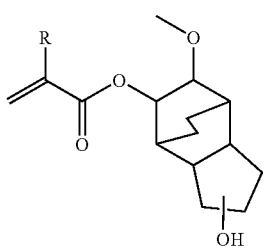
(27-96)
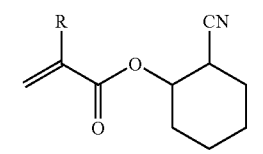
(27-97)
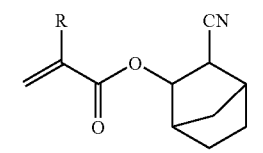
(27-98)
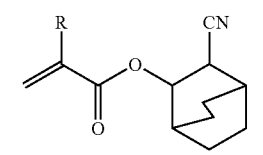
(27-99)
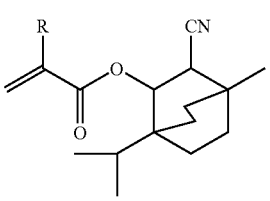
(27-100)
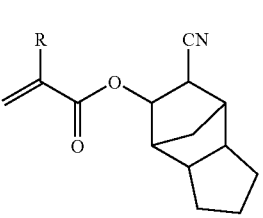

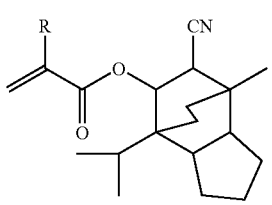

(27-101)

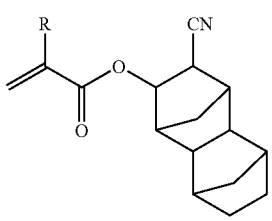

(27-102)

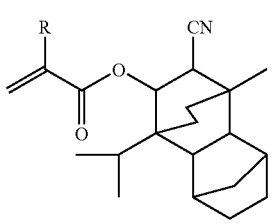

(27-103)

Among others, in terms of good solubility in a resist solvent, preferred monomers include monomers represented by formulas (27-1) to (27-4), formulas (27-9) to (27-13), formulas (27-21) to (27-24), formulas (27-33) to (27-36), formulas (27-42) to (27-46), formulas (27-53) to (27-59), formulas (27-78) and (27-79), formulas (27-82) and (27-83), formulas (27-88) and (27-89), formulas (27-94) to (27-97) and formula (27-100), and geometrical isomers thereof, and optical isomers thereof. Further, in terms of high dry-etching resistance, preferred monomers include monomers represented by formulas (27-37) to (2742), formulas (27-60) to (27-77), formulas (27-84) and (27-85), formulas (27-90) and (27-91), formula (27-99) and formulas (27-101) to (27-103), and geometrical isomers thereof and optical isomers thereof. Further, in terms of sensitivity and resolution, preferred monomers include monomers represented by formulas (27-5) to (27-8), formulas (27-17) to (27-20), formulas (27-29) to (27-32), formulas (27-49) to (27-52), formulas (27-62) and (27-63), formulas (27-68) and (27-69), formulas (27-74) and (27-75), formulas (27-80) and (27-81), formulas (27-86) and (27-87) and formulas (27-92) and (27-93), and geometrical isomers thereof, and optical isomers thereof.

Moreover, when the acid-decomposable unit has a structure represented by formula (3), the structure represented by formula (3) is preferably represented by the following formula (5). Resist defects tend to be improved, particularly when the structure represented by formula (3) is represented by formula (5).

(5)

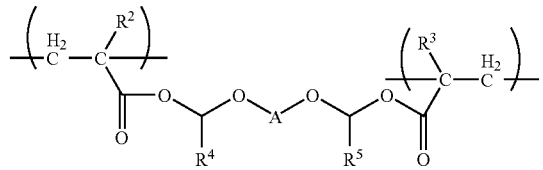

In formula (5), A represents an alkylene group having 1 to 18 carbon atoms, a cycloalkylene group having 1 to 18 carbon atoms, an oxyalkylene group having 1 to 18 carbon atoms or any combination thereof, and $R^2$ to $R^5$ each independently represent a hydrogen atom or a methyl group. When $R^4$ and/or $R^5$ are a methyl group, the structure tends to be excellent in decomposability, and when $R^4$ and/or $R^5$ are a hydrogen atom, it tends to be excellent in heat stability and storage stability of polymers.

For example, in the case of a structural unit containing an acid-decomposable acetal group represented by the following formula (28-1), the acetal linkage is decomposed by an acid, forming a carboxyl group and vinyl ether.

(28-1)

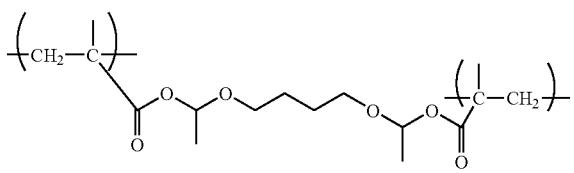

Decomposition examples 1 to 3 will be shown below as the examples of decomposition products.

Decomposition Example 1

(28-2)

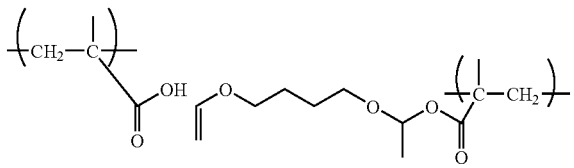

Decomposition Example 2

(28-3)

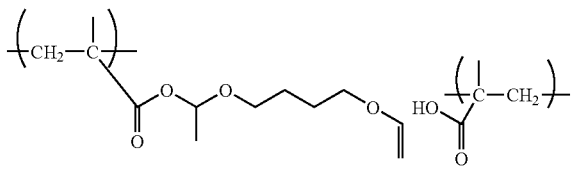

Decomposition Example 3

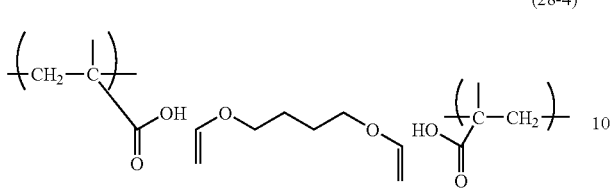
(28-4)

The resist polymer of the present invention may contain, as a structural unit, a unit having an acid-eliminable group other than the acid-decomposable unit and the unit having a hydrophilic group.

The structural unit having an acid-eliminable group preferably includes at least one selected from the group consisting of the following formulas (29-1) to (29-8) in terms of its high dry-etching resistance required for resists.

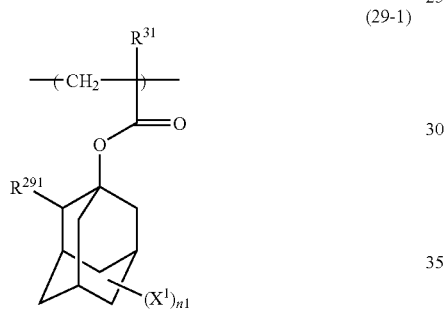
(29-1)

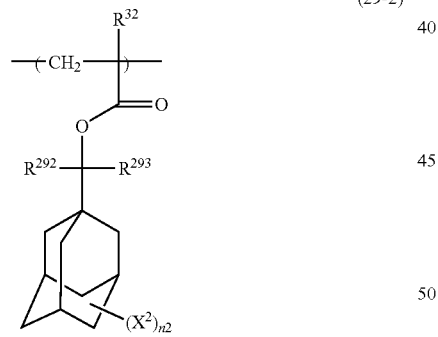
(29-2)

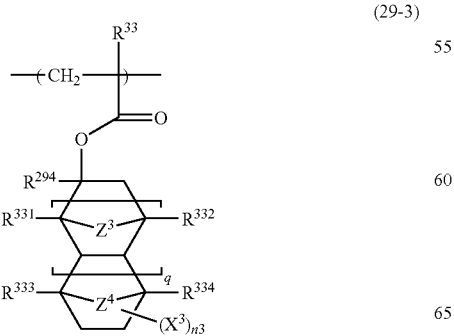
(29-3)

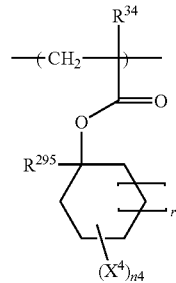
(29-4)

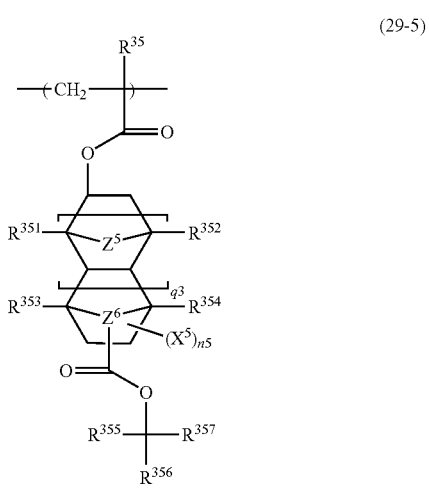
(29-5)

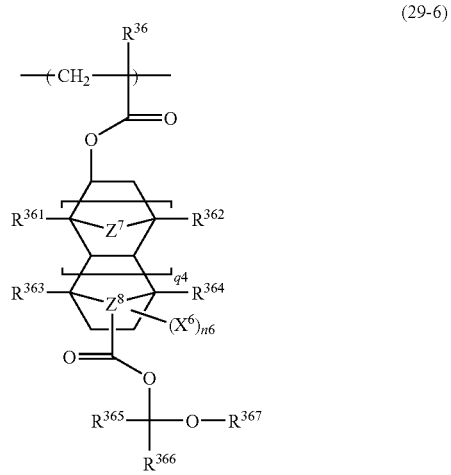
(29-6)

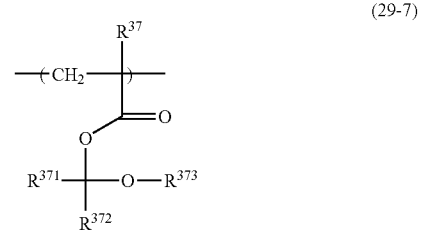
(29-7)

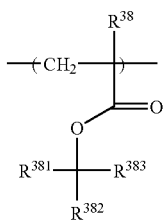

(27-8)

In formulas, $R^{31}$, $R^{32}$, $R^{33}$, $R^{34}$, $R^{35}$, $R^{36}$, $R^{37}$ and $R^{38}$ each represent a hydrogen atom or a methyl group; $R^{29}$, $R^{292}$, $R^{293}$, $R^{294}$ and $R^{295}$ each represent an alkyl group having 1 to 3 carbon atoms; $X^1$, $X^2$, $X^3$, $X^4$, $X^5$ and $X^6$ each represent a linear or branched alkyl group having 1 to 6 carbon atoms; n1, n2, n3, n4, n5 and n6 each represent an integer of 0 to 4, wherein when n1, n2, n3, n4, n5 or n6 is 2 or more, a plurality of different groups may be contained as $X^1$, $X^2$, $X^3$, $X^4$, $X^5$ or $X^6$, respectively; $R^{331}$, $R^{332}$, $R^{333}$, $R^{334}$, $R^{351}$, $R^{352}$, $R^{353}$, $R^{354}$, $R^{361}$, $R^{362}$, $R^{363}$ and $R^{364}$ each independently represent a hydrogen atom or a linear or branched alkyl group having 1 to 6 carbon atoms; $Z^3$, $Z^4$, $Z^5$, $Z^6$, $Z^7$ and $Z^8$ each independently represent —O—, —S—, —NH— or a methylene chain having a chain length of 1 to 6 {—$(CH_2)_{u1}$— (wherein u1 represents an integer of 1 to 6)}; q, q3 and q4 each represent 0 or 1; and r represents an integer of 0 to 2.

In formula (29-5), $R^{355}$, $R^{356}$ and $R^{357}$ each independently represent a monovalent alicyclic hydrocarbon group having 4 to 20 carbon atoms or a derivative thereof or a linear or branched alkyl group having 1 to 4 carbon atoms, and at least one of $R^{355}$, $R^{356}$ and $R^{357}$ is the alicyclic hydrocarbon group or a derivative thereof; or any two of $R^{355}$, $R^{356}$ and $R^{357}$ are combined with each other together with the carbon atom to which they are bonded to form an alicyclic hydrocarbon group having 4 to 20 carbon atoms or a derivative thereof, and the remaining one of $R^{355}$, $R^{356}$ and $R^{357}$ which has not been involved in the bonding represents a linear or branched alkyl group having 1 to 4 carbon atoms or a monovalent alicyclic hydrocarbon group having 4 to 20 carbon atoms or a derivative thereof.

In formula (29-6), $R^{367}$ represents a monovalent alicyclic hydrocarbon group having 4 to 20 carbon atoms or a derivative thereof or a linear or branched alkyl group having 1 to 4 carbon atoms; and $R^{365}$ and $R^{366}$ each represent a hydrogen atom, or $R^{365}$ and $R^{367}$ or $R^{366}$ and $R^{367}$ are each combined with each other together with the carbon atom to which they are bonded to form an alicyclic hydrocarbon group having 4 to 20 carbon atoms or a derivative thereof, and the remaining one of $R^{365}$ and $R^{366}$ which has not been involved in the bonding represents a hydrogen atom.

In formula (29-7), $R^{373}$ represents a monovalent alicyclic hydrocarbon group having 4 to 20 carbon atoms or a derivative thereof or a linear or branched alkyl group having 1 to 4 carbon atoms; and $R^{371}$ and $R^{372}$ each represent a hydrogen atom, or $R^{371}$ and $R^{373}$ or $R^{372}$ and $R^{373}$ are each combined with each other together with the carbon atom to which they are bonded to form an alicyclic hydrocarbon group having 4 to 20 carbon atoms or a derivative thereof, and the remaining one of $R^{371}$ and $R^{372}$ which has not been involved in the bonding represents a hydrogen atom.

In formula (29-8), $R^{381}$, $R^{382}$ and $R^{383}$ each independently represent a linear or branched alkyl group having 1 to 4 carbon atoms.

Each of $R^{291}$ in formula (29-1), $R^{292}$ and $R^{293}$ in formula (29-2), $R^{294}$ in formula (29-3) and $R^{295}$ in formula (29-4) is preferably a methyl group, an ethyl group or an isopropyl group in terms of sensitivity and resolution.

Each of n1, n2, n3, n4, n5 and n6 in formulas (29-1) to (29-6) is preferably 0 in terms of high dry-etching resistance.

Preferably, $Z^3$ and $Z^4$ in formula (29-3), $Z^5$ and $Z^6$ in formula (29-5) and $Z^7$ and $Z^8$ in formula (29-6) are each independently —$CH_2$— or —$CH_2CH_2$— in terms of high dry-etching resistance.

Preferably, $R^{331}$, $R^{332}$, $R^{333}$ and $R^{33}$ in formula (29-3), $R^{351}$, $R^{352}$, $R^{353}$ and $R^{35}$ in formula (29-5) and $R^{36}$, $R^{362}$, $R^{363}$ and $R^{36}$ in formula (29-6) are each independently a hydrogen atom, a methyl group, an ethyl group or an isopropyl group in terms of high solubility in organic solvents.

Each of q in formula (29-3), q3 in formula (29-5) and q4 in formula (29-6) is preferably 1 in terms of high dry-etching resistance or 0 in terms of good solubility in organic solvents.

Preferably, r in formula (294) is 1 in terms of high dry-etching resistance or 0 in terms of good solubility in organic solvents.

Preferably, —$C(R^{355})(R^{356})(R^{357})$— in formula (29-5) is a structure represented by the following formulas (K-1) to (K-6) in terms of excellent line edge roughness, and a structure represented by the following formulas (K-7) to (K-17) in terms of high dry-etching resistance.

(K-1)

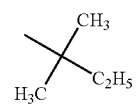

(K-2)

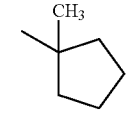

(K-3)

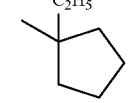

(K-4)

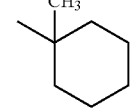

(K-5)

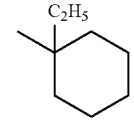

(K-6)

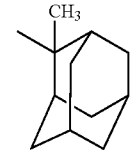

(K-7)

-continued
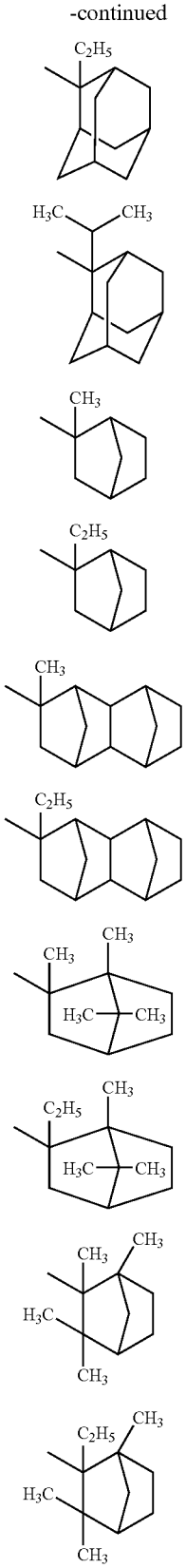
(K-8)
(K-9)
(K-10)
(K-11)
(K-12)
(K-13)
(K-14)
(K-15)
(K-16)
(K-17)
Preferably, —C(R$^{365}$)(R$^{366}$)—O—R$^{367}$ in formula (29-6) is a structure represented by the following formulas (J-1) to (J-24) in terms of excellent line edge roughness, and a structure represented by the following formulas (J-25) to (J-52) in terms of high dry-etching resistance.
 (J-1)
 (J-2)
 (J-3)
 (J-4)
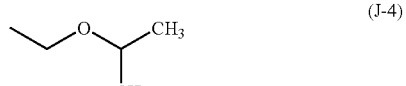 (J-5)
 (J-6)
 (J-7)
 (J-8)
 (J-9)
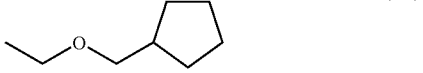 (J-10)
(J-11)
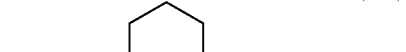 (J-12)
 (J-13)
 (J-14)
 (J-15)

-continued
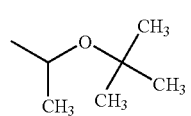 (J-16)
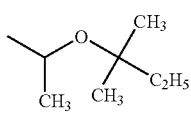 (J-17)
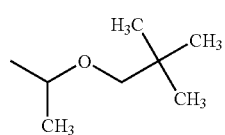 (J-18)
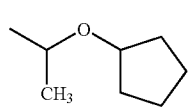 (J-19)
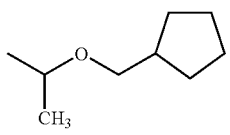 (J-20)
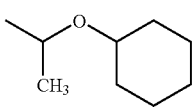 (J-21)
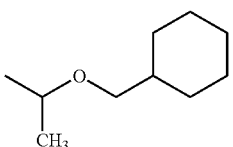 (J-22)
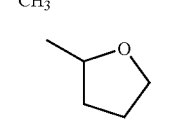 (J-23)
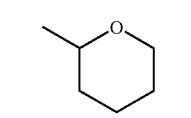 (J-24)
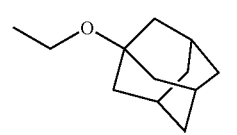 (J-25)
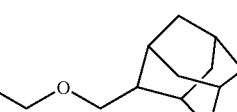 (J-26)
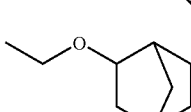 (J-27)
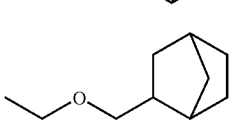 (J-28)
-continued
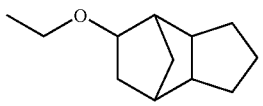 (J-29)
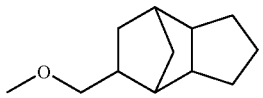 (J-30)
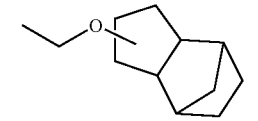 (J-31)
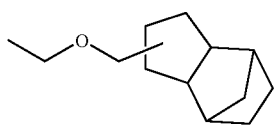 (J-32)
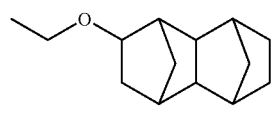 (J-33)
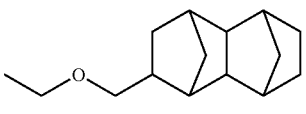 (J-34)
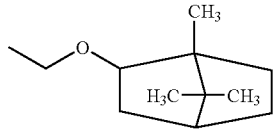 (J-35)
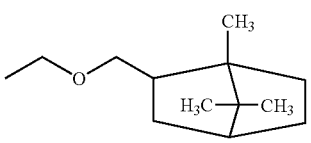 (J-36)
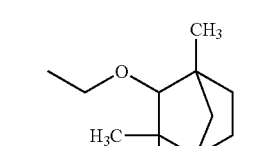 (J-37)
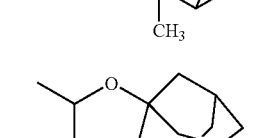 (J-38)
 (J-39)
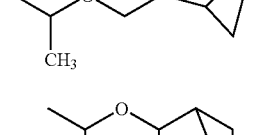 (J-40)

(J-41) 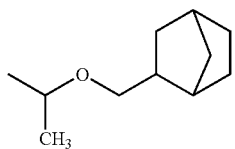

(J-42) 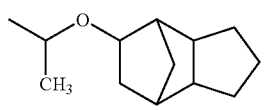

(J-43) 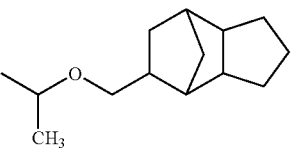

(J-44) 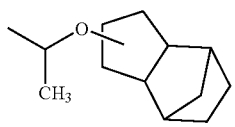

(J-45) 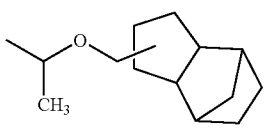

(J-46) 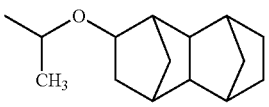

(J-47) 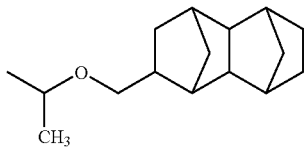

(J-48) 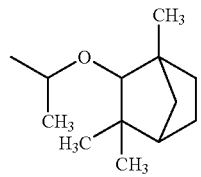

(J-49) 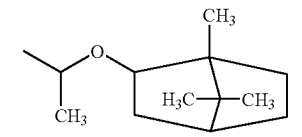

(J-50) 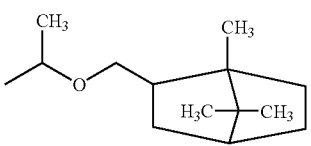

(J-51) 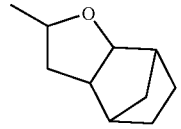

(J-52) 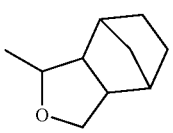

Preferably, —C(R$^{371}$)(R$^{372}$)—O—R$^{373}$ in formula (29-7) is a structure represented by the following formulas (J-1) to (J-24) in terms of excellent line edge roughness, and a structure represented by the following formulas (J-25) to (J-52) in terms of high dry-etching resistance.

The structural unit having an acid-eliminable group may be used singly or in combination of two or more, as necessary.

The monomer as a raw material for forming the structural unit having an acid-eliminable group specifically includes a monomer represented by any of the following formulas (30-1) to (30-196). In formulas (30-1) to (30-196), R and R' each independently represent a hydrogen atom or a methyl group.

(30-1) 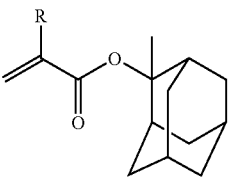

(30-2) 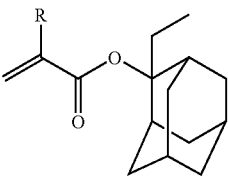

(30-3) 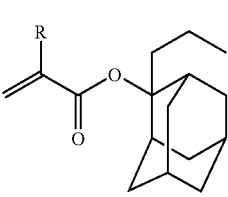

(30-4) 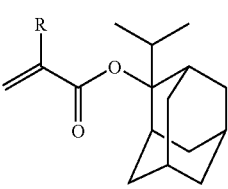

(30-5) 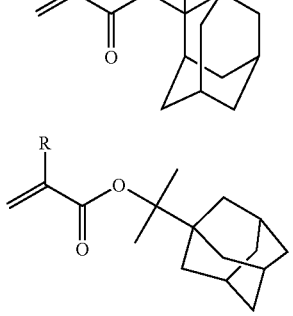

(30-6) 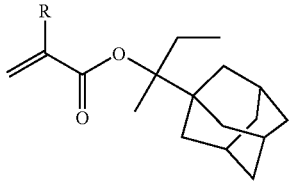

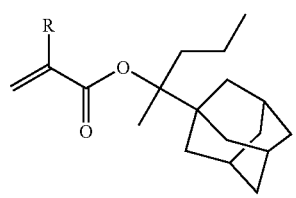 (30-7)
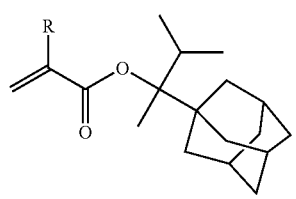 (30-8)
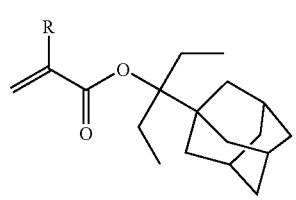 (30-9)
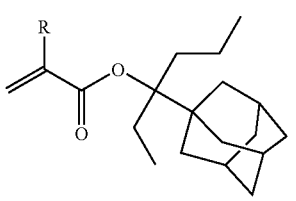 (30-10)
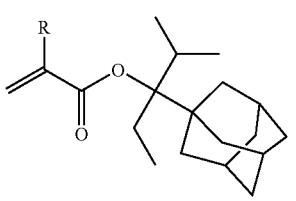 (30-11)
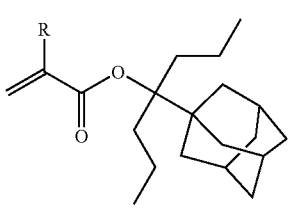 (30-12)
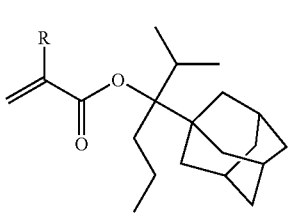 (30-13)
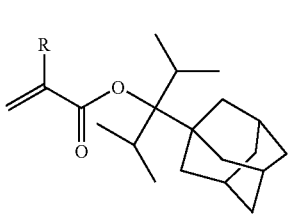 (30-14)
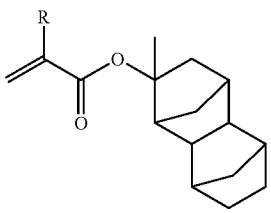 (30-15)
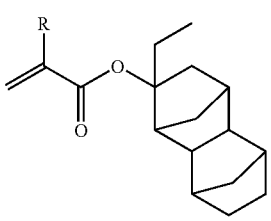 (30-16)
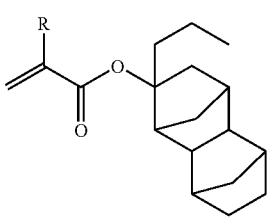 (30-17)
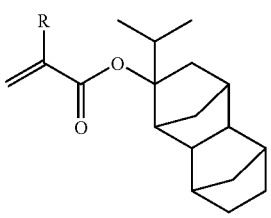 (30-18)
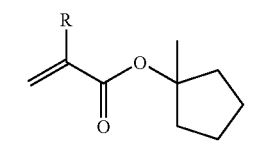 (30-19)
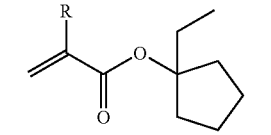 (30-20)
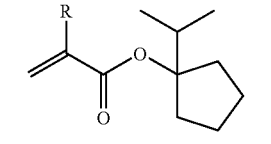 (30-21)
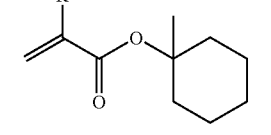 (30-22)
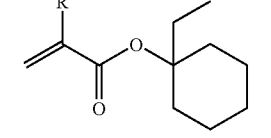 (30-23)

(30-24) 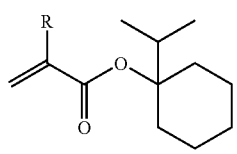
(30-25) 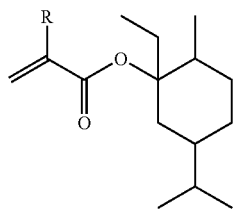
(30-26) 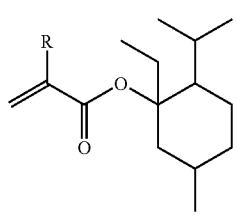
(30-27) 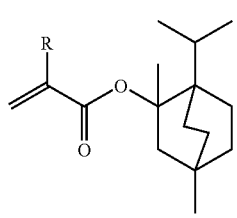
(30-28) 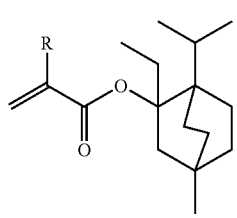
(30-29) 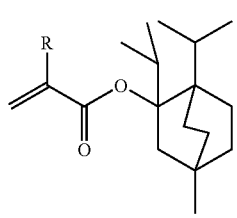
(30-30) 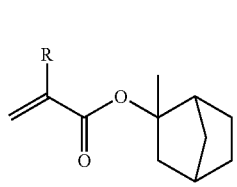
(30-31) 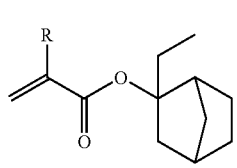
(30-32) 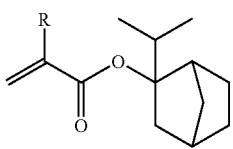
(30-33) 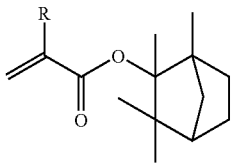
(30-34) 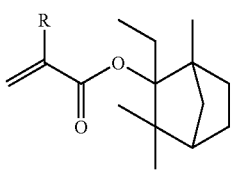
(30-35) 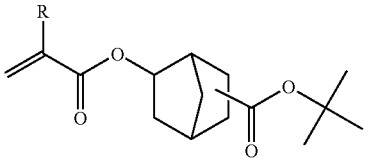
(30-36) 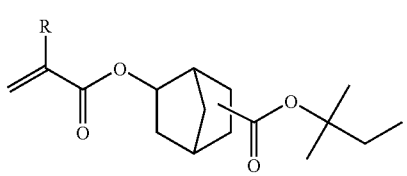
(30-37) 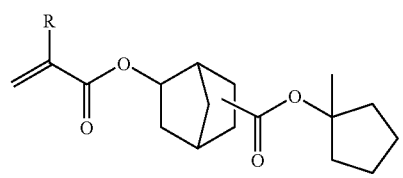
(30-38) 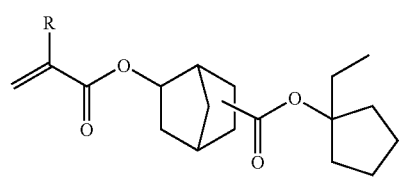
(30-39) 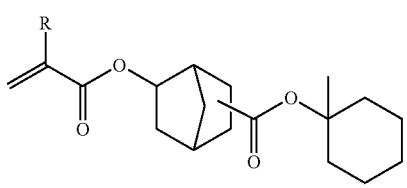
(30-40) 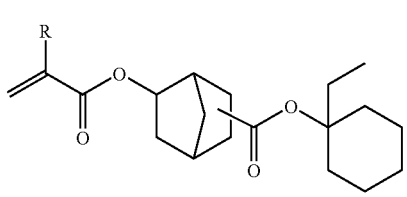

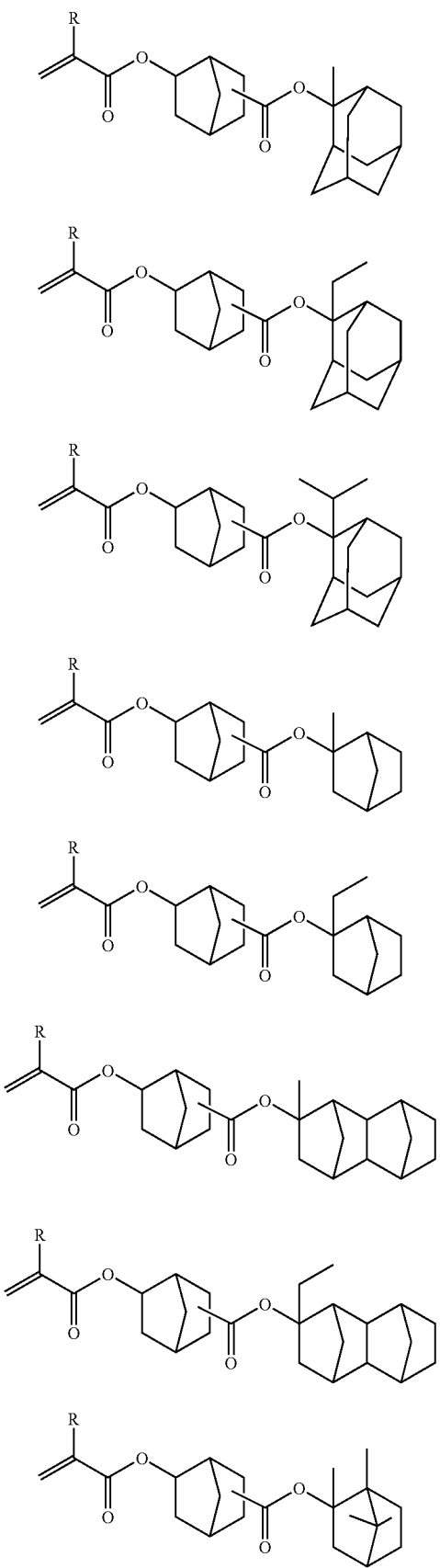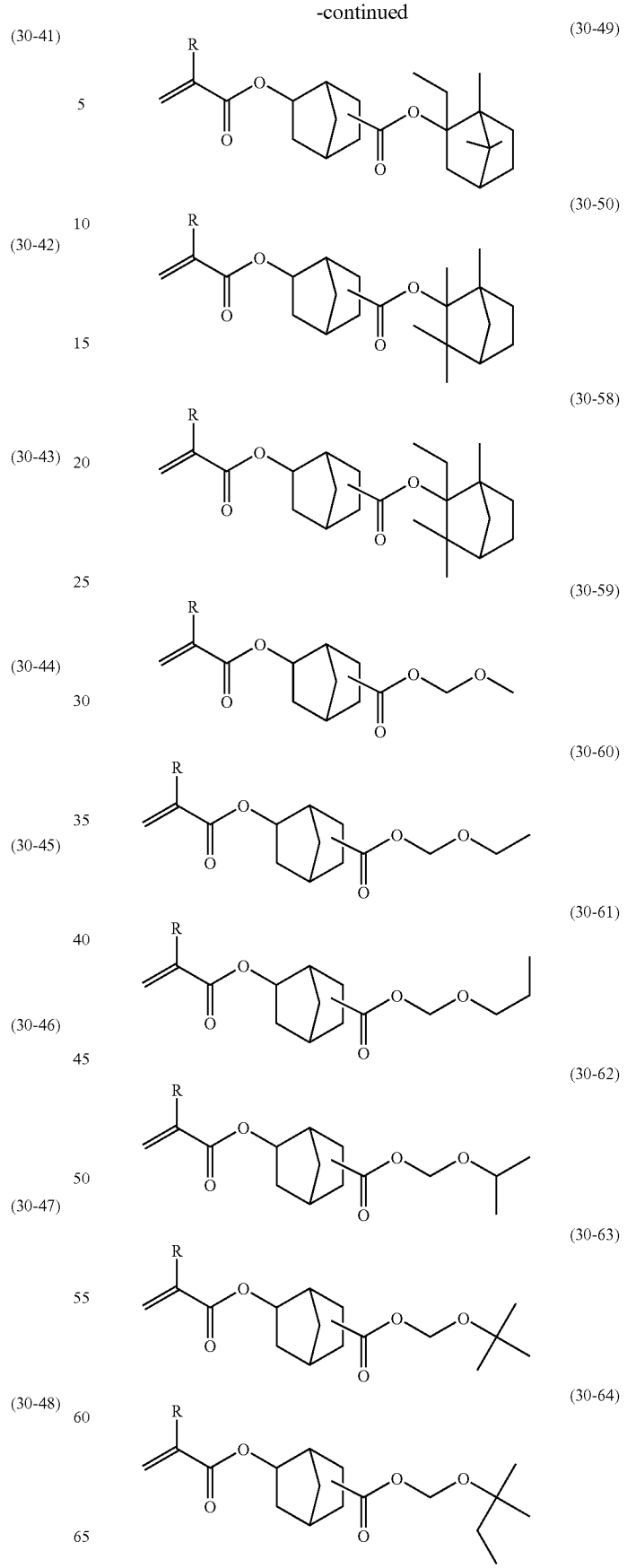

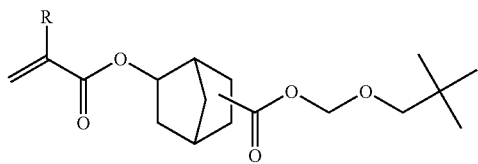
(30-65)
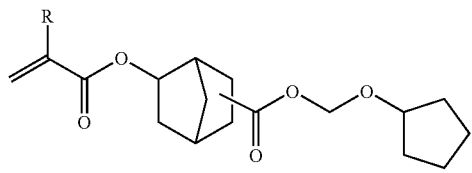
(30-59)
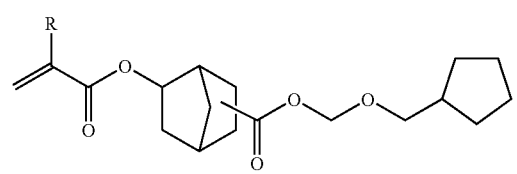
(30-60)
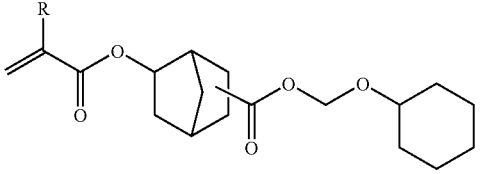
(30-61)
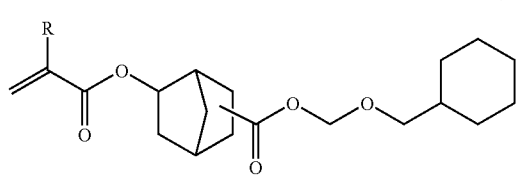
(30-62)
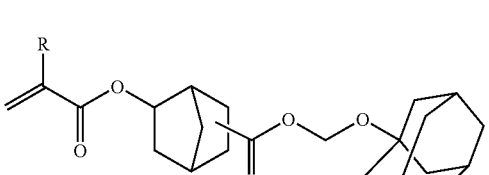
(30-63)
(30-64)
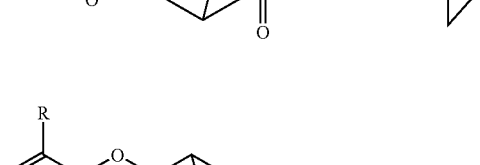
(30-65)
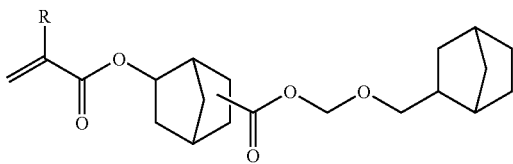
(30-66)
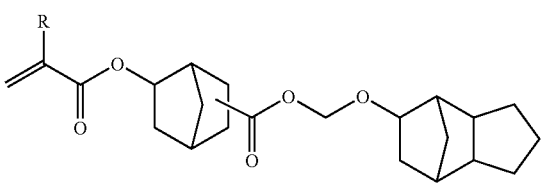
(30-67)
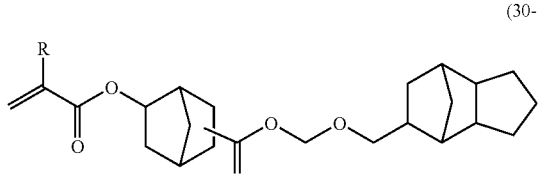
(30-68)
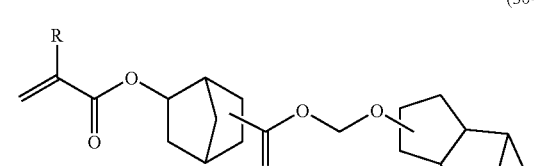
(30-69)
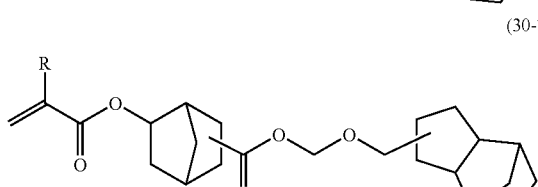
(30-70)
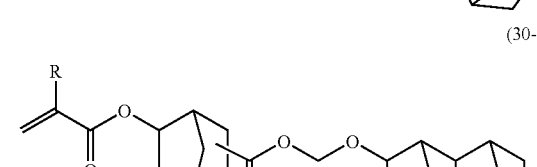
(30-71)
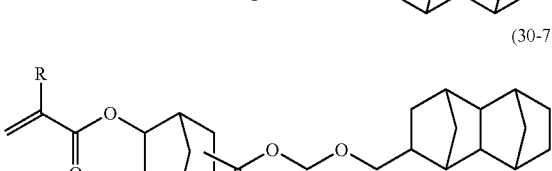
(30-72)
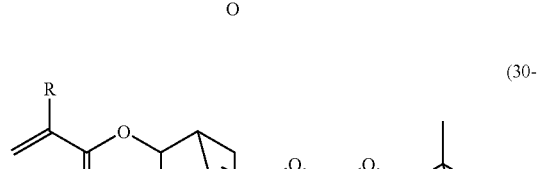
(30-73)

(30-74) 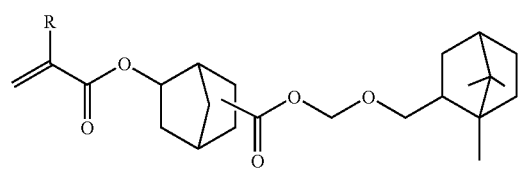
(30-75) 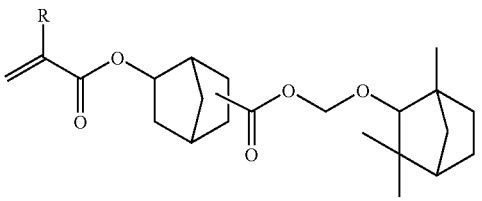
(30-76) 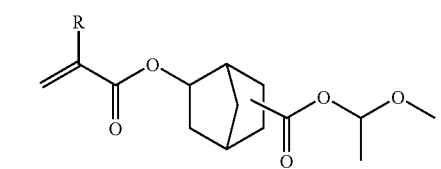
(30-77) 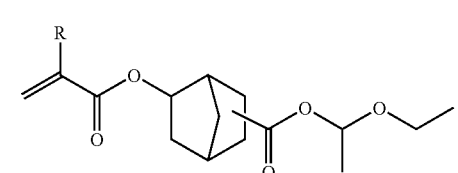
(30-78) 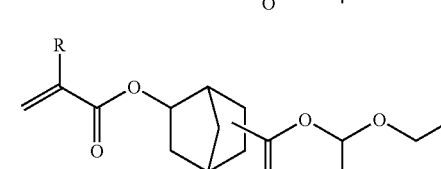
(30-79) 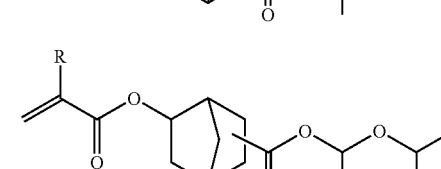
(30-80) 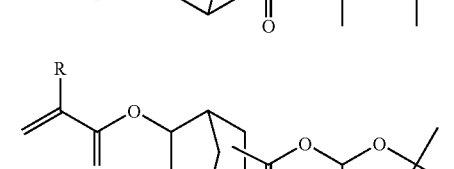
(30-81) 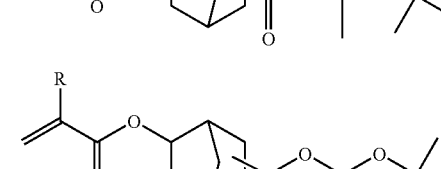
(30-82) 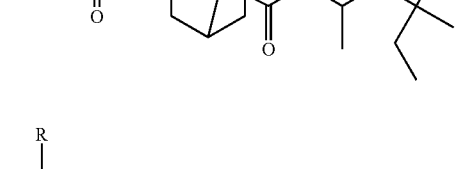
(30-83) 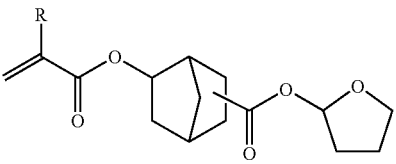
(30-84) 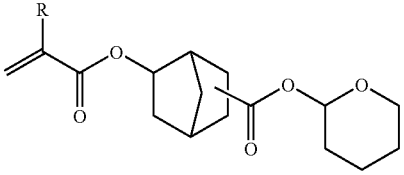
(30-85) 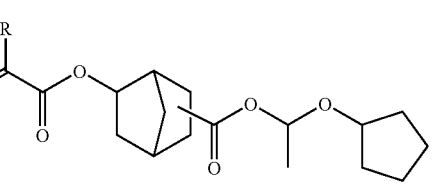
(30-86) 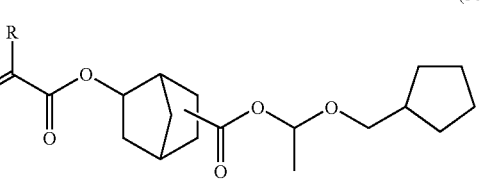
(30-87) 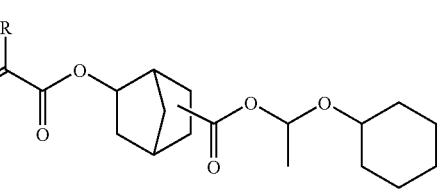
(30-88) 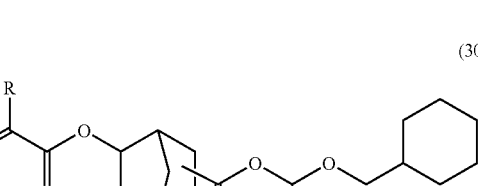
(30-89) 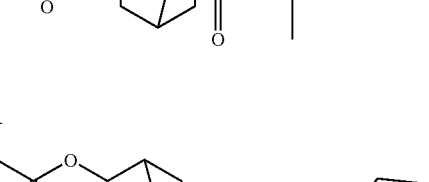
(30-90) 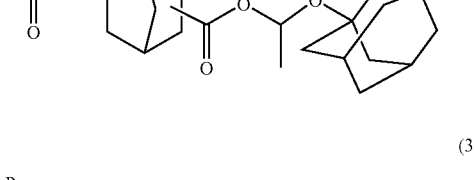

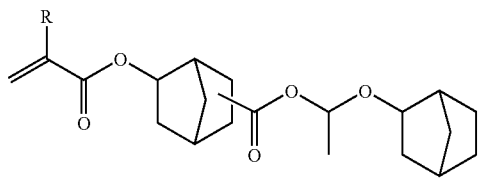
(30-91)
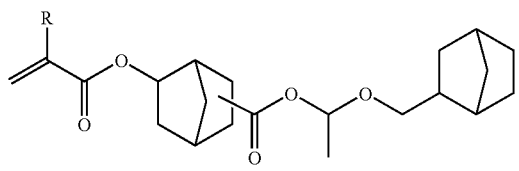
(30-92)
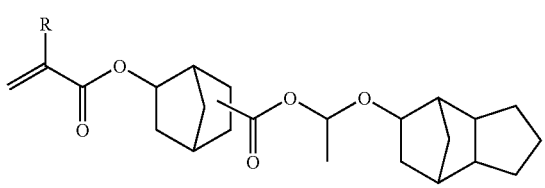
(30-93)
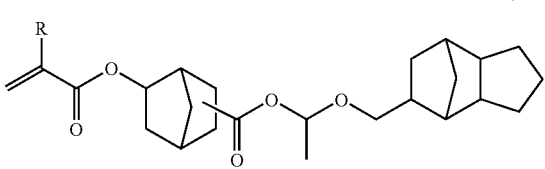
(30-94)
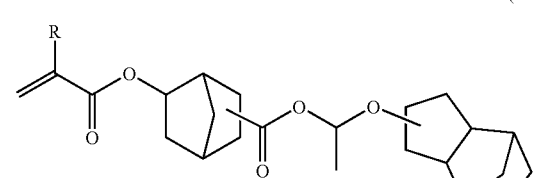
(30-95)
(30-96)
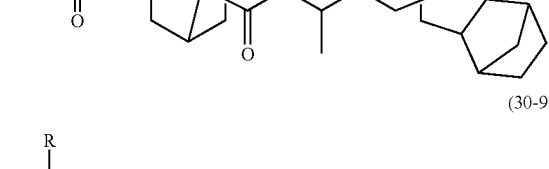
(30-97)
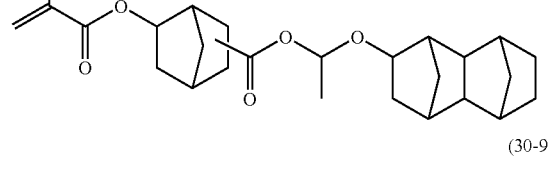
(30-98)
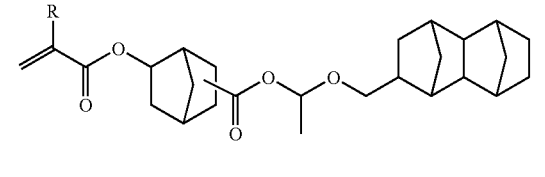
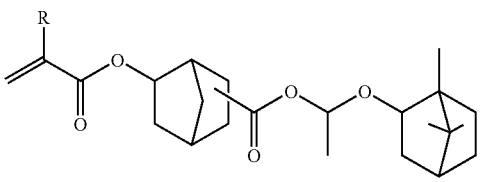
(30-99)
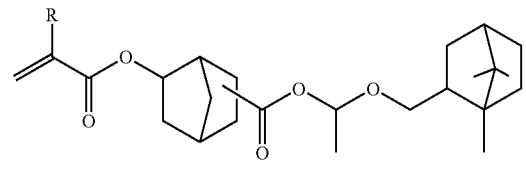
(30-100)
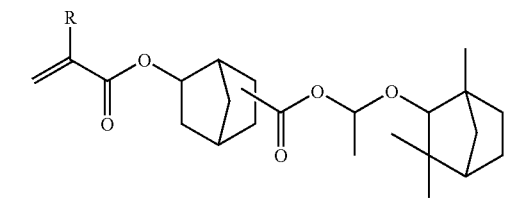
(30-101)
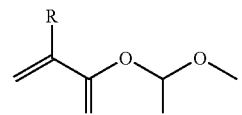
(30-102)
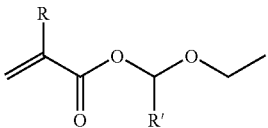
(30-103)
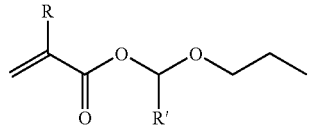
(30-104)
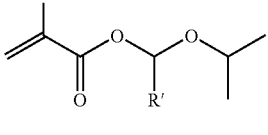
(30-105)
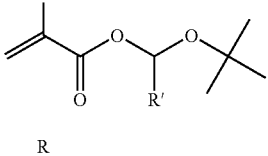
(30-106)
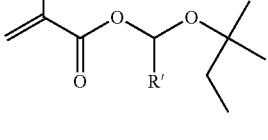
(30-107)
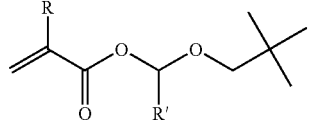
(30-108)

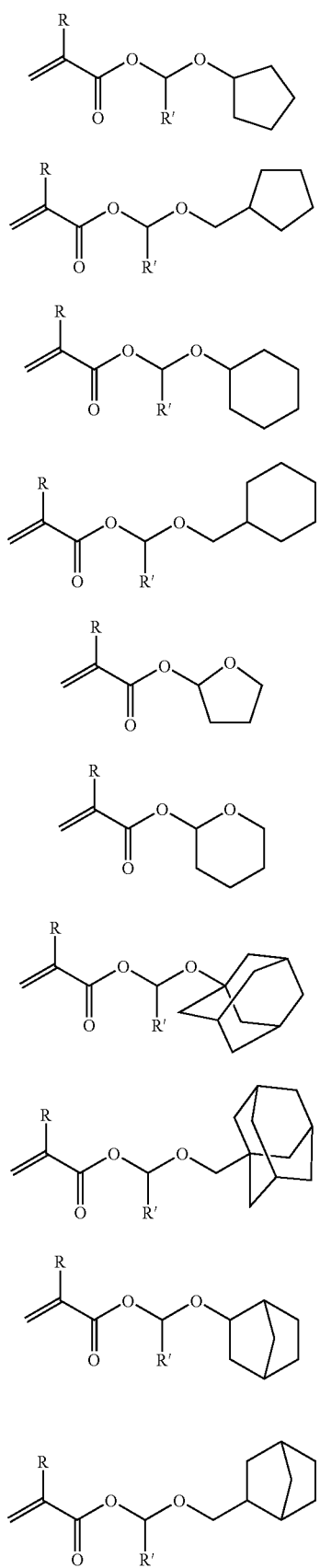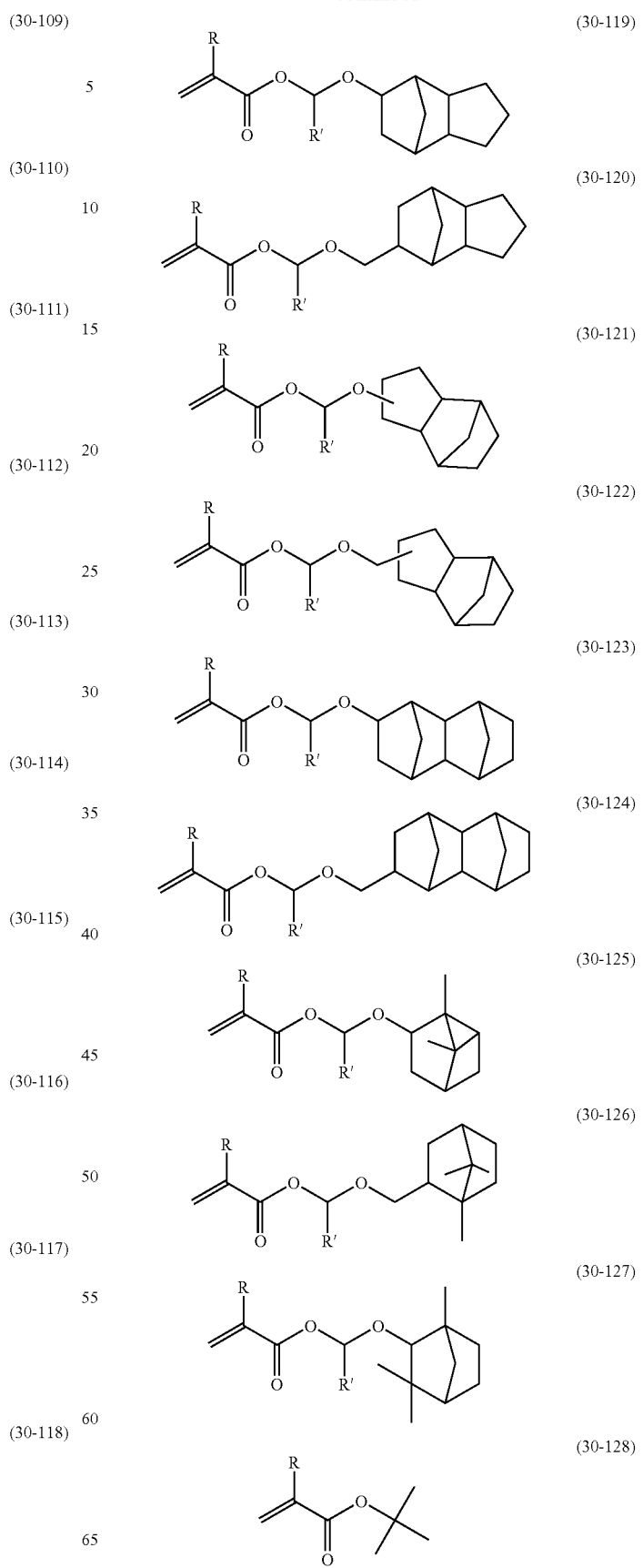

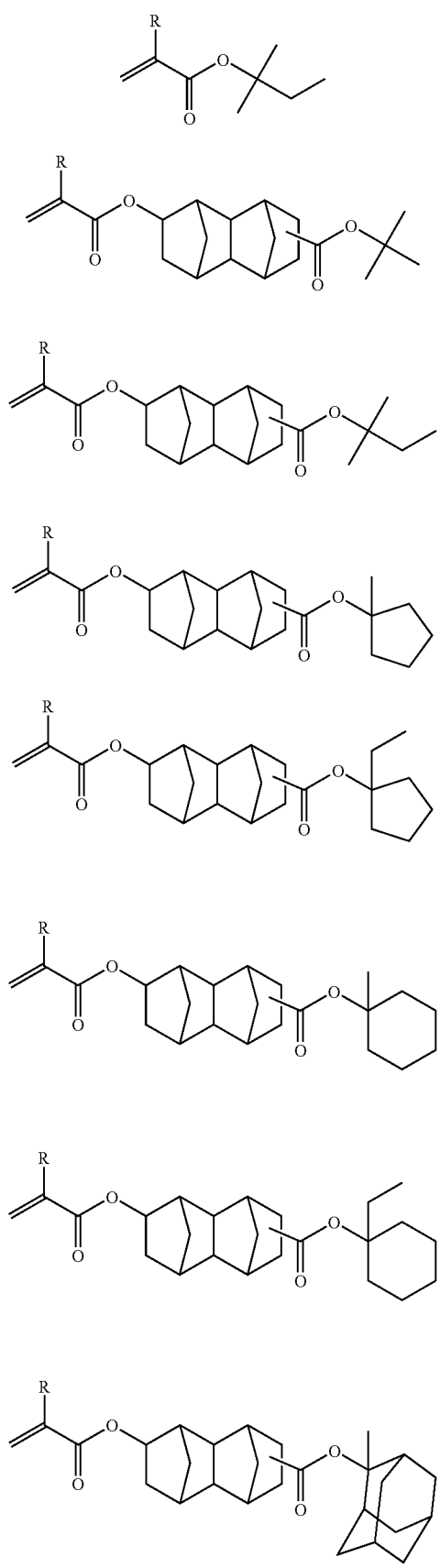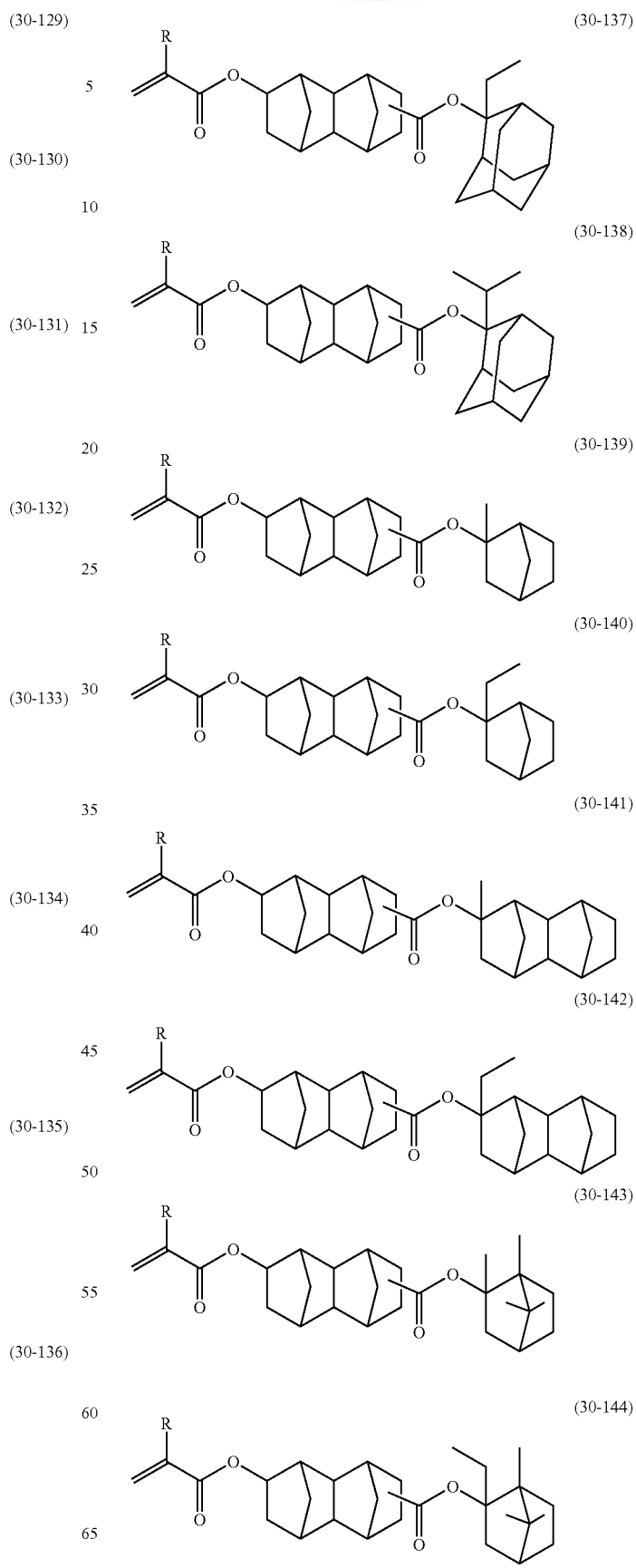

75
-continued
(30-145)
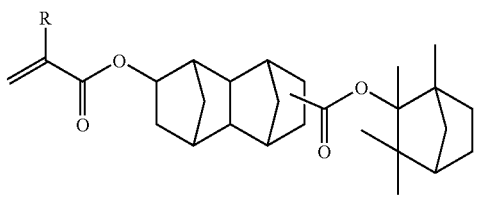
(30-146)
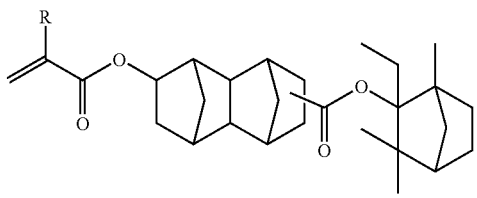
(30-147)
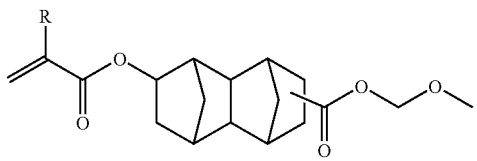
(30-148)
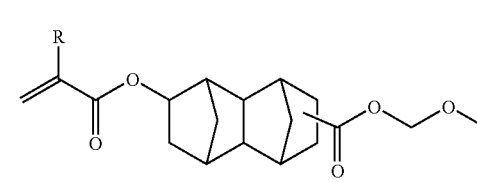
(30-149)
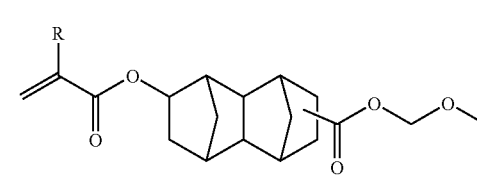
(30-150)
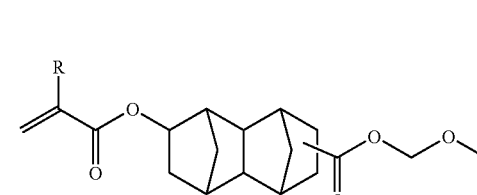
(30-151)
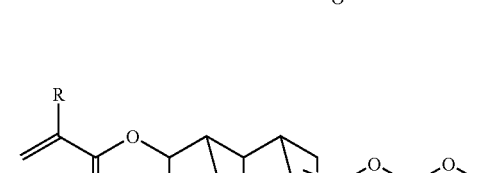
(30-152)
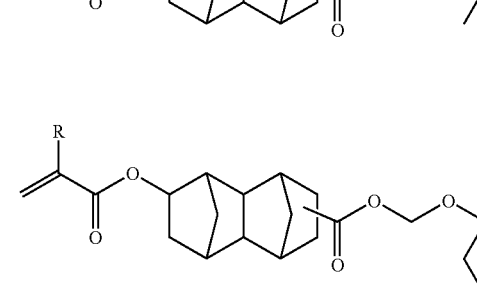
76
-continued
(30-153)
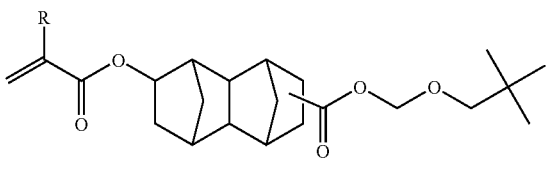
(30-154)
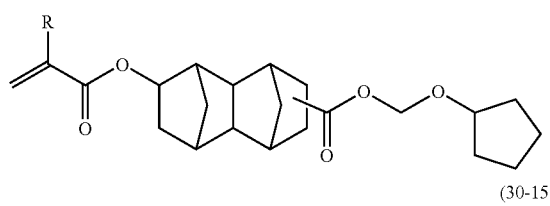
(30-155)
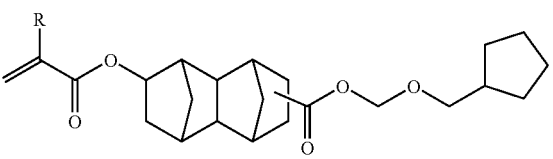
(30-156)
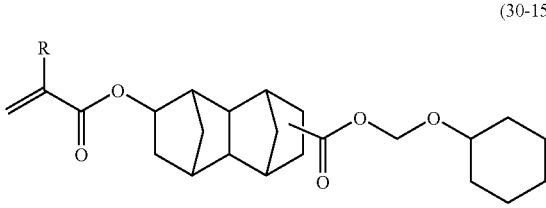
(30-157)
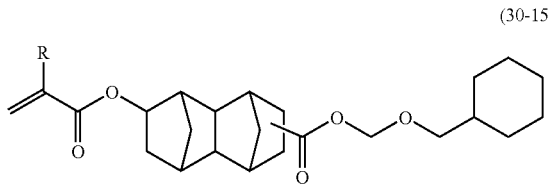
(30-158)
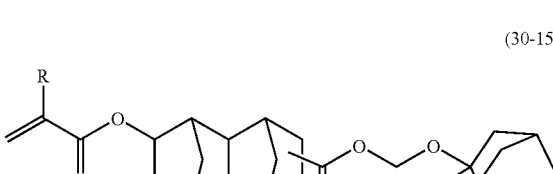
(30-159)
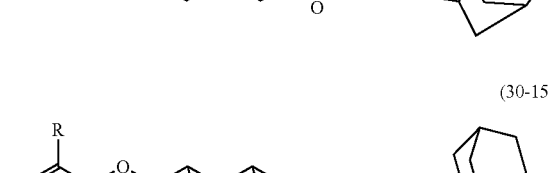
(30-160)
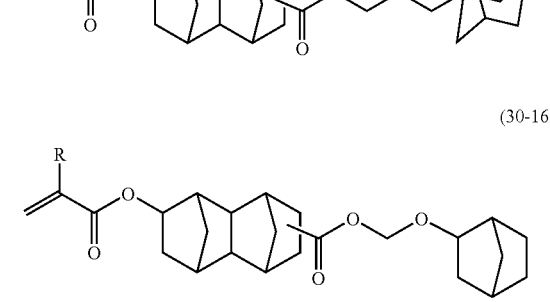

(30-161)
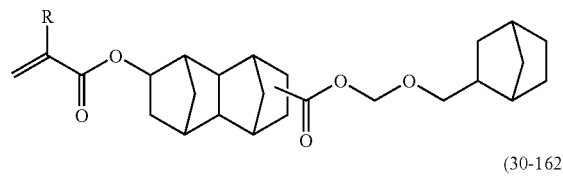
(30-162)
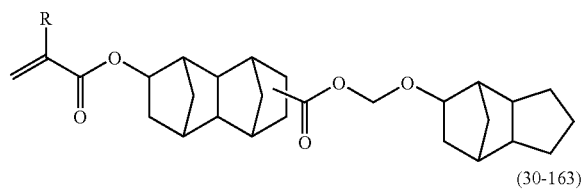
(30-163)
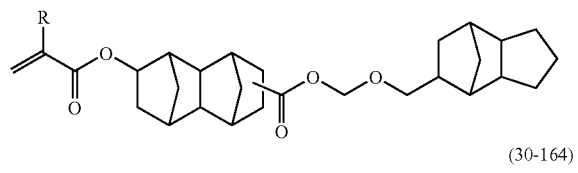
(30-164)
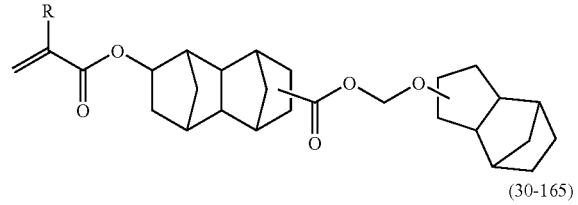
(30-165)
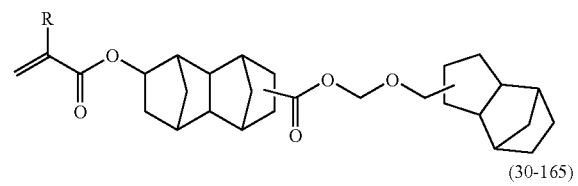
(30-165)
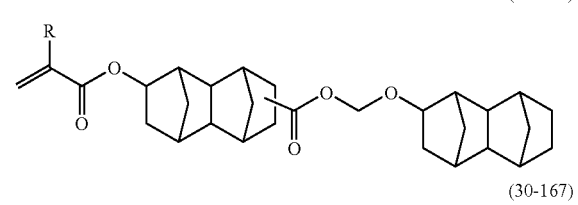
(30-167)
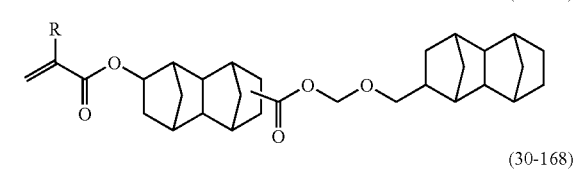
(30-168)
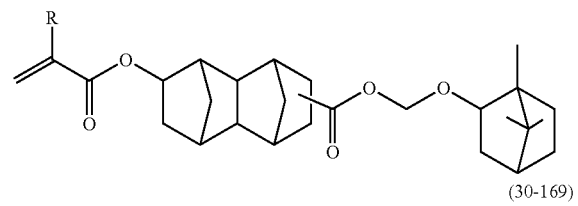
(30-169)
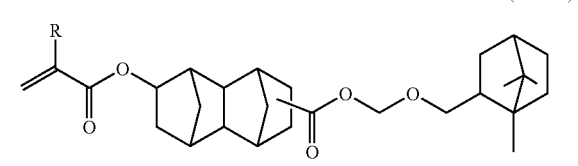
(30-170)
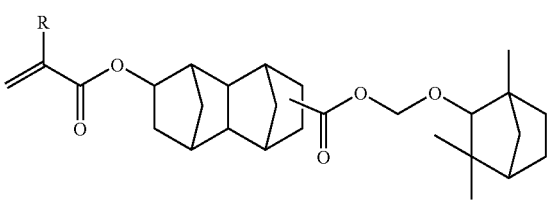
(30-171)
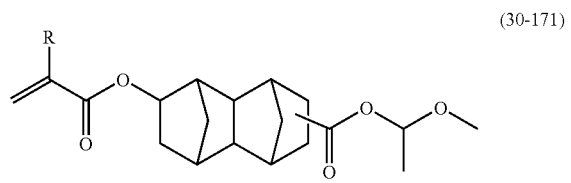
(30-172)
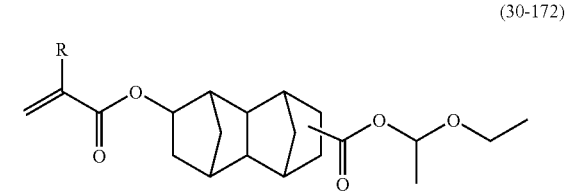
(30-173)
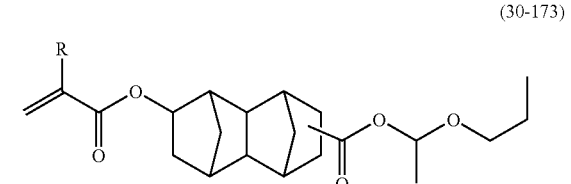
(30-174)
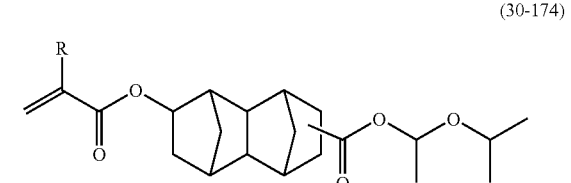
(30-175)
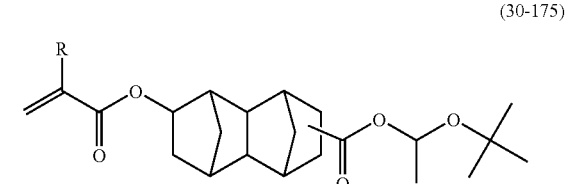
(30-176)
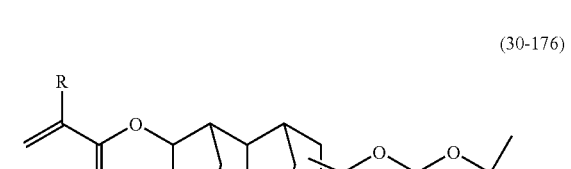
(30-177)
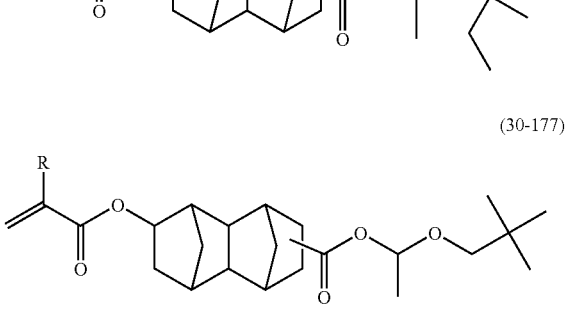

(30-178)
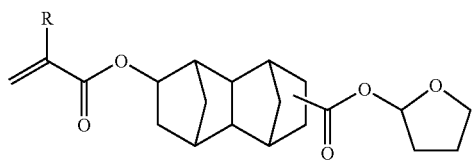
(30-179)
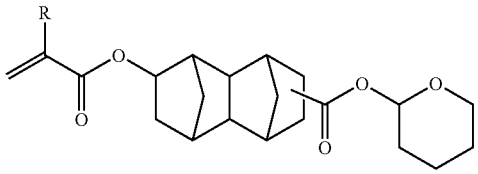
(30-180)
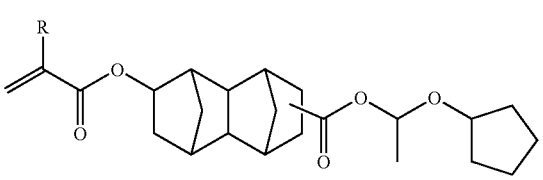
(30-181)
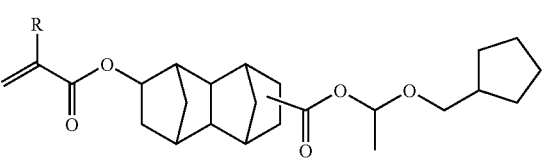
(30-182)
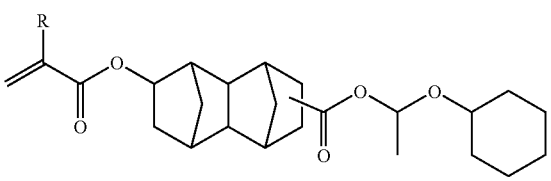
(30-183)
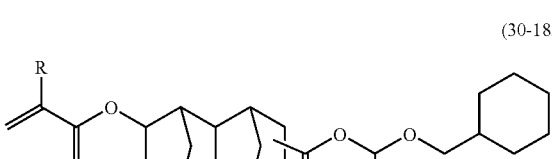
(30-184)
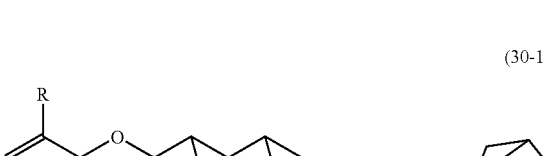
(30-185)
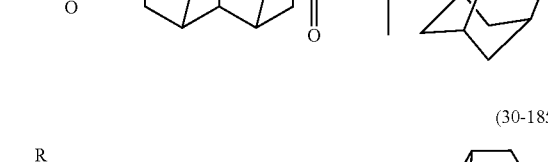
(30-186)
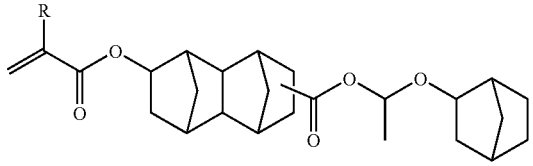
(30-187)
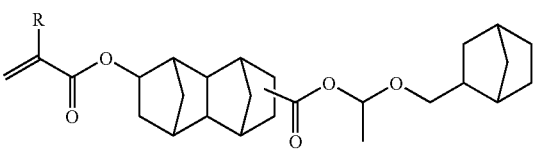
(30-188)
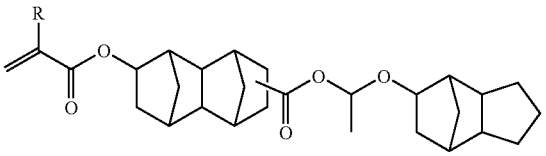
(30-189)
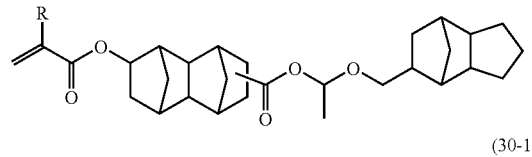
(30-190)
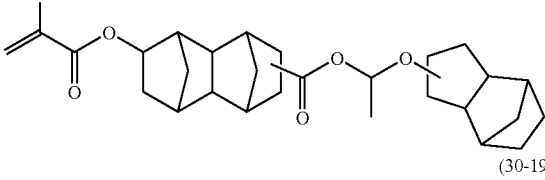
(30-191)
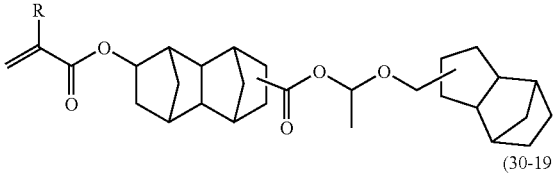
(30-192)
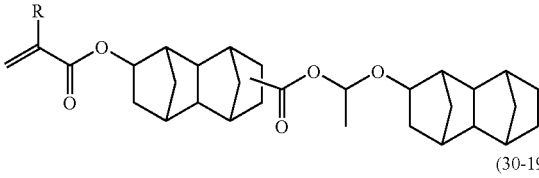
(30-193)
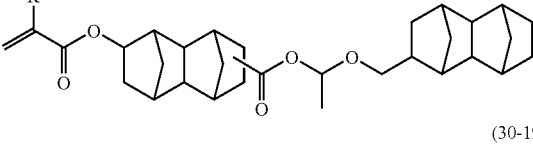
(30-194)
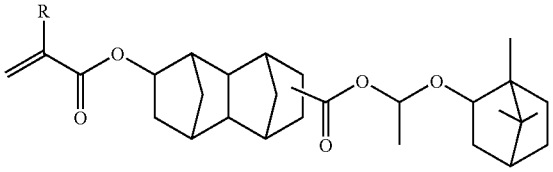

(30-195)

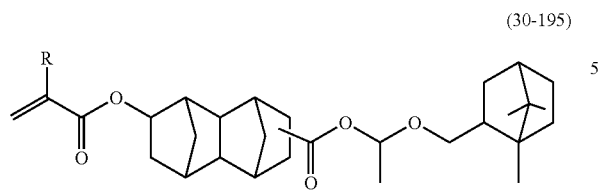

(30-196)

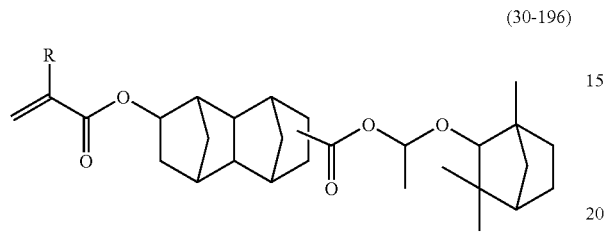

Among others, in terms of sensitivity and resolution, preferred monomers include monomers represented by formulas (30-1) to (30-3), formula (30-5), formula (30-16), formula (30-19), formula (30-20), formula (30-22), formula (30-23), formulas (30-25) to (30-28), formula (30-30), formula (30-31), formula (30-33), formula (30-34) and formulas (30-102) to (30-129), and geometrical isomers and optical isomers thereof; and particularly preferred monomers include monomers represented by formula (30-1), formula (30-2), formula (30-16), formula (30-20), formula (30-23), formula (30-28), formula (30-31), formula (30-34), formula (30-109), formula (30-111), formulas (30-114) to (30-117), formula (30-125), formula (30-128) and formula (30-129).

Further, in terms of excellent line edge roughness, preferred monomers include monomers represented by formulas (30-35) to (30-40), monomers represented by formulas (30-52) to (30-62), monomers represented by formulas (30-76) to (30-88), monomers represented by formulas (30-130) to (30-135), monomers represented by formulas (30-147) to (30-157), monomers represented by formulas (30-171) to (30-183), and geometrical isomers and optical isomers thereof.

Further, in terms of excellent dry-etching resistance, preferred monomers include monomers represented by formulas (30-41) to (30-51), monomers represented by formulas (30-63) to (30-75), monomers represented by formulas (30-89) to (30-101), monomers represented by formulas (30-136) to (30-146), monomers represented by formulas (30-158) to (30-170), monomers represented by formulas (30-184) to (30-196), and geometrical isomers and optical isomers thereof.

The resist polymer of the present invention may contain a structural unit having a lactone skeleton other than the structural units because the structural unit having a lactone skeleton is excellent in adhesiveness to the substrate.

The structural unit having a lactone skeleton is preferably at least one selected from the group consisting of the following formulas (31-1) to (31-5) in terms of sensitivity or dry-etching resistance.

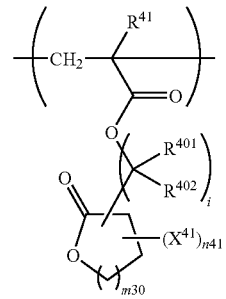

(31-1)

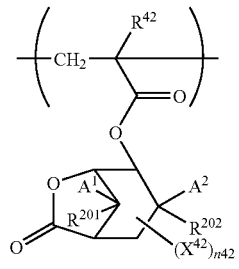

(31-2)

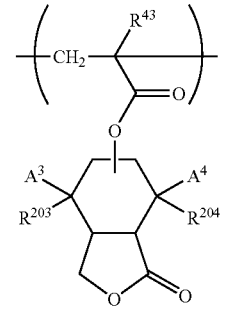

(31-3)

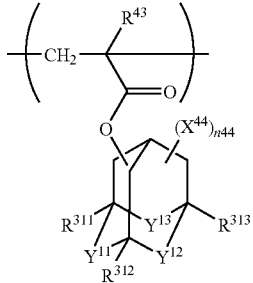

(31-4)

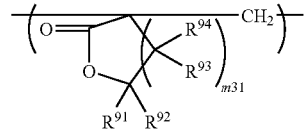

(31-5)

In formulas, $R^{41}$, $R^{42}$, $R^{43}$, $R^{44}$, $R^{311}$, $R^{312}$ and $R^{313}$ each independently represent a hydrogen atom or a methyl group; $R^{401}$, $R^{402}$, $R^{201}$, $R^{202}$, $R^{203}$, $R^{204}$, $R^{91}$, $R^{92}$, $R^{93}$, $R^{94}$, $A^1$, $A^2$, $A^3$ and $A^4$ each independently represent a hydrogen atom, a linear or branched alkyl group having 1 to 6 carbon atoms, a hydroxyl group, a carboxyl group or a carboxyl group esterified with an alcohol having 1 to 6 carbon atoms; $X^{41}$, $X^{42}$, $X^{43}$ and $X^{44}$ each represent, as a substituent, a linear or branched alkyl group having 1 to 6 carbon atoms which may have at least one group selected from the group consisting of a hydroxyl group, a carboxyl group, an acyl group having 1 to 6 carbon atoms, an alkoxy group having 1 to 6 carbon atoms, a carboxyl group esterified with an alcohol having 1 to 6 carbon atoms, a cyano group and an amino group, a hydroxyl group, a carboxyl group, an acyl group having 1 to 6 carbon atoms, an alkoxy group having 1 to 6 carbon atoms, a carboxyl group esterified with an alcohol having 1 to 6 carbon atoms or an amino group; n41, n42, n43 and n44 each represent an integer of 0 to 4, wherein when n41, n42, n43 or n44 is an integer of 2 or more, a plurality of different groups may be contained as $X^{41}$, $X^{42}$, $X^{43}$ or $X^{44}$, respectively; $Y^{11}$, $Y^{12}$ and $Y^{13}$ each independently represent —$CH_2$— or —CO—O—, wherein at least one of them represents —CO—O—; i represents 0 or 1; m30 and m31 each represent 1 or 2; $R^{401}$ and $R^{402}$ (when i=1) or $R^{91}$ and $R^{92}$ (when m31=1) together may form a methylene chain having 2 to 6 carbon atoms {—$(CH_2)_j$— (wherein j represents an integer of 2 to 6)} or a methylene chain having 1 to 6 carbon atoms {—$(CH_2)_k$— (wherein k represents an integer of 1 to 6)} containing —O—, —S— or —NH—; and $R^9$'s or $R^{92}$s (when m1=2), $A^1$ and $A^2$, or $A^3$ and $A^4$ together may form a methylene chain having 1 to 6 carbon atoms {—$(CH_2)_l$— (wherein l represents an integer of 1 to 6)} which may contain —O—, —S— or —NH—, —O—, —S— or —NH—.

In these formulas, examples of the linear or branched alkyl group having 1 to 6 carbon atoms include a methyl group, an ethyl group, an n-propyl group, an isopropyl group, an n-butyl group, an isobutyl group, a t-butyl group, an n-pentyl group, a neo-pentyl group, a 1,1-dimethylpropyl group, a 1,2-dimethylpropyl group, a 1,1-dimethylbutyl group, 2,2-dimethylbutyl group, an n-hexyl group, a 1-methylpentyl group, a 2-methylpentyl group, a 3-methylpentyl group and the like.

Preferably, n41, n42, n43 and n44 in formulas (31-1) to (31-4) each represent 0 in terms of high dry-etching resistance.

Preferably, m30 in formula (31-1) represents 1 in terms of sensitivity and resolution.

Preferably, $A^1$ and $A^2$ in formula (31-2) together and $A^3$ and $A^4$ in formula (31-3) together each form —$CH_2$— or —$CH_2CH_2$— in terms of high dry-etching resistance or —O— in terms of high solubility in organic solvents.

Preferably, $R^{201}$ and $R^{202}$ in formula (31-2) and $R^{203}$ and $R^{204}$ in formula (31-3) each independently represent a hydrogen atom, a methyl group, an ethyl group or an isopropyl group in terms of high solubility in organic solvents.

Preferably, $R^{311}$, $R^{312}$ and $R^{313}$ in formula (31-4) each represent a hydrogen atom in terms of high solubility in organic solvents.

Preferably, one of $Y^{11}$, $Y^{12}$ and $Y^{13}$ in formula (31-4) represents —CO—O—, and the remaining two represent —$CH_2$—, in terms of high adhesiveness to the surface of substrates or the like.

Preferably, $R^{91}$, $R^{92}$, $R^{93}$ and $R^{94}$ in formula (31-5) each independently represent a hydrogen atom or a methyl group in terms of high solubility in organic solvents.

Preferably, m31 in formula (31-5) represents 1 in terms of sensitivity and resolution.

The structural unit having a lactone skeleton may be of one type or two or more types.

The monomer as a raw material for forming the structural unit having a lactone skeleton specifically includes a monomer represented by any of the following formulas (32-1) to (32-26). In formulas (32-1) to (32-26), R represents a hydrogen atom or a methyl group.

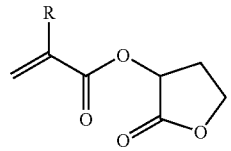

(32-1)

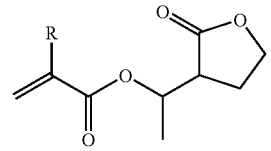

(32-2)

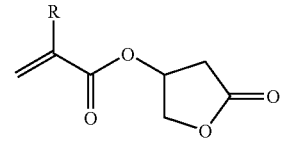

(32-3)

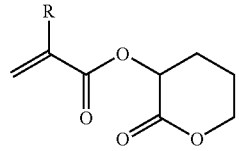

(32-4)

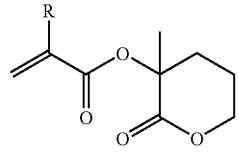

(32-5)

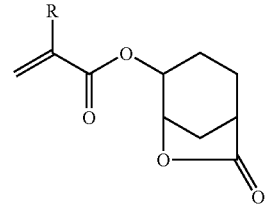

(32-6)

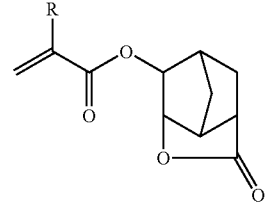

(32-7)

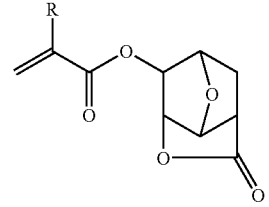

(32-8)

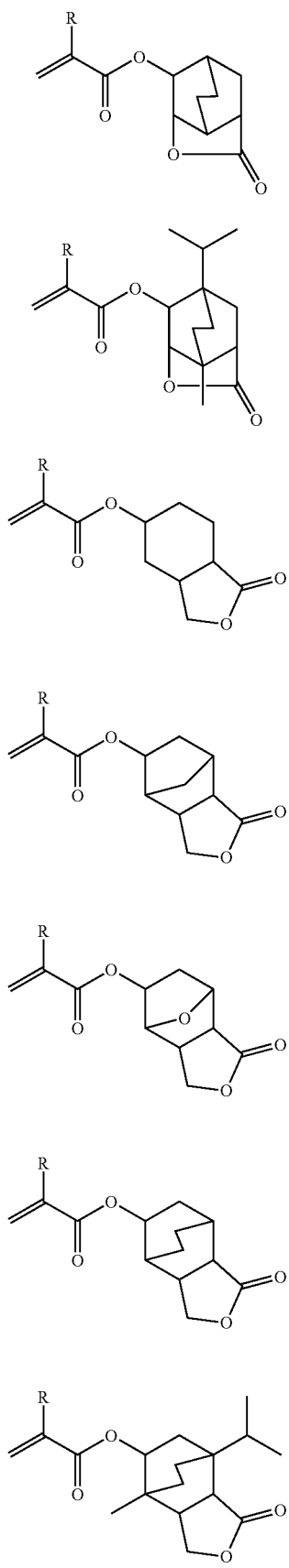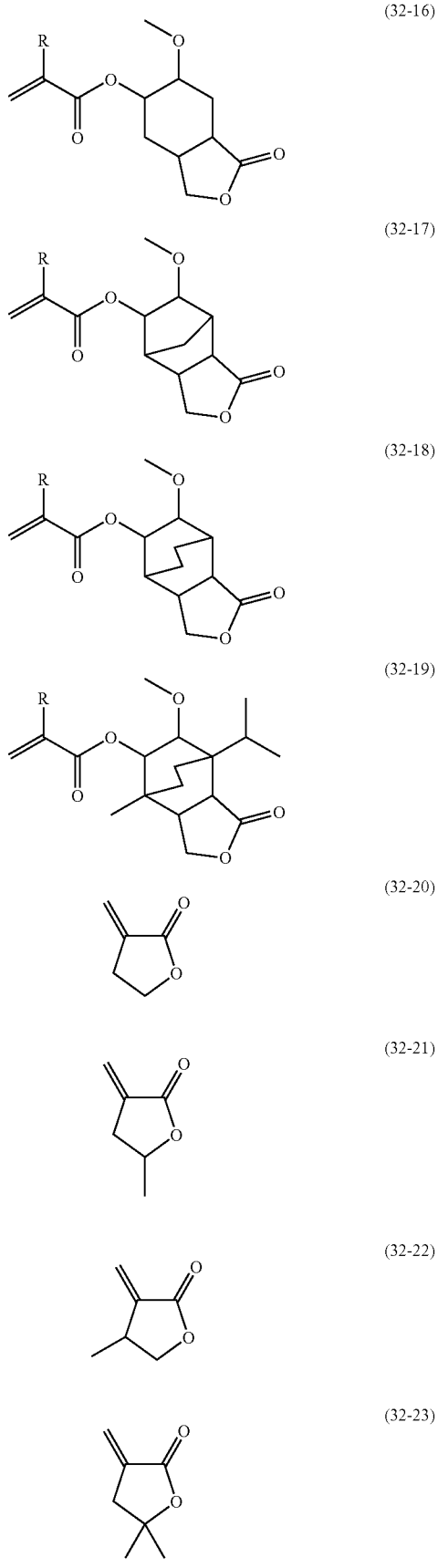

(32-24)

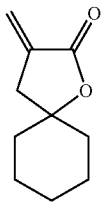

(32-25)

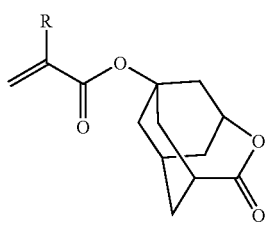

(32-26)

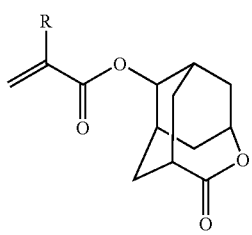

Among others, in terms of sensitivity, preferred monomers include monomers represented by formulas (32-1) to (32-3) and formula (32-5), and geometrical isomers and optical isomers thereof; in terms of dry-etching resistance, preferred monomers include monomers represented by formulas (32-7), (32-9), (32-10), (32-12), (32-14) and (32-24) to (32-26), and geometrical isomers and optical isomers thereof; and in terms of solubility in resist solvents, preferred monomers include monomers represented by formulas (32-8), (32-13) and (32-16) to (32-23), and geometrical isomers and optical isomers thereof.

Further, the resist polymer of the present invention may contain a structural unit having an alicyclic skeleton without an acid-eliminable group or a hydrophilic group (non-polar alicyclic skeleton) other than the structural units because the structural unit is excellent in dry-etching resistance required for resists.

As described herein the alicyclic skeleton refers to a skeleton having one or more saturated cyclic hydrocarbon groups.

The structural unit having a non-polar alicyclic skeleton may be contained singly or in combination of two or more.

The structural unit having a non-polar alicyclic skeleton preferably includes a structural unit represented by any of the following formulas (33-1) to (33-4) in terms of high dry-etching resistance required for resists.

(33-1)

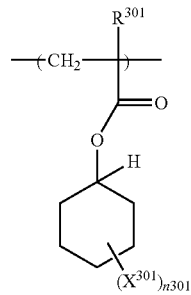

(33-2)

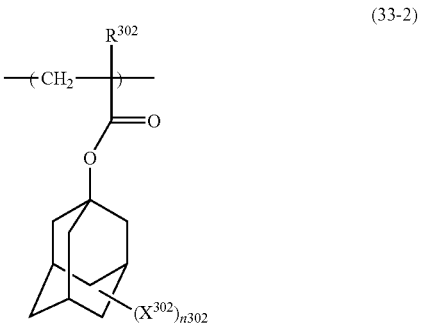

(33-3)

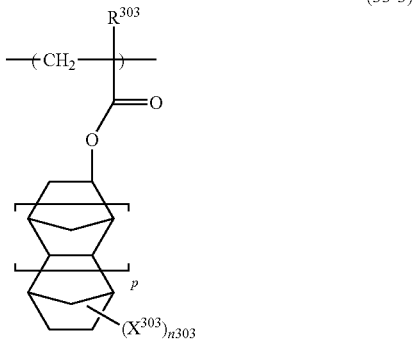

(33-4)

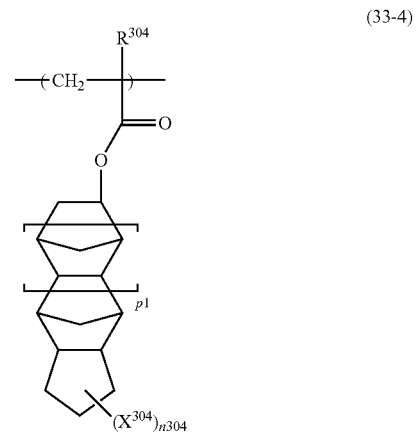

In formulas, $R^{301}$, $R^{302}$, $R^{303}$, and $R^{304}$ each independently represent a hydrogen atom or a methyl group; $X^{301}$, $X^{302}$, $X^{303}$ and $X^{304}$ each independently represent a linear or branched alkyl group having 1 to 6 carbon atoms; n301, n302, n303 and n304 each independently represent an integer of 0 to 4, wherein when n301, n302, n303 or n304 is two or more, a plurality of different groups may be contained as $X^{301}$, $X^{302}$, $X^{303}$ or $X^{304}$, respectively; and p and p1 each independently represent an integer of 0 to 2.

In formulas (33-1) to (33-4), the position to which $X^{301}$, $X^{302}$, $X^{303}$ and $X^{304}$ are bonded may be any position in the cyclic structure.

Preferably, n301, n302, n303 and n304 in formulas (33-1) to (33-4) each represent 0 in terms of high dry-etching resistance.

Preferably, p in formula (33-3) and p1 in formula (33-4) each represent 0 in terms of high solubility in organic solvents or 1 in terms of high dry-etching resistance.

In order to introduce such a structural unit into a polymer, a monomer having a non-polar alicyclic skeleton may be copolymerized. The monomer having a non-polar alicyclic skeleton may be used singly or in combination of two or more, as necessary.

Examples of the monomer having a non-polar alicyclic skeleton preferably include cyclohexyl (meth)acrylate, isobornyl (meth)acrylate, norbornyl (meth)acrylate, adamantyl (meth)acrylate, tricyclodecanyl (meth)acrylate, dicyclopentadienyl (meth)acrylate, and a derivative having a linear or branched alkyl group having 1-6 carbon atoms on the alicyclic skeleton of these compounds.

Examples of the monomer having a non-polar alicyclic skeleton specifically include monomers represented by the following formulas (34-1) to (34-5). In formulas (34-1) to (34-5), R represents a hydrogen atom or a methyl group.

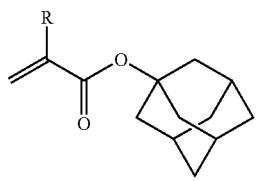

(34-1)

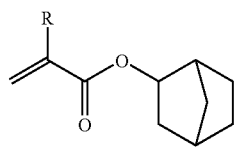

(34-2)

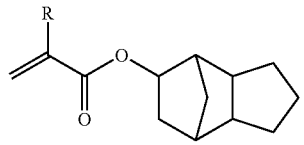

(34-3)

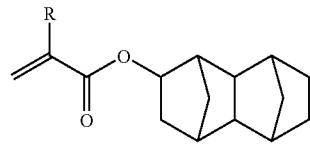

(34-4)

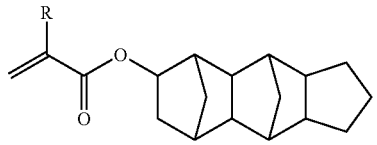

(34-5)

The resist polymer of the present invention may further comprise structural units other than those described above.

Monomers as the raw materials for forming the structural units include, for example, (meth)acrylates having linear or branched structures such as methyl (meth)acrylate, ethyl (meth)acrylate, 2-ethylhexyl (meth)acrylate, n-propyl (meth)acrylate, iso-propyl (meth)acrylate, butyl (meth)acrylate, isobutyl (meth)acrylate, tert-butyl (meth)acrylate, methoxymethyl (meth)acrylate, n-propoxyethyl (meth)acrylate, iso-propoxyethyl (meth)acrylate, n-butoxyethyl (meth)acrylate, iso-butoxyethyl (meth)acrylate, tert-butoxyethyl (meth)acrylate, 2-hydroxylethyl (meth)acrylate, 3-hydroxylpropyl (meth)acrylate, 2-hydroxyl-n-propyl (meth)acrylate, 4-hydroxyl-n-butyl (meth)acrylate, 2-ethoxyethyl (meth)acrylate, 1-ethoxyethyl (meth)acrylate, 2,2,2-trifluoroethyl (meth)acrylate, 2,2,3,3-tetrafluoro-n-propyl (meth)acrylate, 2,2,3,3,3-pentafluoro-n-propyl (meth)acrylate, methyl α-(tri)fluoromethylacrylate, ethyl α-(tri)fluoromethylacrylate, 2-ethylhexyl α-(tri)fluoromethylacrylate, n-propyl α-(tri)fluoromethylacrylate, isopropyl α-(tri)fluoromethylacrylate, n-butyl α-(tri)fluoromethylacrylate, isobutyl α-(tri)fluoromethylacrylate, tert-butyl α-(tri)fluoromethylacrylate, methoxymethyl α-(tri)fluoromethylacrylate, ethoxyethyl α-(tri)fluoromethylacrylate, n-propoxyethyl α-(tri)fluoromethylacrylate, iso-propoxyethyl α-(tri)fluoromethylacrylate, n-butoxyethyl α-(tri)fluoromethylacrylate, iso-butoxyethyl α-(tri)fluoromethylacrylate, and tert-butoxyethyl α-(tri)fluoromethylacrylate;

aromatic alkenyl compounds such as styrene, α-methylstyrene, vinyl toluene, p-hydroxylstyrene, p-tert-butoxycarbonyl hydroxylstyrene, 3,5-di-tert-butyl-4-hydroxylstyrene, 3,5-dimethyl-4-hydroxylstyrene, p-tert-perfluorobutyl styrene, and p-(2-hydroxyl-isopropyl)styrene;

unsaturated carboxylic acids and carboxylic acid anhydrides such as (meth)acrylic acid, maleic acid, maleic anhydride, itaconic acid, and itaconic anhydride;

ethylene, propylene, norbornene, tetrafluoroethylene, acrylamide, N-methylacrylamide, N,N-dimethylacrylamide, vinyl chloride, vinyl fluoride, vinylidene fluoride, vinyl pyrolidone and the like. These monomers can be used singly or in combination of two or more, as necessary.

Typically, the sum of the structural units other than the structural unit having a hydrophilic group, the structural unit having an acid-eliminable group, and the structural unit having a lactone skeleton is preferably in the range of 20% by mole or less based on the total polymer.

The weight-average molecular weight of the resist polymer of the present invention is, but not limited to, preferably 1,000 or more, more preferably 2,000 or more, further preferably 4,000 or more, and most preferably 5,000 or more, in terms of dry-etching resistance and resist pattern shape. Further, the weight-average molecular weight of the resist polymer of the present invention is preferably 100,000 or less, more preferably 50,000 or less and further preferably 30,000 or less, in terms of solubility in a resist solution and resolution, and most preferably 15,000 or less, in terms of line edge roughness and tailing.

A method for producing the resist polymer of the present invention will now be described.

The resist polymer containing the acid-decomposable unit having a structure represented by formula (1) as a structural unit can be produced by polymerization using a polymerization initiator and a compound represented by the following formula (6).

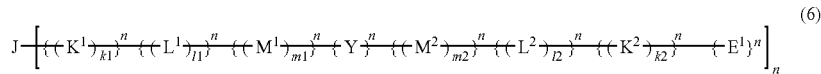
(6)

In formula (6), $E^1$ represents a functional group having polymerization termination ability or chain transfer ability; and J, $K^1$, $K^2$, $L^1$, $L^2$, $M^1$, $M^2$, $M^3$, $Y^1$, $Y^2$, k1, k2, l1, l2, m1, m2, m3, n1 and n each have the same meaning as in formula (1).

The functional group $E^1$ having polymerization termination ability or chain transfer ability includes a group having an active hydrogen such as a hydroxyl group and a thiol group, an alkyl group substituted with a halogen atom such as bromine, a radical group such as a nitroxide radical, and the like.

Among others, when n=2 and $E^1$ represents a thiol group in formula (6), formula (6) has a structure represented by the following formula (7).

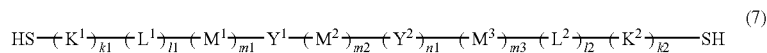
(7)

In formula (7), S represents a sulfur atom; and $K^1$, $K^2$, $L^1$, $L^2$, $M^1$, $M^2$, $M^3$, $Y^1$, $Y^2$, k1, k2, l1, l2, m1, m2, m3 and n1 each have the same meaning as in formula (1).

Specific examples of the compounds represented by formulas (6) and (7) include, for example, those represented by the following formulas (35-1) to (35-80). Among others, the following formulas (35-3), (35-25) and (35-26) are preferred.

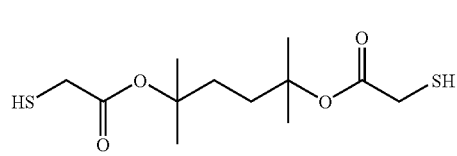
(35-1)

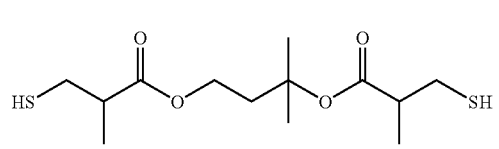
(35-2)

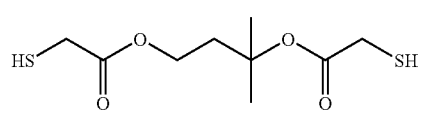
(35-3)

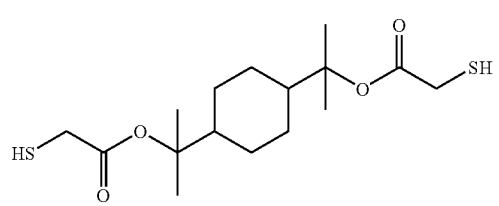
(35-4)

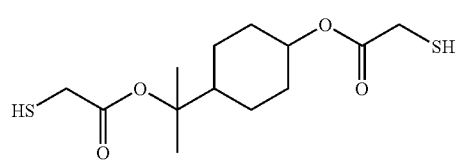
(35-5)

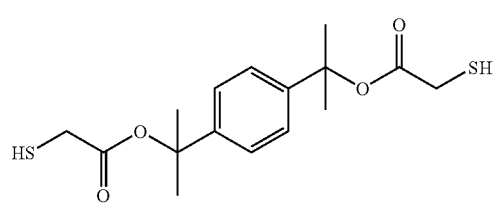
(35-6)

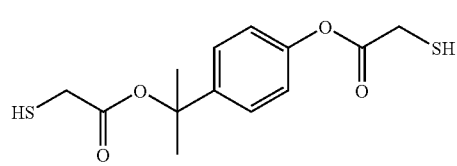
(35-7)

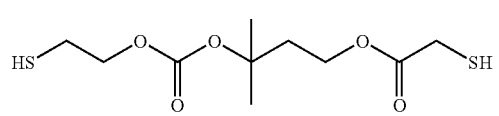
(35-8)

-continued
(35-9) 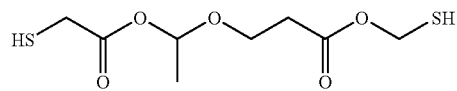
(35-10) 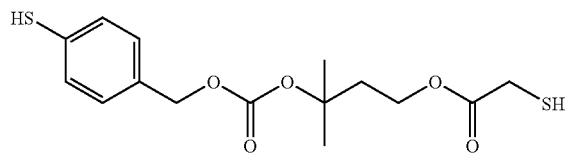
(35-11) 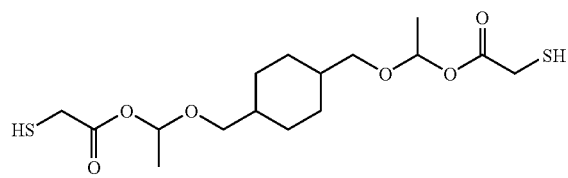
(35-12) 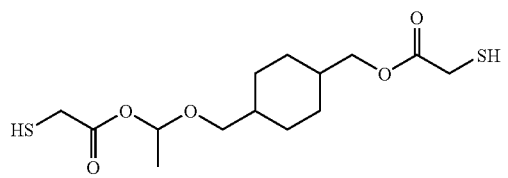
(35-13) 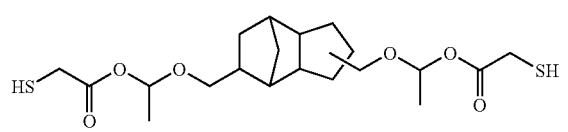
(35-14) 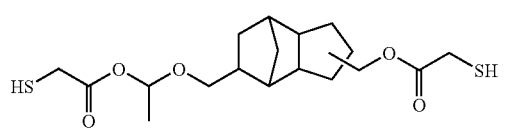
(35-15) 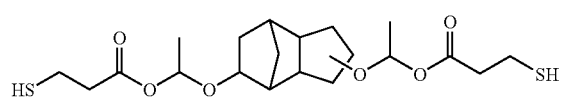
(35-16) 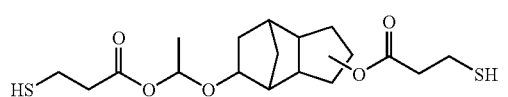
(35-17) 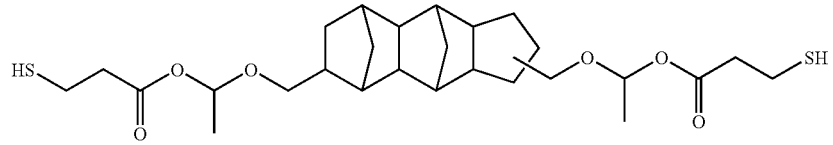
(35-18) 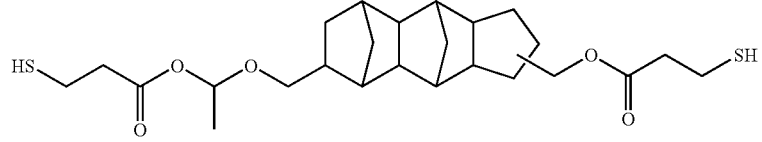
(35-19) 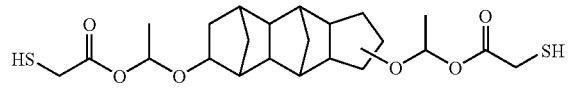
(35-20) 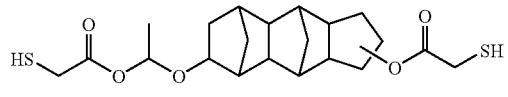
(35-21) 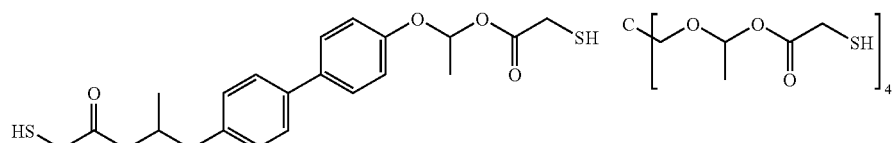
(35-22) 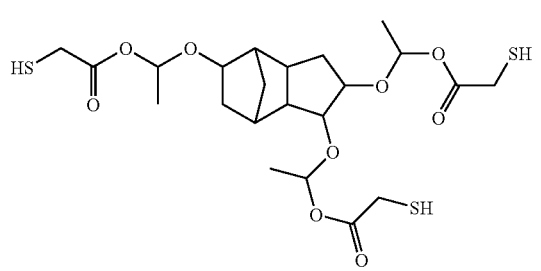
(35-23) 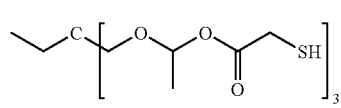
(35-24)

-continued
(35-25)
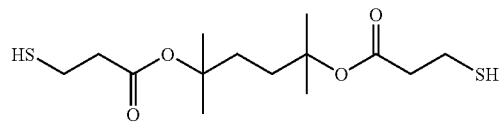
(35-26)
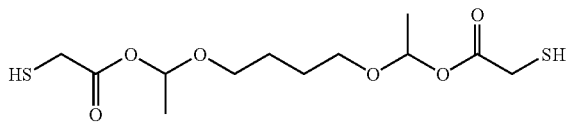
(35-27)
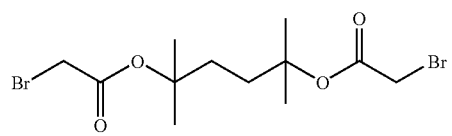
(35-28)
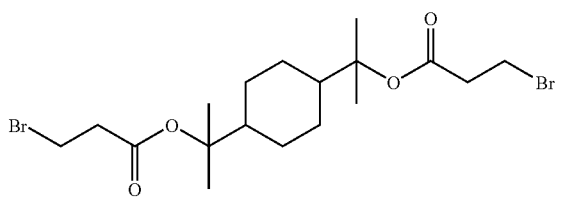
(35-29)
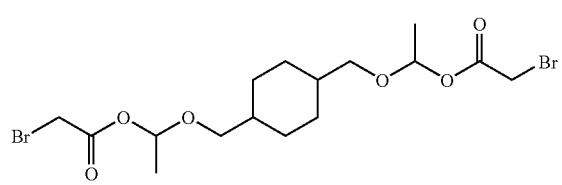
(35-30)
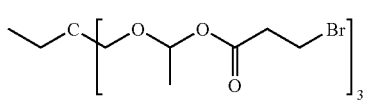
(35-31)
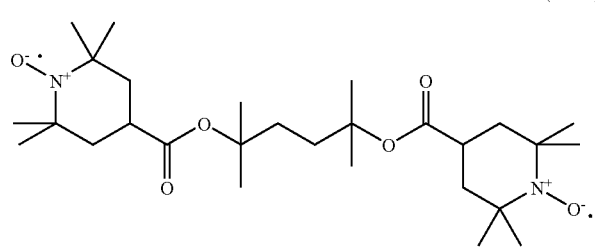
(35-32)
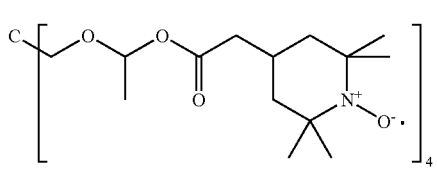
(35-33)
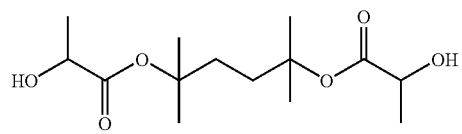
(35-34)
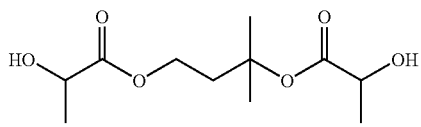
(35-35)
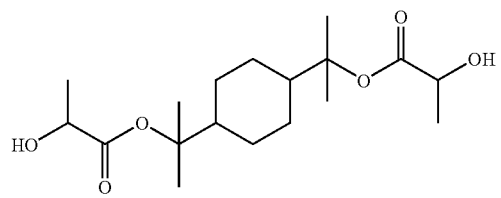
(35-36)
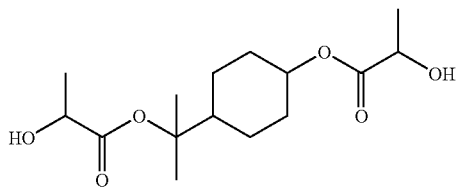
(35-37)
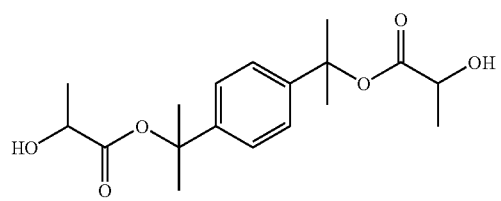
(35-38)
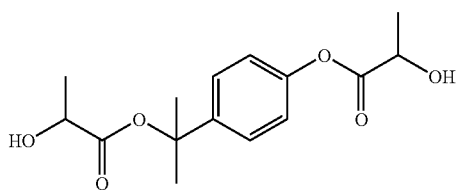
(35-39)
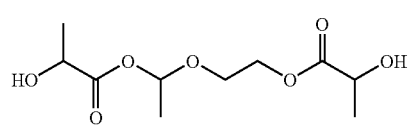
(35-40)
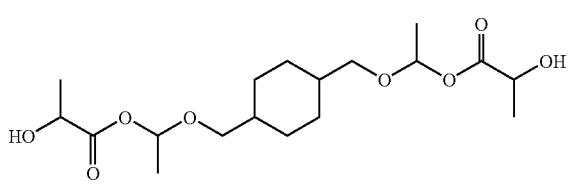

-continued
(35-41)
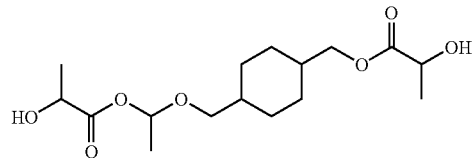
(35-42)
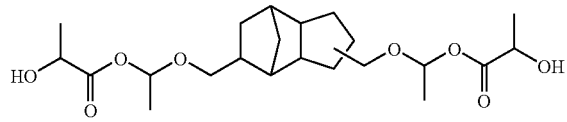
(35-43)
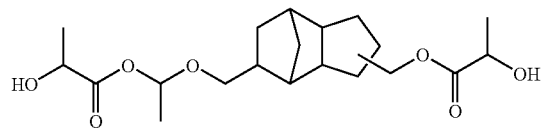
(35-44)
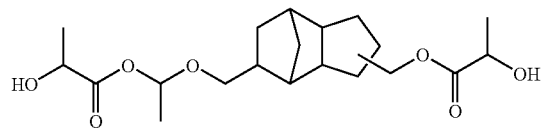
(35-45)
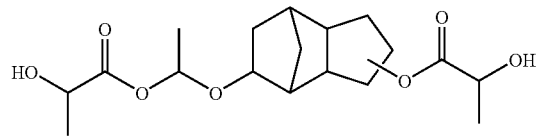
(35-46)
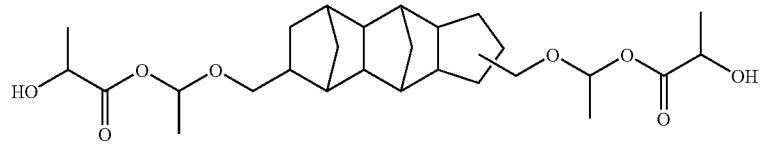
(35-47)
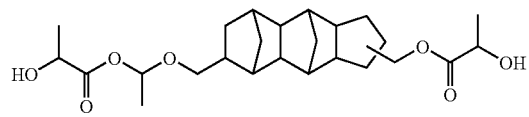
(35-48)
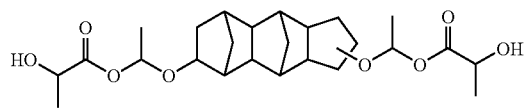
(35-49)
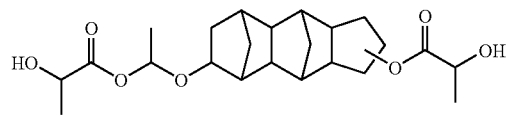
(35-50)
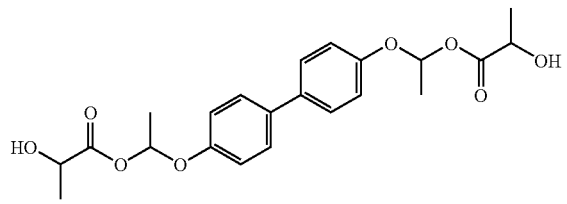
(35-51)
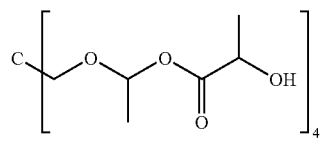
(35-52)
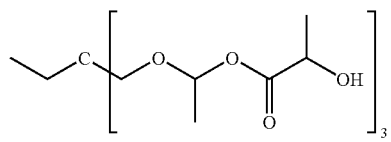
(35-53)
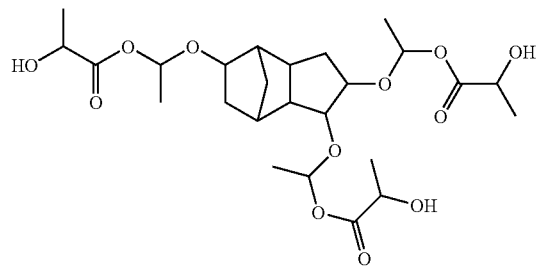
(35-54)
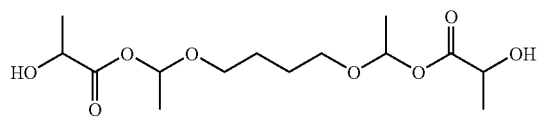

-continued
(35-55)
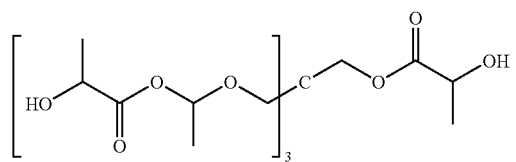
(35-57)
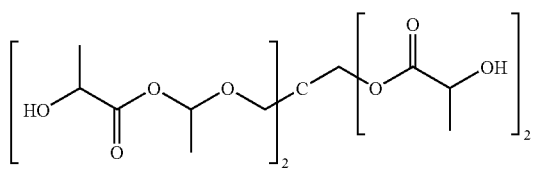
(35-58)
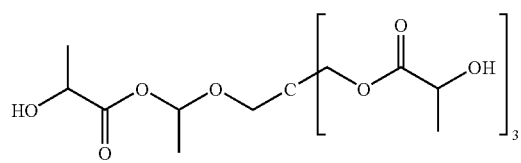
(35-59)
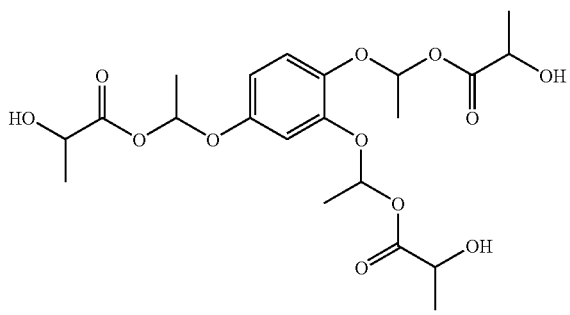
(35-60)
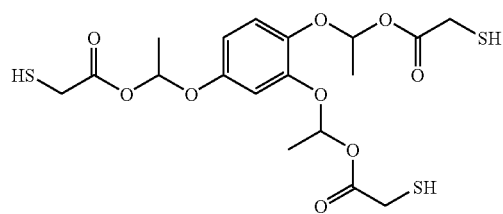
(35-61)
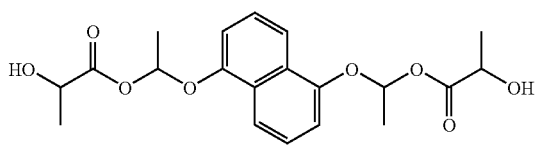
(35-62)
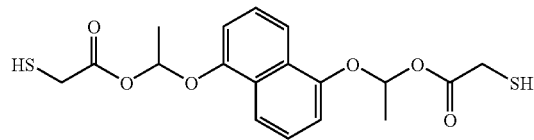
(35-63)
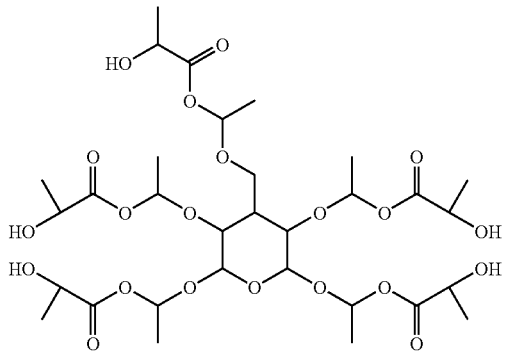
(35-64)
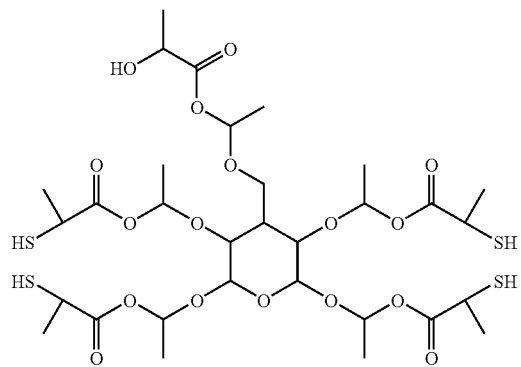
(35-65)
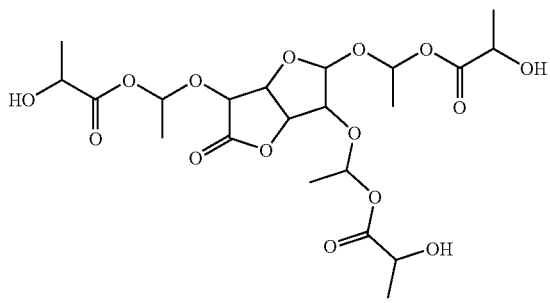

-continued
(35-66)
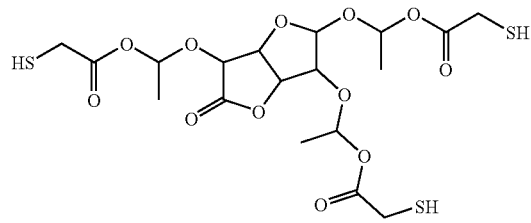
(35-67)
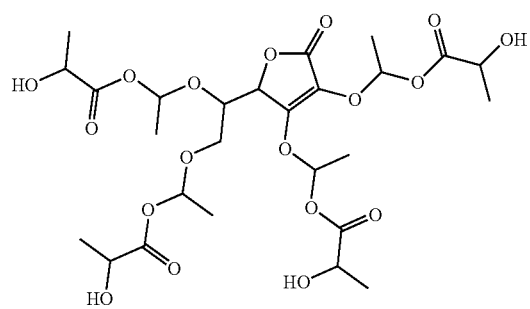
(35-68)
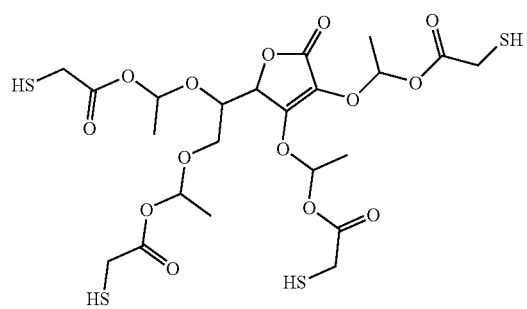
(35-69)
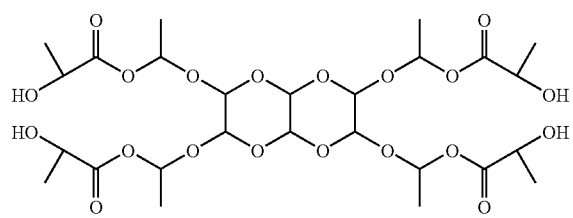
(35-70)
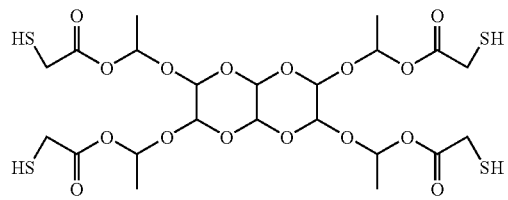
(35-71)
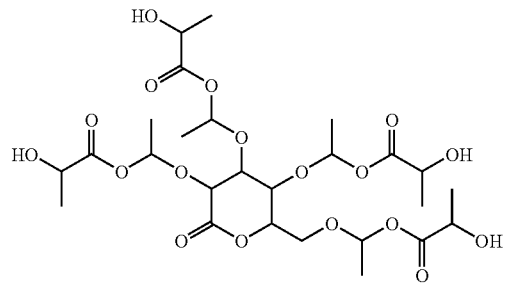
(35-72)
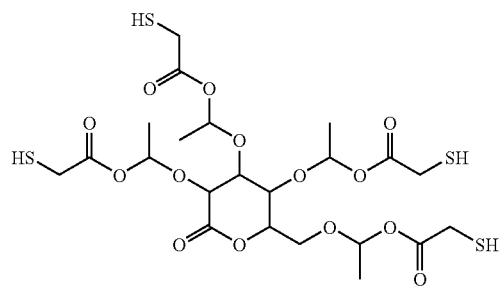
(35-73)
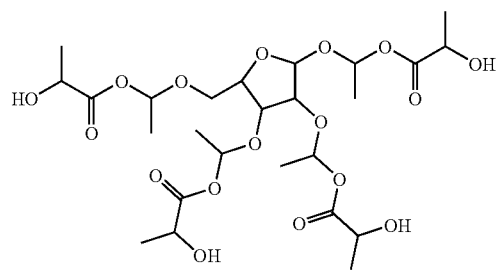
(35-74)
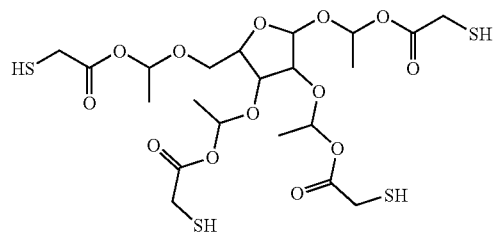
(35-75)
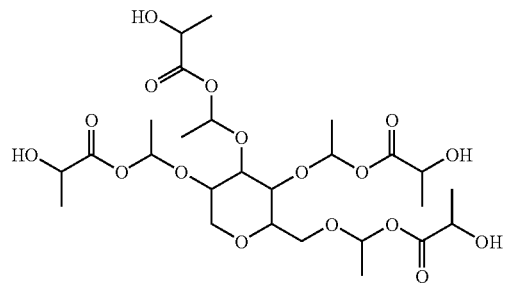

(35-76)
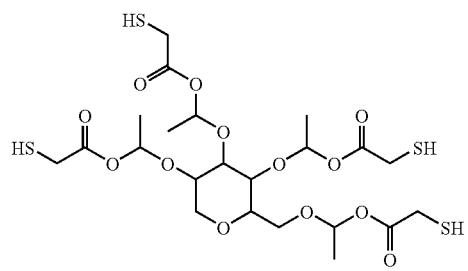
(35-77)
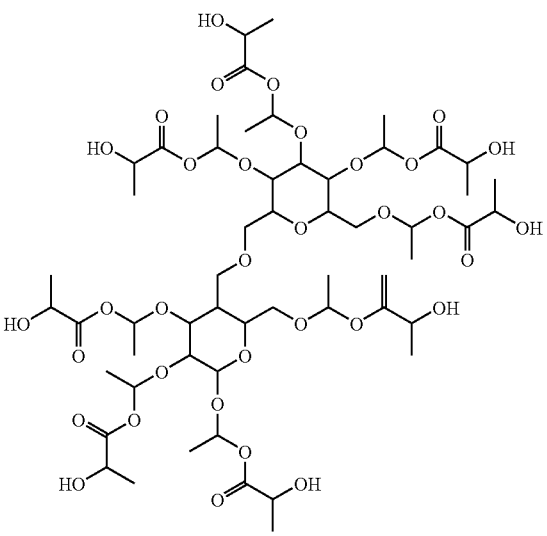
(35-78)
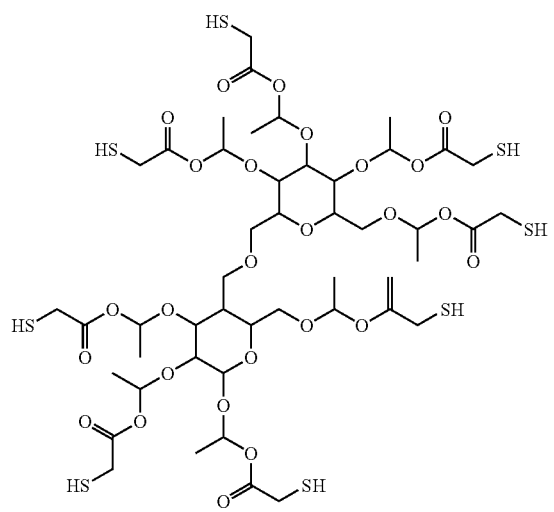
(35-79)
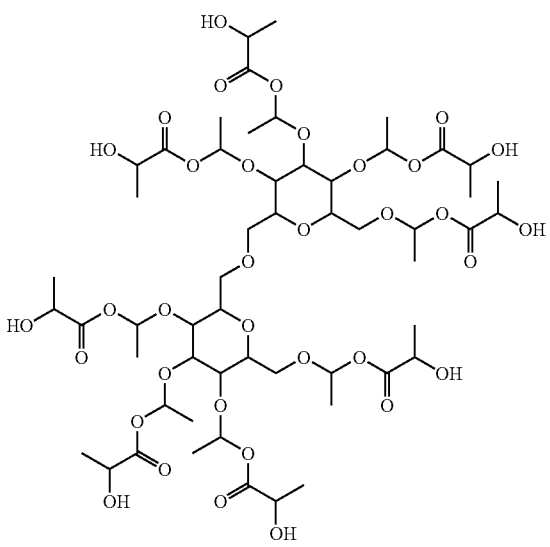

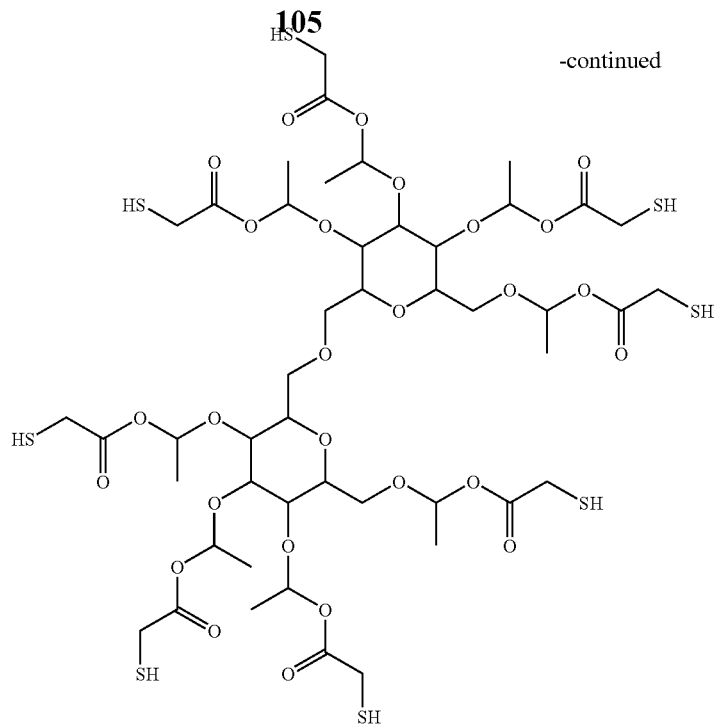

-continued

The percentage in the polymer of the structural unit derived from a compound having an acid-decomposable linkage is preferably from 0.1 to 30% by mole, more preferably from 0.1 to 15% by mole.

The resist polymer of the present invention may be produced by any method but is preferably obtained by radical polymerization of a monomer composition in the presence of a polymerization initiator. Polymerizing a monomer composition by radical polymerization allows a low cost production, and the resulting polymer has low foreign matter content and high transparency.

The mechanism for producing the polymer of the present invention by radical polymerization is described.

In radical polymerization, first a polymerization initiator is decomposed by heat to generate radicals, which initiate chain polymerization of monomers. A polymer having a radical at the growing end is then produced, but when a functional group having chain transfer ability (chain-transferable functional group) is used, the radical at the growing end removes hydrogen in the chain-transferable functional group, generating a polymer with a deactivated growing end. On the other hand, the chain-transferable functional group from which hydrogen has been removed turns into a structure having a radical, specifically, a radical, and the radical again initiates chain polymerization of monomers. When a chain-transferable functional group containing a plurality of functional groups is used, polymerization starts from each functional group, and an acid-decomposable linkage is incorporated into the main chain of the resulting polymer.

In anionic polymerization as well, an acid-decomposable linkage can be incorporated into a polymer by adding a compound containing a functional group having polymerization termination ability out of the compounds containing an acid-decomposable linkage at the end of polymerization.

A polymerization initiator, which produces radicals efficiently by heat, is preferred as the polymerization initiator used for producing the resist polymer of the present invention. Examples of such polymerization initiators include azo compounds such as 2,2'-azobisisobutyronitrile, dimethyl-2,2'-azobisisobutyrate and 2,2'-azobis[2-(2-imidazolin-2-yl)propane]; and organic peroxides such as 2,5-dimethyl-2,5-bis (tert-butylperoxy)hexane. For producing a resist polymer used in ArF excimer laser (wavelength: 193 nm) lithography, a polymerization initiator containing no aromatic ring in the molecular structure is preferred so as to minimize the decrease in the light transmittance (transmittance of light having a wavelength of 193 nm) of the resist polymer to be obtained. In consideration of safety during polymerization, a polymerization initiator that has 10 hours half-life temperature is 60° C. or higher is preferred.

For producing the resist polymer of the present invention, a chain transfer agent (chain transfer agent B) other than the aforementioned acid-decomposable chain transfer agents may also be used.

Preferred examples of such chain transfer agents B include thiols such as 1-butanethiol, 2-butanethiol, 1-octanethiol, 1-decanethiol, 1-tetradecanethiol, cyclohexanethiol, 2-methyl-1-propanethiol, 2-mercaptoethanol, 1-thioglycerol and mercaptoacetic acid.

For producing a resist polymer used in ArF excimer laser (wavelength: 193 nm) lithography, a chain transfer agent containing no aromatic ring is preferred so as to minimize the decrease in the light transmittance (transmittance of light having a wavelength of 193 nm) of the resist polymer to be obtained.

The amount to be used of the polymerization initiator is not particularly limited, and is preferably 0.3% by mole or more, more preferably 1% by mole based on the total amount of the monomers used for copolymerization to improve the yield of a copolymer. The amount is preferably 30% by mole or less based on the total amount of the monomers used for copolymerization to narrow the molecular weight distribution of the copolymer.

The amount to be used of the compound containing an acid-decomposable linkage is not particularly limited, and is preferably 0.01 to 30% by mole, more preferably 0.1 to 15% by mole based on the total amount of the monomers used for copolymerization. The compound containing an acid-decomposable linkage to be used is incorporated into the polymer almost quantitatively.

The method of producing the polymer of the present invention is not particularly limited, but generally, solution polymerization is preferred. In particular, since a polymer with a narrow chemical composition distribution and/or a narrow molecular weight distribution can be easily obtained, preferably the polymer of the present invention is produced by a polymerization method called dropping polymerization. The dropping polymerization is performed with adding monomers (which may be monomers as they are or a solution of monomers dissolved in an organic solvent) dropwise to a polymerization reactor. The monomers constitute a structural unit of the intended polymer after polymerization.

The polymerization temperature in dropping polymerization is not particularly limited, but generally preferably 50 to 150° C.

Solvents which can dissolve all materials used for polymerization including the monomers to be used, the polymerization initiator, the resulting polymer and the aforementioned compound containing an acid-decomposable linkage are preferred as the organic solvent used in dropping polymerization. Examples of such organic solvents include 1,4-dioxane, isopropyl alcohol, acetone, tetrahydrofuran (hereinafter also "THF"), methyl ethyl ketone (hereinafter also "MEK"), methyl isobutyl ketone (hereinafter also "MIBK"), γ-butyrolactone, propylene glycol monomethyl ether acetate (hereinafter also "PGMEA") and ethyl lactate.

The monomer concentration in the monomer solution added dropwise to the organic solvent is not particularly limited, but is preferably in the range of 5 to 50% by mass.

The amount of the organic solvent to be placed in a polymerization reactor is not particularly limited, and is accordingly determined. Generally, the organic solvent is used in an amount of preferably 30 to 700% by mass based on the total amount of the monomers used for copolymerization.

The polymer solution produced by a method such as solution polymerization is diluted to an appropriate solution viscosity with a good solvent such as 1,4-dioxane, acetone, THF, MEK, MIBK, γ-butyrolactone, PGMEA or ethyl lactate according to need, and then added dropwise to a large amount of a poor solvent such as methanol or water to precipitate the polymer. This procedure is generally called reprecipitation and very useful for removing unreacted monomers or the polymerization initiator and so on remaining in the polymer solution. Since these unreacted matters may affect the properties of the resist if they are left, preferably they are removed as much as possible. The reprecipitation step may be unnecessary in some cases. Subsequently, the precipitate is filtrated and sufficiently dried to give a polymer of the present invention. The polymer may be used in the form of wet powder as is without drying after filtration.

The copolymer solution produced may be used as a resist composition as is or after diluting with an appropriate solvent. In that case, an additive such as a storage stabilizer may be accordingly added.

In addition to the method, the resist polymer containing an acid-decomposable unit having a structure represented by formula (1) as a structural unit may also be produced by reacting a polymer precursor (P) having at least one structure selected from the group consisting of the following formulas (8-1) to (8-4) at one or more molecular chain terminals with a vinyl ether compound represented by the following formula (9).

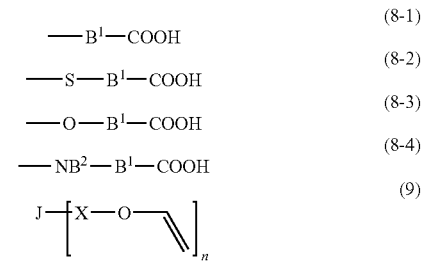

In formulas (8-1) to (8-4), $B^1$ represents a linear, branched or cyclic divalent hydrocarbon group having 1 to 20 carbon atoms which may contain at least one group selected from the group consisting of a carboxyl group esterified with alcohol having 1 to 6 carbon atoms, a cyano group and an amino group, and $B^2$ represents a hydrogen atom, a linear, branched or cyclic alkyl group having 1 to 10 carbon atoms.

In formula (9), n represents an integer of 2 to 24; when n=2, J represents a single bond or a divalent hydrocarbon group which may have a substituent and/or a heteroatom, and when n≧3, J represents an n-valent hydrocarbon group which may have a substituent and/or a heteroatom; and X represents a single bond, $—B^{11}—$, $—S—B^{11}—$, $—O—B^{11}—$, $—O—NB^{12}—$, $—NB^{12}—B^{11}—$ or $—O—Si(B^{13})(B^{14})—$, $B^{11}$ represents a linear, branched or cyclic divalent hydrocarbon group having 1 to 20 carbon atoms which may contain at least one group selected from the group consisting of a carboxyl group esterified with alcohol having 1 to 6 carbon atoms, a cyano group and an amino group, $B^{11}$ may have a heteroatom in the main skeleton, $B^{12}$ represents a hydrogen atom or a linear, branched or cyclic alkyl group having 1 to 10 carbon atoms, and $B^{13}$ and $B^{14}$ each independently represent a hydrogen atom, a linear, branched or cyclic alkyl group having 1 to 10 carbon atoms.

The polymer precursor (P) in the present invention has at least one structure selected from the group consisting of formulas (8-1) to (8-4) at one or more molecular terminals. Specifically, at least one terminal of at least one molecular chain in a polymer is selected from the group consisting of formulas (8-1) to (8-4). An average of preferably 0.2 to 2, more preferably 0.4 to 1, particularly preferably 0.5 to 1 of such a molecular chain terminal is included in a molecule. When the number of such molecular chain terminals is large, they are effective for reducing defects and improving line edge roughness, and when the number is small, gelation is difficult to occur.

For example, the inclusion of the molecular chain terminal represented by formula (8-2) in the polymer precursor (P) can be observed from the change of —SH or —S—S— in the chain transfer agent described later to —S— upon $^{33}$S-NMR measurement. The concentration of molecular chain terminals can be determined by measuring the content of sulfur atoms by fluorescent X-ray analysis.

Of the molecular terminals, molecular terminals represented by formula (8-1) and those represented by formula (8-2) are preferred.

Examples of linear, branched or cyclic divalent hydrocarbon groups having 1 to 20 carbon atoms belonging to $B^1$ include alkylene groups such as a methylene group, an ethylene group, a propylene group, a tetramethylene group, a 1,2-butylene group and a 1,3-butylene group; alkylidene groups such as an ethylidene group and a propylidene group; cycloalkylene groups such as a 1,2-cyclopentylene group and a 1,2-cyclohexylene group; arylene groups such as a 1,2- phenylene group, a 2,3-tolylene group and a 1,4-naphthylene group; aralkylene groups such as a xylylene group. These may be substituted by at least one group selected from the group consisting of a carboxyl group esterified with alcohol having 1 to 6 carbon atoms (e.g., a methoxycarbonyl group, an ethoxycarbonyl group), a cyano group and an amino group.

A linear or branched alkylene group having 1 to 5 carbon atoms, a linear or branched alkylene group having 1 to 5 carbon atoms containing a cyano group, a cyclopentylene group or a cyclohexylene group is preferred as $B^1$.

The polymer precursor (P) containing a molecular chain terminal represented by formula (8-1) to (8-4) can be obtained by performing radical polymerization, anionic polymerization, group transfer polymerization (GTP) or reversible addition-fragmentation chain transfer (RAFT) living radical polymerization in the presence of a specific polymerization initiator and/or a specific chain transfer agent as described below. The polymer precursor (P) containing a molecular chain terminal represented by formula (8-1) to (8-4) can also be obtained by a method adding a specific polymerization terminator during radical polymerization, anionic polymerization or group transfer polymerization. Specific examples of such methods include the following methods (a) to (f).

In the following methods (a) to (d), M means any monomer which produces a structural unit, M* means a structural unit derived from the monomer M, and n0 is an integer showing the number of M and M*.

(a) Example of reaction in the method of radical polymerization in the presence of a polymerization initiator having a molecular chain terminal represented by formula (8-1) to (8-4):

An example of reaction in the method is shown in the following formula:

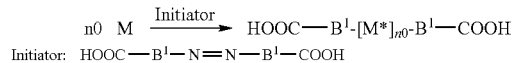

Specific examples of such radical polymerization initiators include 4,4'-azobis(4-cyano valeric acid).

Preferably, the polymer precursor (P) in the present invention is obtained by copolymerizing a monomer composition comprising at least one monomer containing an acid-eliminable group, at least one monomer containing a lactone skeleton and at least one monomer containing an alicyclic structure having a hydrophilic group in the presence of a polymerization initiator having a molecular chain terminal represented by formula (8-1) to (8-4) (hereinafter polymerization initiator A). A polymerization initiator (hereinafter polymerization initiator B) other than the polymerization initiator A may be used together. Examples of polymerization initiators B include azo compounds such as 2,2'-azobisisobutyronitrile, dimethyl-2,2'-azobisisobutyrate and 2,2'-azobis[2-(2-imidazolin-2-yl)propane]; and organic peroxides such as 2,5-dimethyl-2,5-bis(tert-butylperoxy)hexane. For producing a polymer precursor (P) used in ArF excimer laser (wavelength: 193 nm) lithography, a polymerization initiator B containing no aromatic ring in the molecular structure is preferred so as to minimize the decrease in the light transmittance (transmittance of light having a wavelength of 193 nm) of the resist polymer to be obtained. In consideration of safety during polymerization, a polymerization initiator B that has 10 hours half-life temperature is 60° C. or higher is preferred.

The total amount of the polymerization initiator A and the polymerization initiator B is not particularly limited, but to improve the yield of the polymer, the total amount is preferably 0.1% by mole or more based on the total amount of the monomers used for copolymerization. The total amount is preferably 30% by mole or less based on the total amount of the monomers used for copolymerization to narrow the molecular weight distribution of the polymer. The amount to be used of the polymerization initiators is more preferably 0.3% by mole or more, particularly preferably 1% by mole or more based on the total amount of the monomers used for copolymerization.

(b) Example of reaction in the method of radical polymerization in the presence of a chain transfer agent having a molecular chain terminal represented by formula (8-1) to (8-4)

An example of reaction in the method is shown in the following formula. In formula, $E^0$ represents a residue of an initiator.

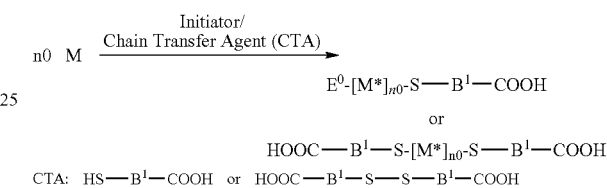

Specific examples of such chain transfer agents include mercaptoacetic acid, thiosalicylic acid, dithiodiglycolic acid, 3,3'-dithiodipropionic acid, 2,2'-dithiodibenzoic acid, DL-2-mercaptomethyl-3-guanidinoethylthiopropanoic acid, 2-mercapto-4-methyl-5-thiazoleacetic acid, p-mercaptophenol, 2-mercaptopropionic acid, 3-mercaptopropionic acid, thiomalic acid, (5-mercapto-1,3,4-thiadiazol-2-ylthio)acetic acid, 2-(5-mercapto-1,3,4-thiadiazol-2-ylthio)propionic acid, 3-(5-mercapto-1,3,4-thiadiazol-2-ylthio)propionic acid and 2-(5-mercapto-1,3,4-thiadiazol-2-ylthio)succinic acid.

For producing the polymer precursor (P) in the present invention, a chain transfer agent (hereinafter chain transfer agent B) other than the chain transfer agent having a molecular chain terminal represented by formula (8-1) to (8-4) (hereinafter chain transfer agent A) may be used together. By using the chain transfer agent B, the resulting polymer can have a narrow molecular weight distribution. The molecular weight distribution is narrowed because generation of high molecular weight polymer is small. The narrow molecular weight distribution is attributable to the fact that high molecular weight polymer is hardly produced. Such a narrow distribution is preferred because the solubility of the polymer in a resist solvent is further improved and generation of microgel and defects is decreased when the polymer is used for a resist. Examples of such chain transfer agents B include 1-butanethiol, 2-butanethiol, 1-octanethiol, 1-decanethiol, 1-tetradecanethiol, cyclohexanethiol and 2-methyl-1-propanethiol.

For producing a polymer precursor (P) used in ArF excimer laser (wavelength: 193 nm) lithography, a chain transfer agent B containing no aromatic ring is preferred so as to minimize the decrease in the light transmittance (transmittance of light having a wavelength of 193 nm) of the polymer precursor (P) to be obtained.

The total amount of the chain transfer agent A and the chain transfer agent B is not particularly limited, but to narrow the molecular weight distribution of the polymer, the total amount is preferably 0.001% to 30% by mole based on the total amount of the monomers used for copolymerization. The amount of chain transfer agents for producing the resist polymer of the present invention is more preferably 5% by mole or less, particularly preferably 2% by mole or less based on the total amount of the monomers used for copolymerization.

(c) Example of reaction in the method adding a terminator having a molecular chain terminal represented by formula (8-1) to (8-4) during radical polymerization An example of reaction in the method is shown in the following formula. Hal represents a halogen atom and $E^0$ represents a residue of an initiator.

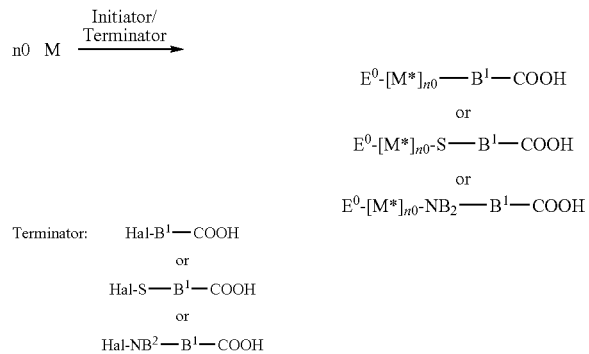

Specific examples of such terminators include bromoacetic acid, 2-bromobenzoic acid, 3-bromobenzoic acid, 4-bromobenzoic acid, 2-bromobutyric acid, 3-bromobutyric acid, 4-bromobutyric acid, chloroacetic acid, 2-chlorobenzoic acid, 3-chlorobenzoic acid, 4-chlorobenzoic acid, 2-bromobutyric acid, 3-bromobutyric acid, 4-bromobutyric acid, iodoacetic acid, 2-iodobenzoic acid, 3-iodobenzoic acid, 4-iodobenzoic acid, 2-iodobutyric acid, 3-iodobutyric acid and 4-iodobutyric acid.

(d) Example of reaction in the method comprising performing living radical polymerization in the presence of a polymerization initiator using a reversible addition fragmentation chain transfer complex (T) together and adding a radical initiator having a molecular chain terminal represented by formula (8-1) to (8-4) to modify the terminal An example of reaction in the method is shown in the following formula. In formula, $E^0$ represents a residue of an initiator.

In the following formula (T) which is a reversible addition fragmentation chain transfer complex, S represents a sulfur atom; $R^A$ represents an alkyl group having 1 to 15 carbon atoms, an aryl group or an aralkyl group which may contain a hydroxyl group, an ester group, an ether group, an amino group or an amide group; L represents a single bond, an oxygen atom, a sulfur atom or a —N($R^{A\prime}$)— group ($R^{A\prime}$ represents a hydrogen atom or $R^A$); $R^B$ represents an alkyl group having 1 to 15 carbon atoms, an aryl group or an aralkyl group which may contain hydroxyl group, an ester group, an ether group, an amino group or a cyano group.

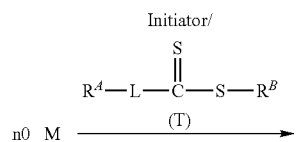

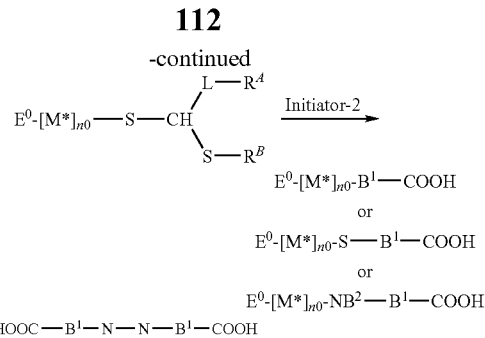

In formula (T), specific examples of $R^A$ when L is a single bond, an oxygen atom or a sulfur atom include a methyl group, an ethyl group, a propyl group, a butyl group, a cyclohexyl group, a norbornyl group, a tricyclodecanyl group, a tetracyclododecanyl group, an adamantyl group, a phenyl group, a benzyl group, a hydroxylmethyl group, a hydroxylethyl group and a hydroxylcyclohexyl group.

When L is a —N($R^{A\prime}$)— group, $R^A$-L- in formula is $R^A$—NH— or $(R^A)(R^A)$N—. Particularly preferred examples of $R^A$ in that case include, independently, a methyl group, an ethyl group, a propyl group, a butyl group, a cyclohexyl group, a norbornyl group, a tricyclodecanyl group, a tetracyclododecanyl group, an adamantyl group, a phenyl group, a benzyl group, an acetyl group, a hydroxylmethyl group, a hydroxylethyl group and a hydroxylcyclohexyl group. $R^A$ may be bonded to each other to form a ring. Examples thereof include a group represented by formula (T-1) or formula (T-2).

Particularly preferred examples of $R^B$ include groups represented by formula (T-4) to formula (T-8).

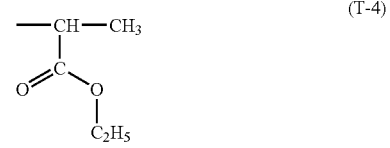

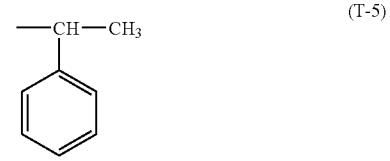

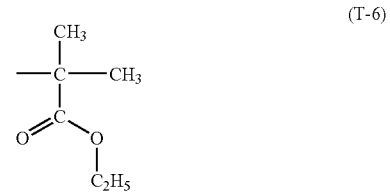

—CH—CH₃ (T-7)
|
CN

—CH₂ (T-8)

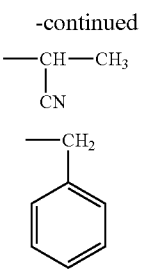

More specific examples of complexes (T) of formula include pyrazole-1-dithiocarboxylic acid cyanodimethyl methyl ester.

In addition, the following methods may also be used although specific examples of the reaction will not be described.

(e) Method comprising performing living polymerization in the presence of a bifunctional polymerization initiator and adding a terminator having a molecular chain terminal represented by formula (8-1) to (8-4)

(f) Method comprising performing living polymerization in the presence of a monofunctional polymerization initiator and adding a terminator having a molecular chain terminal represented by formula (8-1) to (8-4)

Further, to obtain the resist polymer of the present invention, the polymerization initiator A, the chain transfer agent A and the terminator having a molecular chain terminal represented by formula (8-1) to (8-4) may be used together.

The method of producing the polymer precursor (P) of the present invention is not particularly limited, but generally the polymer precursor (P) is produced by solution polymerization, and a polymerization method called dropping polymerization in which monomers are added dropwise to a polymerization reactor is preferred. Of these, since a polymer precursor (P) with a narrow chemical composition distribution and/or a narrow molecular weight distribution can be easily obtained, preferably the polymer precursor (P) in the present invention is produced by a polymerization method called dropping polymerization. The dropping polymerization is performed with adding monomers (which may be monomers as they are or a solution of monomers dissolved in an organic solvent) dropwise to a polymerization reactor. The monomers constitute a structural unit of the intended polymer after polymerization.

In dropping polymerization, an organic solvent, for example, is placed in a polymerization reactor in advance. After heating the reactor to a pre-determined polymerization temperature, a monomer solution in which monomers and a polymerization initiator, and if necessary, a chain transfer agent, are dissolved in an organic solvent is added dropwise to the organic solvent in the polymerization reactor. Monomers may be added dropwise without dissolving in an organic solvent. In that case, a solution in which a polymerization initiator, and if necessary, a chain transfer agent, are dissolved in monomers is added dropwise to an organic solvent. Alternatively, monomers may be added dropwise to a polymerization reactor without placing an organic solvent in the polymerization reactor in advance.

The monomers, the polymerization initiator and the chain transfer agent each may be added dropwise alone or in any combination.

The polymerization temperature in dropping polymerization is not particularly limited, but is generally preferably 50 to 150° C.

Solvents which can dissolve all of the monomers, the polymerization initiator to be used, the resulting polymer precursor (P) and if used, a chain transfer agent, are preferred as the organic solvent used in dropping polymerization. Examples of such organic solvents include 1,4-dioxane, isopropyl alcohol, acetone, tetrahydrofuran (hereinafter also "THF"), methyl ethyl ketone (hereinafter also "MEK"), methyl isobutyl ketone (hereinafter also "MIBK"), γ-butyrolactone, propylene glycol monomethyl ether acetate (hereinafter also "PGMEA"), ethyl lactate, dimethylacetamide (hereinafter also "DMAc") and dimethyl sulfoxide.

The monomer concentration in the monomer solution added dropwise to the organic solvent is not particularly limited, but is preferably in the range of 5 to 50% by mass.

The amount of the organic solvent to be placed in a polymerization reactor is not particularly limited, and is accordingly determined. Generally, the organic solvent is used in an amount of preferably 30 to 700% by mass based on the total amount of the monomers used for copolymerization.

The polymer precursor (P) solution produced by a method such as solution polymerization is diluted to an appropriate solution viscosity with a good solvent such as 1,4-dioxane, acetone, THF, MEK, MIBK, γ-butyrolactone, PGMEA or ethyl lactate according to need, and then added dropwise to a large amount of a poor solvent such as methanol or water to precipitate the polymer. This procedure is generally called reprecipitation and very useful for removing unreacted monomers or the polymerization initiator and so on remaining in the polymer solution. Since these unreacted matters may affect the properties of the resist if they are left, preferably they are removed as much as possible. The reprecipitation step may be unnecessary in some cases. Subsequently, the precipitate is filtrated and sufficiently dried to give a polymer precursor (P) of the present invention. The precursor may be used in the form of wet powder as is without drying after filtration.

The polymer precursor (P) solution produced may be used as is or after diluting with an appropriate solvent as a raw material in the step of reaction with multifunctional vinyl ether described later. In that case, an additive such as a storage stabilizer may be accordingly added.

The mass average molecular weight of the polymer precursor (P) in the present invention is not particularly limited, but the precursor has a weight-average molecular weight of preferably 1,000 or more, more preferably 1,500 or more, particularly preferably 2,000 or more, and still more preferably 2,500 or more in terms of dry-etching resistance and shapes of resist patterns. The polymer precursor (P) in the present invention has a weight-average molecular weight of preferably 20,000 or less, more preferably 15,000 or less in terms of resolution, particularly preferably 13,000 or less, and still more preferably 10,000 or less in terms of line edge roughness and tailing.

The multifunctional vinyl ether compound represented by formula (9) is now described.

In formula (9), X represents a single bond, —$B^{11}$—, —S—$B^{11}$—, —O—$B^{11}$—, —O—$NB^{12}$—, —$NB^{12}$—$B^{11}$— or —O—Si($B^{13}$)($B^{14}$)—, $B^{11}$ represents a linear, branched or cyclic divalent hydrocarbon group having 1 to 20 carbon atoms which may contain at least one group selected from the group consisting of a carboxyl group esterified with alcohol having 1 to 6 carbon atoms, a cyano group and an amino group, $B^{11}$ may have a heteroatom in the main skeleton, $B^{12}$ represents a hydrogen atom or a linear, branched or cyclic alkyl group having 1 to 10 carbon atoms, and $B^{13}$ and $B^{14}$ each independently represent a hydrogen atom, a linear, branched or cyclic alkyl group having 1 to 10 carbon atoms.

Examples of linear, branched or cyclic divalent hydrocarbon groups having 1 to 20 carbon atoms of $B^{11}$ include the following formulas (B-1) to (B-21).

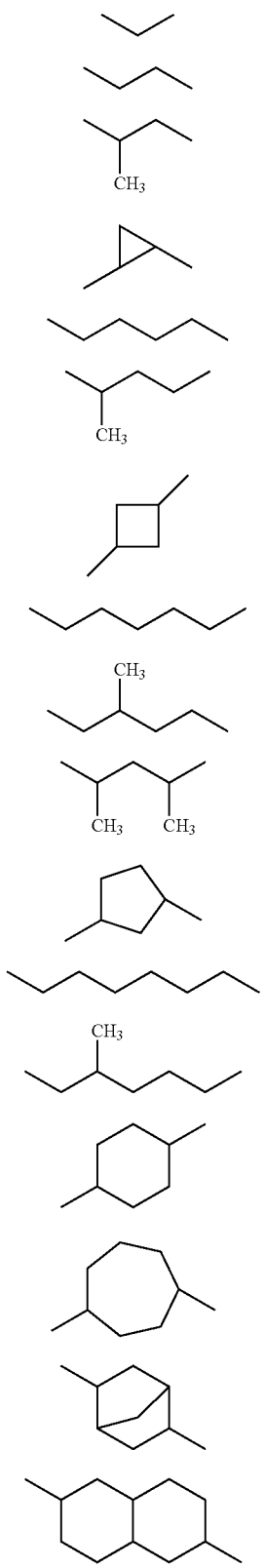

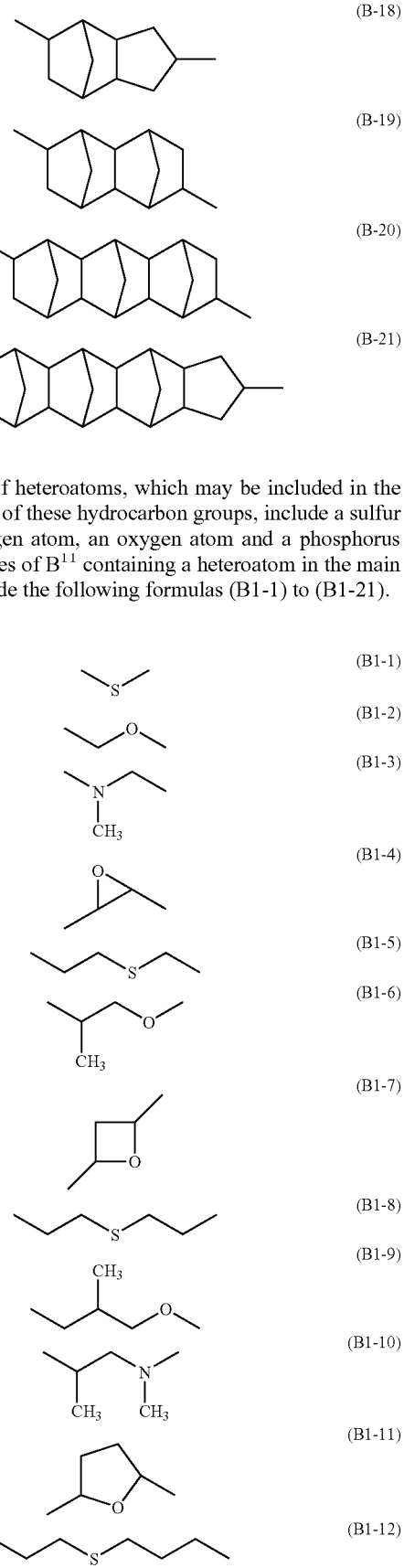

Examples of heteroatoms, which may be included in the main skeleton of these hydrocarbon groups, include a sulfur atom, a nitrogen atom, an oxygen atom and a phosphorus atom. Examples of $B^{11}$ containing a heteroatom in the main skeleton include the following formulas (B1-1) to (B1-21).

-continued

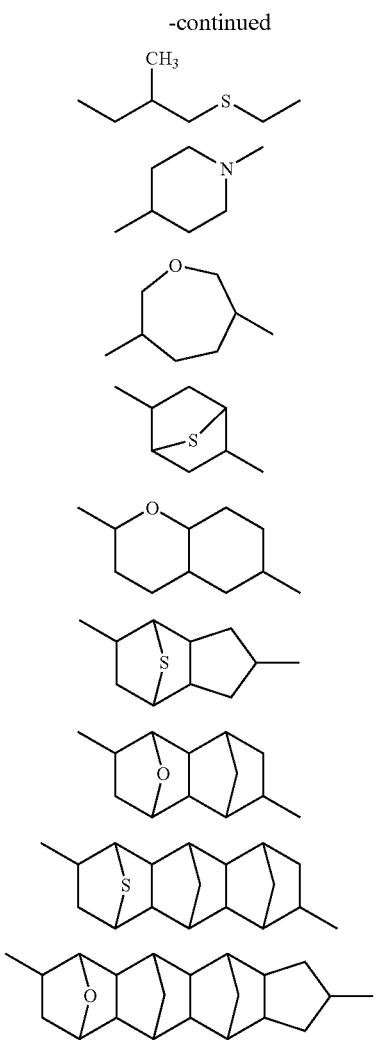

(B1-13)
(B1-14)
(B1-15)
(B1-16)
(B1-17)
(B1-18)
(B1-19)
(B1-20)
(B1-21)

Examples of linear, branched or cyclic alkyl groups having 1 to 10 carbon atoms of $B^{12}$, $B^{13}$ and $B^{14}$ include a methyl group, an ethyl group, a propyl group, an iso-propyl group, a butyl group, a t-butyl group, a pentyl group, a neo-pentyl group, an octyl group, a nonyl group, a decyl group, a cyclopentyl group and a cyclohexyl group.

Preferably, X is a single bond or —$B^{11}$—.

In formula (9), examples of substituents which J has include a linear, branched or cyclic alkyl group having 1 to 6 carbon atoms which may contain at least one group selected from the group consisting of a thiol group, a hydroxyl group, a carboxyl group, an acyl group having 1 to 6 carbon atoms, a carboxyl group esterified with alcohol having 1 to 6 carbon atoms, a carboxyl group thioesterified with thiol having 1 to 6 carbon atoms, a cyano group, an amino group, halogen and a nitroxy group, a thiol group, a hydroxyl group, a carboxyl group, an acyl group having 1 to 6 carbon atoms, an alkoxy group having 1 to 6 carbon atoms, a carboxyl group esterified with alcohol having 1 to 6 carbon atoms, a carboxyl group thioesterified with thiol having 1 to 6 carbon atoms, a cyano group, an amino group, halogen or a nitroxy group. Examples of heteroatoms contained in J include a sulfur atom, a nitrogen atom, an oxygen atom and a phosphorus atom. Herein, the number of the bonds in the heteroatom is different depending on the valence of the heteroatom.

J has the same basic structure as that of J in formula (1).

Specific examples of compounds represented by formula (9) include the following formulas (36-1) to (36-21). Of these, the following formulas (36-1) to (36-5) and the following formula (36-9) are preferred.

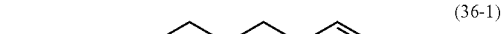

(36-1)

(36-2)

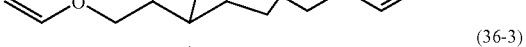

(36-3)

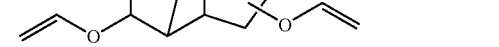

(36-4)

(36-5)

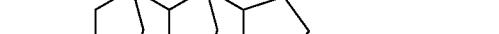

(36-6)

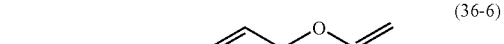

(36-7)

(36-8)

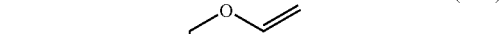

(36-9)

(36-10)

(36-11)

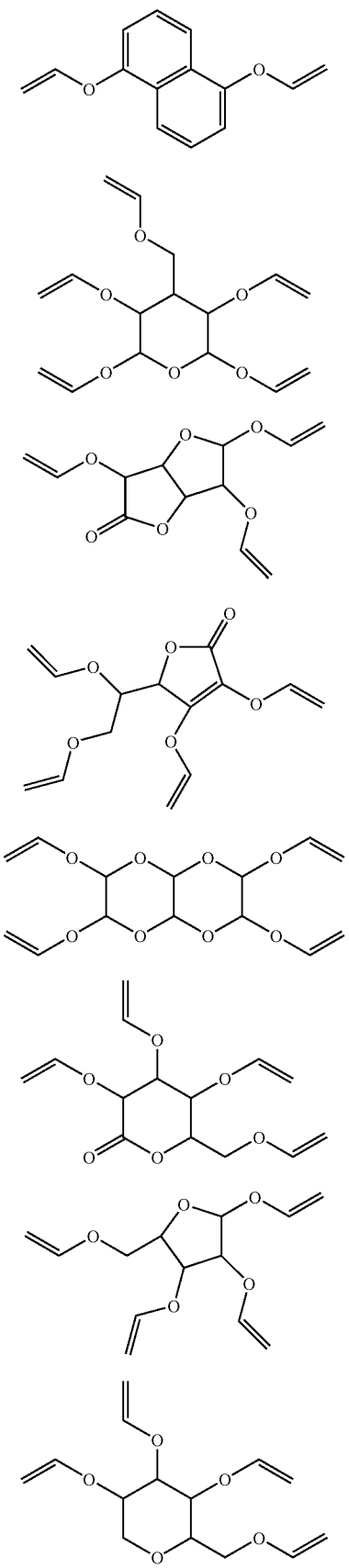

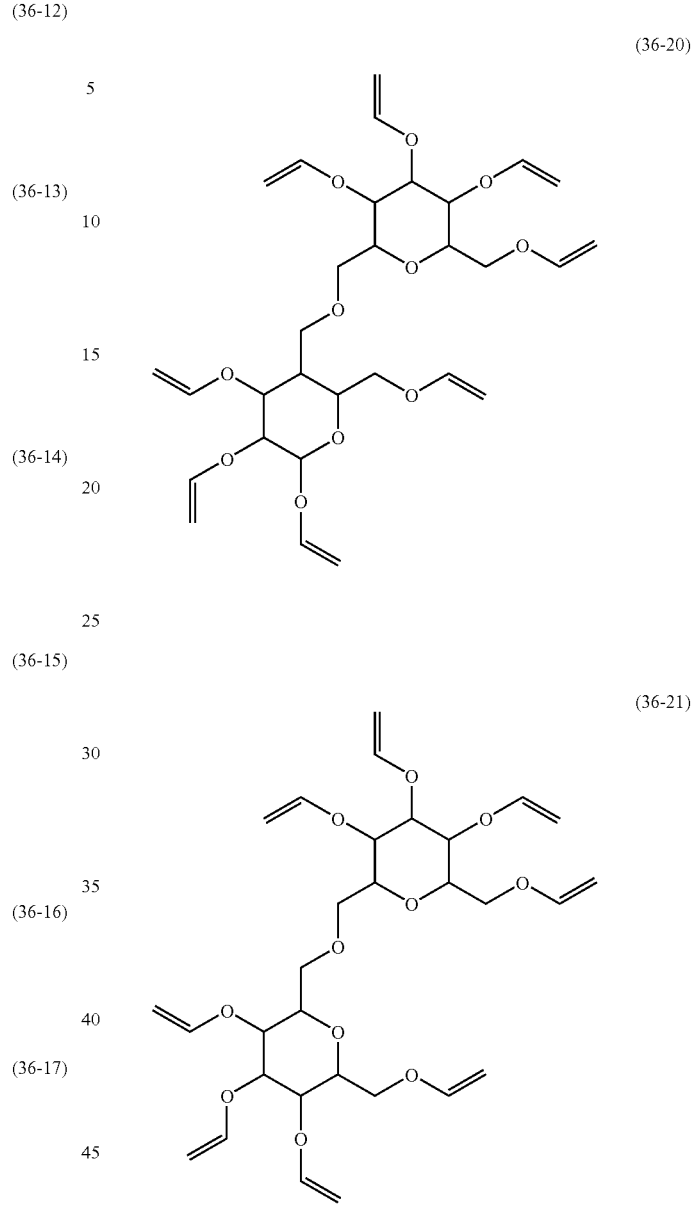

The reactive process of the polymer precursor (P) and the multifunctional vinyl ether compound represented by formula (9) is now described.

The reactive process of the polymer precursor (P) and the multifunctional vinyl ether compound represented by formula (9) is not particularly limited, and may be performed in the same manner as in known methods of reacting phenolic hydroxyl groups in poly-p-hydroxylstyrene with a vinyl ether compound. Examples of catalysts used in the reaction include organic acid such as p-toluenesulfonic acid, hydrates thereof, methanesulfonic acid, trifluoromethanesulfonic acid, camphorsulfonic acid, oxalic acid and 1,1,1-fluoroacetic acid; inorganic acid such as sulfuric acid and hydrochloric acid; and salts such as p-toluenesulfonic acid pyridinium salt, p-toluenesulfonic acid ammonium salt and p-toluenesulfonic acid 4-methylpyridinium salt.

Preferably, the reaction is performed in an organic solvent, which can dissolve both the polymer precursor (P) and the multifunctional vinyl ether compound represented by formula (9), such as 1,4-dioxane, PGMEA, ethyl acetate, MEK and γ-butyrolactone.

The reaction temperature is preferably 15 to 60° C., more preferably 20 to 50° C. The reaction time may be 0.1 to 24 hours, although preferred ranges of the reaction time vary depending on the kind of the multifunctional vinyl ether compound and the catalyst to be used, the reaction temperature and other factors. After completion of the reaction, the following post-treatment may be performed. The reaction mixture is neutralized by concentrated aqueous ammonia or triethylamine, and then to remove unreacted portions of the multifunctional vinyl ether compound and the catalyst remaining in the reaction solution, the mixture is added dropwise to a large amount of a poor solvent such as methanol or water to precipitate the polymer. The reprecipitation step may be unnecessary in some cases. Subsequently, the precipitate is filtrated and sufficiently dried to give a resist polymer of the present invention. The polymer may be used in the form of wet powder as is without drying after filtration.

The reaction solution may be used as a resist composition as is or after diluting with an appropriate solvent. In that case, an additive such as a storage stabilizer may be accordingly added.

The resist polymer containing an acid-decomposable unit having a structure represented by formula (1) as a structural unit can be produced by a method other than the two methods, and the method is not limited thereto.

The resist polymer of the present invention produced through the reaction has, for example, a structure schematically shown in the following formulas (37-1) to (37-9).

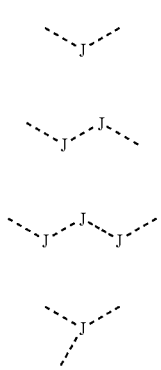

(37-1)

(37-2)

(37-3)

(37-4)

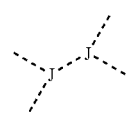

(37-5)

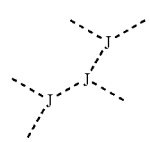

(37-6)

(37-7)

(37-8)

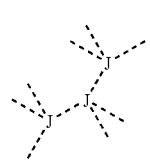

(37-9)

In formulas, chain lines indicate a chain of a polymer composed of a structural unit described below, and J represents J in formula (1). The number of dots in chain lines between J-J is irrelevant to the number of bonds (repeat number) of the structural unit of the polymer.

The mass average molecular weight of the resist polymer in the present invention is not particularly limited, but the resist polymer has a weight-average molecular weight of preferably 1,000 or more, more preferably 2,000 or more, and particularly preferably 4,000 or more in terms of dry-etching resistance and pattern shapes. The resist polymer in the present invention has a weight-average molecular weight of preferably 100,000 or less, more preferably 50,000 or less, and particularly preferably 30,000 or less in terms of the solubility in a resist solution and resolution.

The resist polymer containing an acid-decomposable unit having a structure represented by formula (2) as a structural unit can be produced by polymerizing a monomer including at least a monomer represented by the following formula (10).

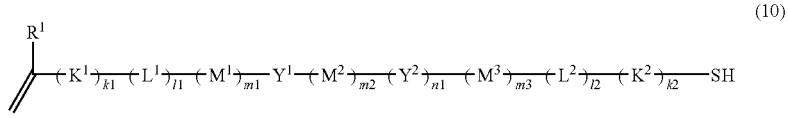

(10)

In formula (10), $R^1$ represents a hydrogen atom or a methyl group and S represents a sulfur atom. $K^1$, $K^2$, $L^1$, $L^2$, $M^1$, $M^2$, $M^3$, $Y^1$, $Y^2$, k1, k2, l1, l2, m1, m2, m3 and n1 are each the same as those in formula (1).

In formula (10), $K^1$ and $K^2$ are preferably alkylene or cycloalkylene, $L^1$ and $L^2$ are preferably —C(O)O— or —OC(O)—, and $M^1$, $M^2$ and $M^3$ are preferably alkylene, cycloalkylene or arylene.

In particular, (meth)acrylic ester represented by the following formula (38) is preferred since it has good copolymerizability with other acrylic monomers for a resist.

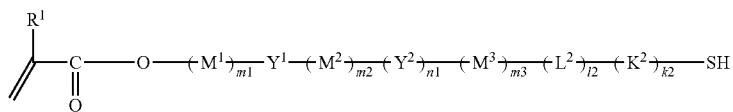

(38)

In formula (38), $K^2$, $L^2$, $M^1$, $M^2$, $M^3$, $Y^1$, $Y^2$, k2, l2, m1, m2, m3 and n1 are the same as those in formula (1).

Specific examples of monomers represented by formula (38) include monomers represented by the following formulas (39-1) to (39-24). In formula, R represents a hydrogen atom or a methyl group.

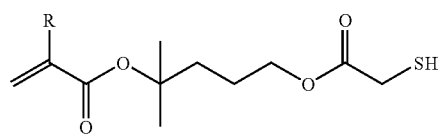

(39-1)

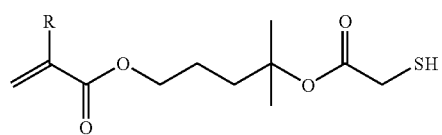

(39-2)

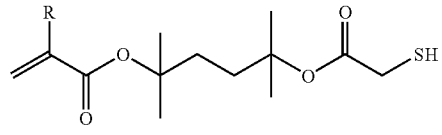

(39-3)

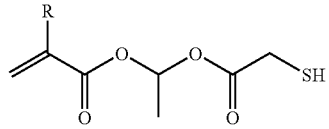

(39-4)

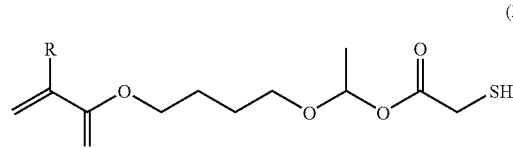

(39-5)

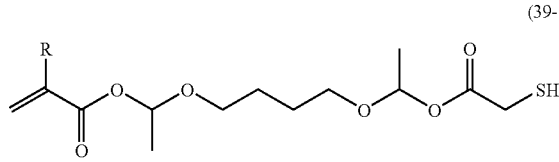

(39-6)

-continued

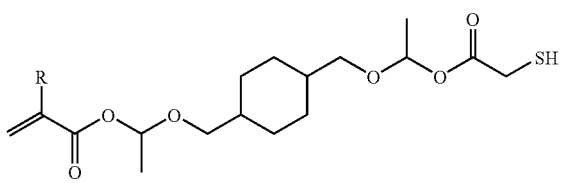

(39-7)

-continued

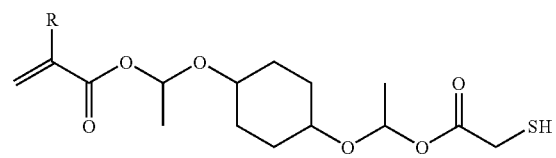

(39-8)

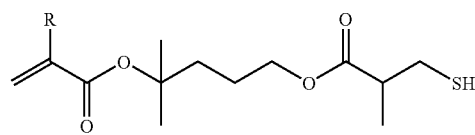

(39-9)

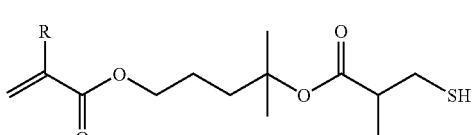

(39-10)

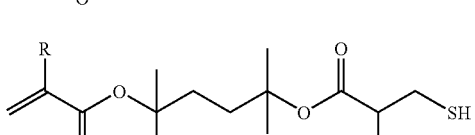

(39-11)

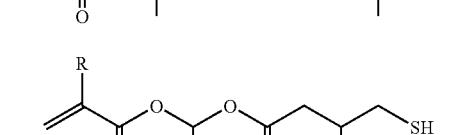

(39-12)

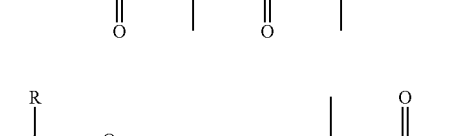

(39-13)

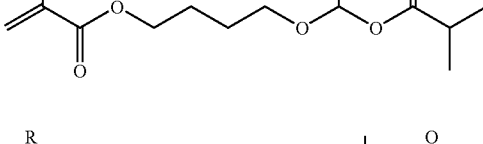

(39-14)

(39-15)
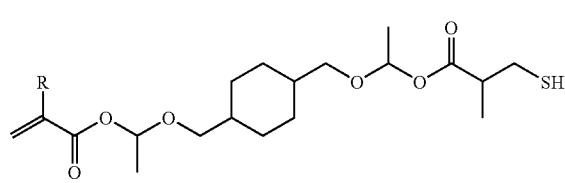

(39-16)
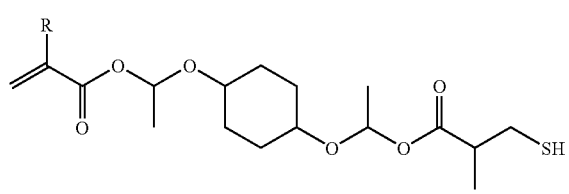

(39-17)
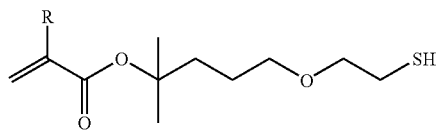

(39-18)
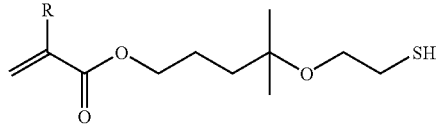

(39-19)
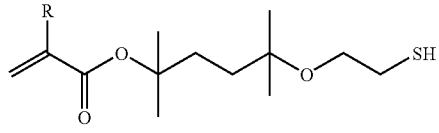

(39-20)
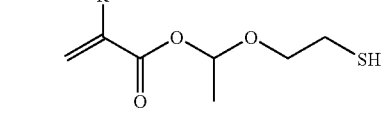

(39-21)
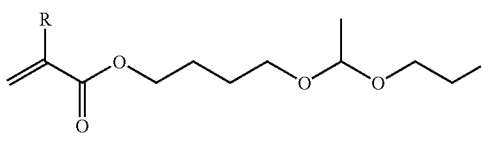

(39-22)
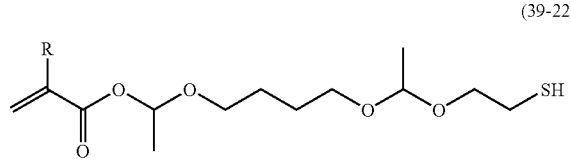

(39-23)
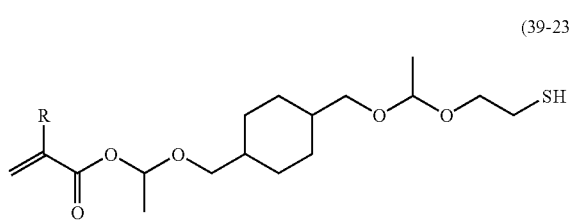

(39-24)
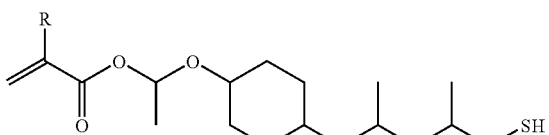

Of these, monomers represented by formulas (39-1), (39-5), (39-8), and (39-13) are preferred, and monomers represented by formula (39-1) are particularly preferred because they are highly acid-decomposable.

The mechanism of generation of the structure represented by formula (2) is now described. In the polymerization step, first radicals derived from a polymerization initiator or other components are produced in the reaction solution, and radicals initiate chain polymerization of monomers.

Such a radical is present at a growing end and removes a hydrogen atom from the vinyl group and —SH of (meth) acrylic ester represented by formula (38), and a polymer with a deactivated growing end is produced.

On the other hand, the vinyl group or —SH from which hydrogen is removed turns into a structure having a radical, specifically, a radical, and the radical again initiates chain polymerization of monomers. The structure represented by formula (2) is produced by this mechanism. The inclusion of the structure represented by formula (2) in the polymer can be observed from the change of —SH to —S— upon $^{33}$S-NMR measurement.

Of the (meth)acrylic esters represented by formula (38), methacrylic ester in which R in formula (39-1) is a methyl group can be synthesized in the following steps. Other (meth) acrylic esters represented by formula (38) can also be synthesized in similar steps.

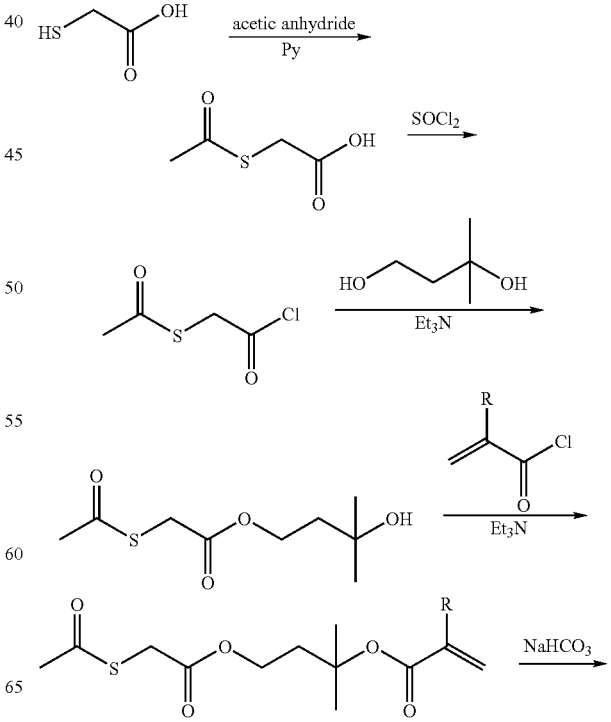

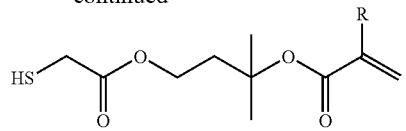

The method of producing the resist polymer containing an acid-decomposable unit having a structure represented by formula (2) as a structural unit is not limited to the method.

The acrylic resist polymer containing an acid-decomposable unit having a structure represented by formula (3) and a unit having a hydrophilic group as structural units can be produced by polymerizing at least a monomer represented by the following formula (11), a monomer represented by the following formula (12) and a monomer represented by the following formula (13).

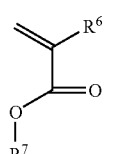
(11)

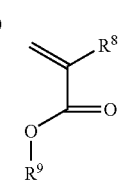
(12)

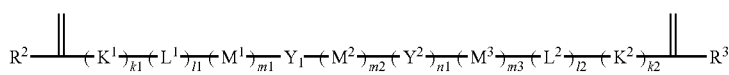
(13)

In formula (11), $R^6$ represents a hydrogen atom or a methyl group and $R^7$ represents a hydrogen atom, a linear or branched alkyl group having 1 to 6 carbon atoms, a cyclic hydrocarbon group having 4 to 8 carbon atoms, a crosslinked cyclic hydrocarbon group having 4 to 16 carbon atoms or a lactone group, and does not contain a hydrophilic group. Herein, the alkyl group, the cyclic hydrocarbon group, the crosslinked cyclic hydrocarbon group and the lactone group may have a substituent.

In formula (12), $R^8$ represents a hydrogen atom or a methyl group and $R^9$ represents a hydrogen atom, a linear or branched alkyl group having 1 to 6 carbon atoms, a cyclic hydrocarbon group having 4 to 8 carbon atoms, a crosslinked cyclic hydrocarbon group having 4 to 16 carbon atoms, and contains a hydrophilic group as a substituent.

In formula (13), $R^2$ and $R^3$ each independently represent a hydrogen atom or a methyl group. $K^1$, $K^2$, $L^1$, $L^2$, $M^1$, $M^2$, $M^3$, $Y^1$, $Y^2$, k1, k2, l1, l2, m1, m2, m3 and n1 are each the same as those in formula (1).

Preferred examples of monomers represented by formula (13) include monomers represented by the following formula (40).

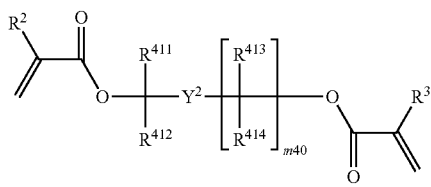
(40)

In formula (40), $R^2$ and $R^3$ are the same as those in formula (2), $R^{411}$ to $R^{414}$ each independently represent an alkyl group having 1 to 4 carbon atoms, and $Y^2$ represents an alkylene group, a cycloalkylene group or an arylene group. m40 represents the number of methylenes substituted with $R^{413}$ and $R^{414}$, and is 0 or 1.

Specific examples of monomers represented by formula (40) include monomers of the following formulas (40-1) and (40-2):

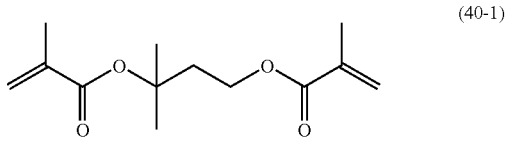
(40-1)

-continued
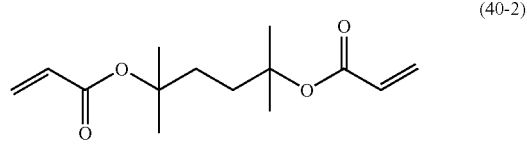
(40-2)

The ratio of crosslinked structural units in the polymer is preferably 0.1 to 10% by mole, more preferably 0.1 to 5% by mole based on the total of the monomer units. In the vicinity of this range, the higher the ratio, the more improved the tailing, and the lower the ratio, the more improved the solubility in a resist solvent.

2-methyl-2,4-butanediol dimethacrylate represented by the above formula (40-1) can be produced, for example, in a step represented by the following scheme:

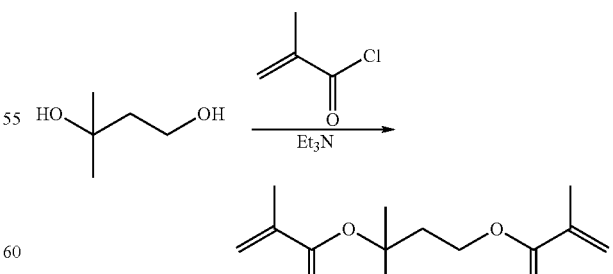

For 2-methyl-2,4-butanediol which is the raw material, a commercially available product may be used.

Esterification reaction of 2-methyl-2,4-butanediol readily proceeds by a known method. For example, reaction with methacrylic acid chloride may be performed in the presence of triethylamine. Preferably, the reaction is performed neat or in a polar solvent such as tetrahydrofuran.

In the present invention, the product from the above reaction may be used for polymerization reaction without purification, but is preferably purified by simple distillation, thin film distillation or column chromatography.

More preferred examples of monomers represented by formula (13) include monomers represented by the following formula (41).

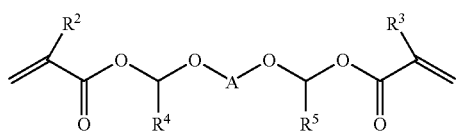
(41)

$R^2$ to $R^5$ and A in formula (41) are the same as those in formula (5).

Specific examples of monomers containing an acid-decomposable acetal group represented by formula (41) include monomers represented by formulas (41-1) to (41-17). However, monomers of formula (41), which can be used in the present invention, are not limited thereto.

(41-1)
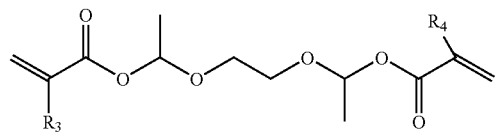

(41-2)
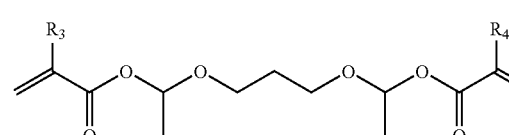

(41-3)
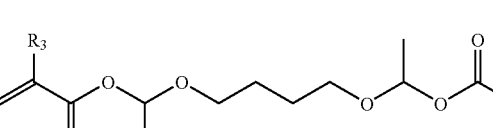

(41-4)
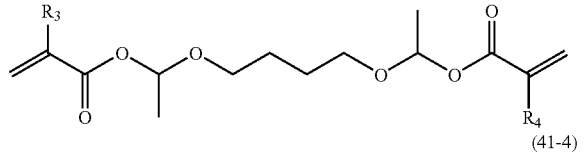

(41-5)
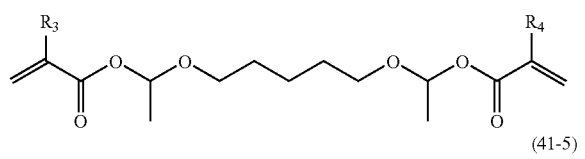

(41-6)
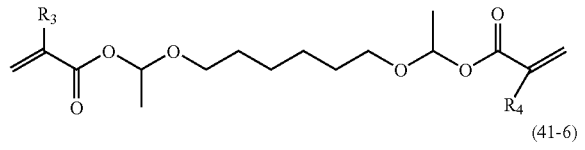

(41-7)
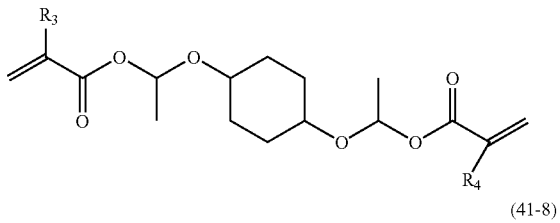

(41-8)

(41-9)
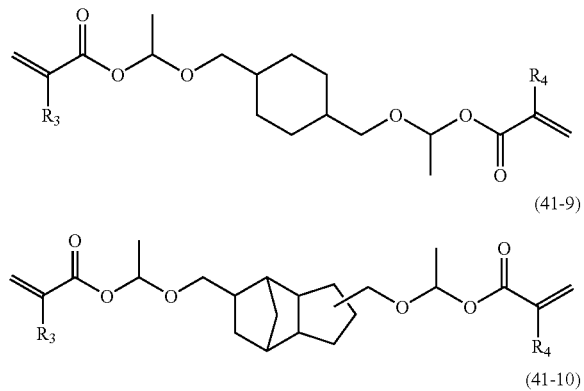

(41-10)

(41-11)

(41-12)
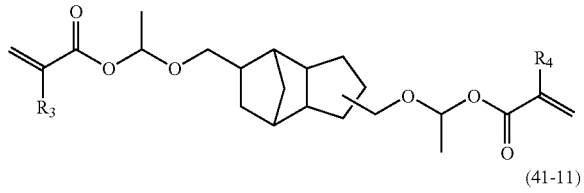

(41-13)
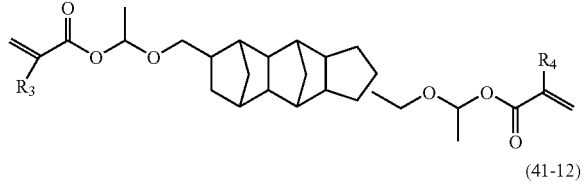

(41-14)
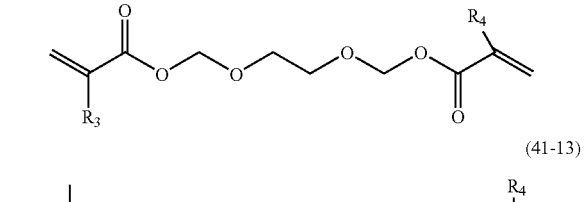

(41-15)
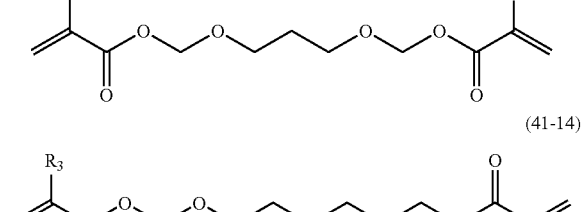

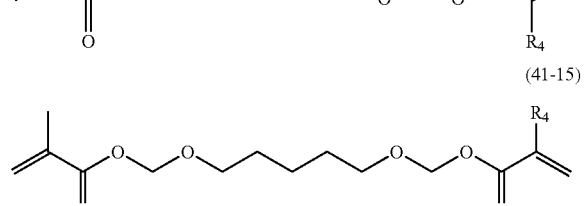

-continued (41-16)

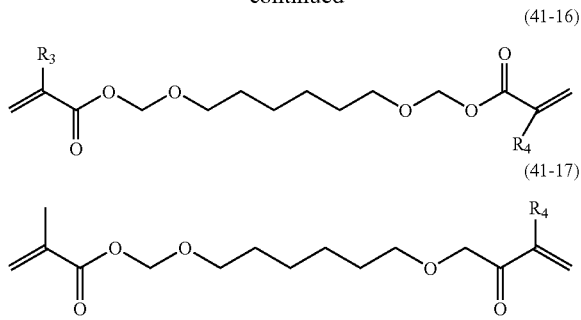

(41-17)

Synthetic examples of these compounds are shown below. For example, the compound represented by formula (41-3) can be synthesized according to any scheme of the following schemes 1 to 3.

Scheme 1

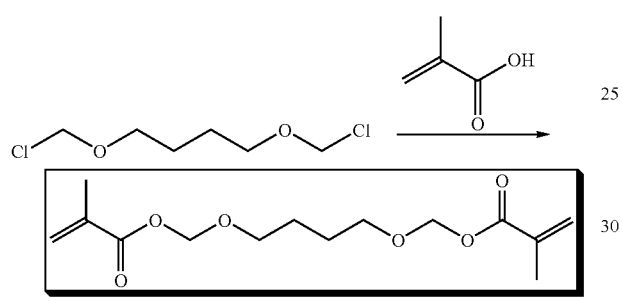

Scheme 2

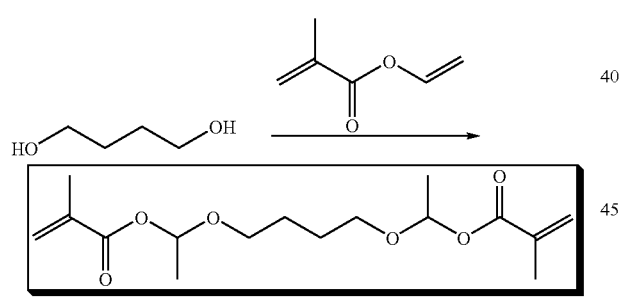

Scheme 3

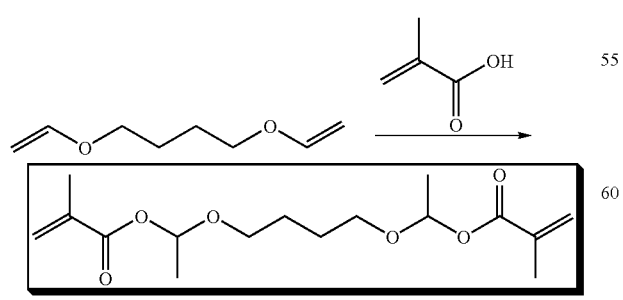

In scheme 1, a cross-linking agent having an intended acid-decomposable acetal structure can be obtained by acting (meth)acrylic acid on a dichloromethyl ether compound. Vinyl (meth)acrylate may be used in an amount of 1.0 to 10 times the amount of a diol compound on a molar basis. By performing reaction, for example, in the presence of alkali such as pyridine or trimethylamine, reaction products can be obtained in a short reaction time at high yield.

In scheme 2, a cross-linking agent having an intended acid-decomposable acetal structure can be obtained by acting a vinyl (meth)acrylate on a diol compound. Vinyl (meth)acrylate may be used in an amount of 1.0 to 10 times the amount of the diol compound on a molar basis. Performing the reaction in the presence of Lewis acid can shorten the reaction time.

In scheme 3, a cross-linking agent having an intended acid-decomposable acetal structure can be obtained by acting (meth)acrylic acid on divinyl ether. (Meth)acrylic acid may be used in an amount of 1.0 to 10 times the amount of divinyl ether on a molar basis. Performing the reaction in the presence of Lewis acid can shorten the reaction time.

Specific examples of monomers represented by the aforementioned formula (11) include monomers containing an acid-eliminable group of the following formulas (29A-1) to (29A-8).

(29A-1)

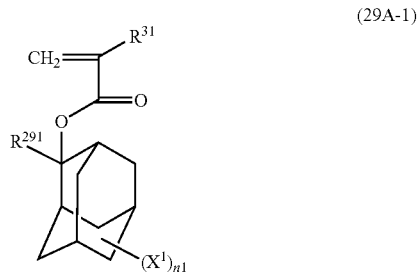

(29A-2)

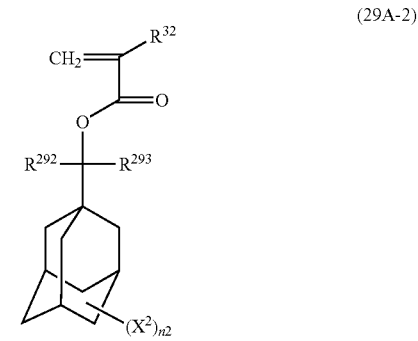

(29A-3)

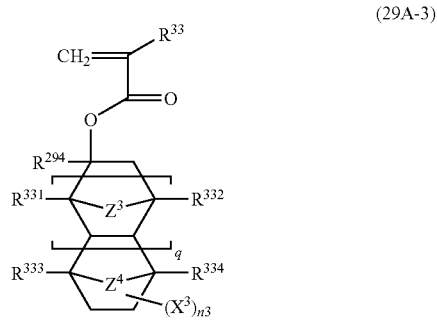

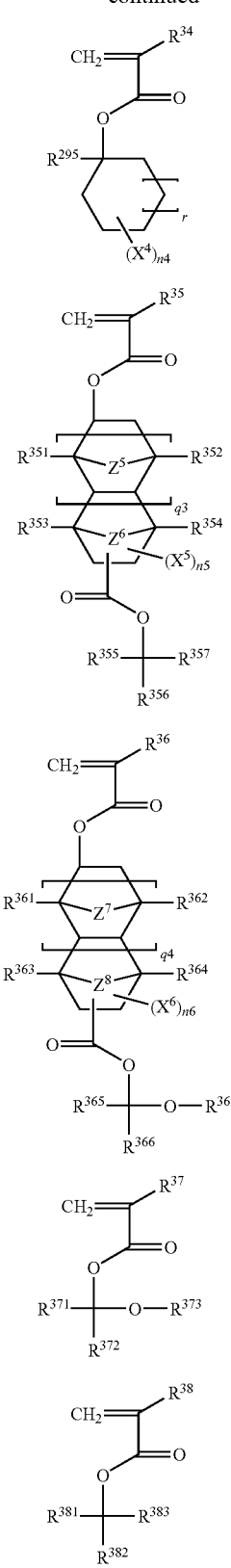

In formulas, $R^{31}$, $R^{32}$, $R^{33}$, $R^{34}$, $R^{35}$, $R^{36}$, $R^{37}$, $R^{38}$, $R^{291}$, $R^{292}$, $R^{293}$, $R^{294}$, $R^{295}$, $X^1$, $X^2$, $X^3$, $X^4$, $X^5$, $X^6$, n1, n2, n3, n4, n5, n6, $R^{331}$, $R^{332}$, $R^{333}$, $R^{334}$, $R^{351}$, $R^{352}$, $R^{353}$, $R^{354}$, $R^{355}$, $R^{356}$, $R^{357}$, $R^{361}$, $R^{362}$, $R^{363}$, $R^{364}$, $R^{365}$, $R^{366}$, $R^{367}$, $R^{371}$, $R^{372}$, $R^{373}$, $R^{381}$, $R^{382}$, $R^{383}$, $Z^3$, $Z^4$, $Z^5$, $Z^6$, $Z^7$ and $Z^8$ are the same as those in formulas (29-1) to (29-8).

Preferably, $R^{291}$ in formula (29A-1), $R^{292}$ and $R^{293}$ in formula (29A-2), $R^{294}$ in formula (29A-3) and $R^{295}$ in formula (29A-4) are a methyl group, an ethyl group or an isopropyl group in terms of sensitivity and resolution.

Preferably, n1, n2, n3, n4, n5 and n6 in formulas (29A-1) to (29A-6) are 0 because the dry-etching resistance is high. Preferably, $Z^3$ and $Z^4$ in formula (29A-3), $Z^5$ and $Z^6$ in formula (29A-5) and $Z^7$ and $Z^8$ in formula (29A-6) are each independently —$CH_2$— or —$CH_2CH_2$— because the dry-etching resistance is high.

Preferably, $R^{331}$, $R^{332}$, $R^{333}$ and $R^{334}$ in formula (29A-3), $R^{351}$, $R^{352}$, $R^{353}$ and $R^{354}$ in formula (29A-5) and $R^{361}$, $R^{362}$, $R^{363}$ and $R^{364}$ in formula (29A-6) are each independently a hydrogen atom, a methyl group, an ethyl group or an isopropyl group because the solubility in organic solvents is high.

Preferably, q in formula (29A-3), q3 in formula (29A-5) and q4 in formula (29A-6) are 1 so that the dry-etching resistance is high, while they are 0 so that the solubility in organic solvents is excellent.

Preferably, r in formula (29A-4) is 1 so that the dry-etching resistance is high, while it is 0 so that the solubility in an organic solvent is excellent.

Preferably, —$C(R^{355})(R^{356})(R^{357})$ in formula (29A-5) is a structure represented by the aforementioned formulas (K-1) to (K-6) so that the line edge roughness is excellent, while it is a structure represented by the aforementioned formulas (K-7) to (K-17) so that the dry-etching resistance is high.

Preferably, —$C(R^{365})(R^{366})$—O—$R^{367}$ in formula (29A-6) is a structure represented by the aforementioned formulas (J-1) to (J-24) so that the line edge roughness is excellent, while it is a structure represented by the aforementioned formulas (J-25) to (J-52) so that the dry-etching resistance is high.

Preferably, —$C(R^{371})(R^{372})$—O—$R^{373}$ in formula (29A-7) is a structure represented by the aforementioned formulas (J-1) to (J-24) so that the line edge roughness is excellent, while it is a structure represented by the aforementioned formulas (J-25) to (J-52) so that the dry-etching resistance is high.

The monomer containing an acid-eliminable group may be used alone or in combination of two or more according to need.

More specific examples of monomers containing an acid-eliminable group include monomers represented by the aforementioned formulas (30-1) to (30-196).

Of these, in terms of sensitivity and resolution, more preferred are monomers represented by the aforementioned formulas (30-1) to (30-3), formula (30-5), formula (30-16), formula (30-19), formula (30-20), formula (30-22), formula (30-23), formulas (30-25) to (30-28), formula (30-30), formula (30-31), formula (30-33), formula (30-34) and formulas (30-102) to (30-129) and geometric isomers and optical isomers thereof. Particularly preferred are monomers represented by the aforementioned formula (30-1), formula (30-2), formula (30-16), formula (30-20), formula (30-23), formula (30-28), formula (30-31), formula (30-34), formula (30-109), formula (30-111), formulas (30-114) to (30-117), formula (30-125), formula (30-128) and formula (30-129).

Monomers represented by the aforementioned formulas (30-35) to (30-40), monomers represented by the aforementioned formulas (30-52) to (30-62), monomers represented by the aforementioned formulas (30-76) to (30-88), monomers represented by formulas the aforementioned (30-130) to (30-135), monomers represented by the aforementioned formulas (30-147) to (30-157), monomers represented by the aforementioned formulas (30-171) to (30-183) and geometric isomers and optical isomers thereof are more preferred in view of excellent in the line edge roughness.

Monomers represented by the aforementioned formulas (30-41) to (30-51), monomers represented by the aforementioned formulas (30-63) to (30-75), monomers represented by the aforementioned formulas (30-89) to (30-101), monomers represented by the aforementioned formulas (30-136) to (30-146), monomers represented by the aforementioned formulas (30-158) to (30-170), monomers represented by the aforementioned formulas (30-184) to (30-196) and geometric isomers and optical isomers thereof are more preferred in view of excellent in the dry-etching resistance.

Specific examples of monomers represented by formula (11) include monomers containing a lactone skeleton of the following formulas (31A-1) to (31A-5):

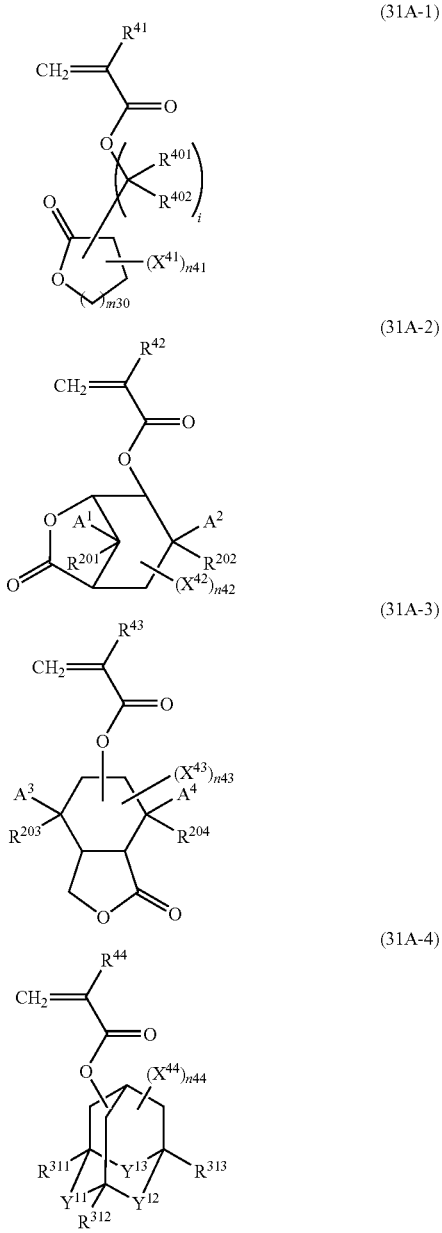

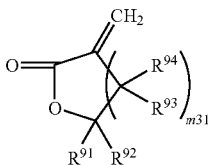

In formulas, $R^4, R^{42}, R^{43}, R^{44}, R^{311}, R^{312}, R^{313}, R^{401}, R^{402}, R^{201}, R^{202}, R^{203}, R^{204}, R^{91}, R^{92}, R^{93}, R^{94}, A^1, A^2, A^3, A^4, X^{41}, X^{42}, X^{43}, X^{44}$, n41, n42, n43, n44, $Y^{11}, Y^{12}, Y^{13}$, i, m30 and m31 are the same as those in the aforementioned formulas (31-1) to (31-5).

In these formulas, examples of linear or branched alkyl groups having 1 to 6 carbon atoms include a methyl group, an ethyl group, a n-propyl group, an isopropyl group, a n-butyl group, an isobutyl group, a t-butyl group, a n-pentyl group, a neo-pentyl group, a 1,1-dimethylpropyl group, a 1,2-dimethylpropyl group, a 1,1-dimethylbutyl group, a 2,2-dimethylbutyl group, a n-hexyl group, a 1-methylpentyl group, a 2-methylpentyl group and a 3-methylpentyl group.

Preferably, n41, n42, n43 and n44 in formulas (31A-1) to (31A-4) are 0 because the dry-etching resistance is high.

Preferably, m30 in formula (31A-1) is 1 in terms of sensitivity and resolution.

Preferably, $A^1$ and $A^2$ in formula (31A-2) and $A^3$ and $A^4$ in formula (31A-3) jointly form —$CH_2$— or —$CH_2CH_2$— so that the dry-etching resistance is high, while they jointly form —O— so that the solubility in organic solvents is high.

Preferably, $R^{201}$ and $R^{202}$ in formula (31A-2) and $R^{203}$ and $R^{204}$ in formula (31A-3) are each independently a hydrogen atom, a methyl group, an ethyl group or an isopropyl group so that the solubility in organic solvents is high.

Preferably, $R^{311}$, $R^{312}$ and $R^{313}$ in formula (31A-4) are a hydrogen atom so that the solubility in organic solvents is high.

Preferably, one of $Y^{11}, Y^{12}$ and $Y^{13}$ in formula (31A-4) is —CO—O— and the other two are —$CH_2$— so that the adhesiveness to the substrate surface is high.

Preferably, $R^{91}$, $R^{92}$, $R^{93}$ and $R^{94}$ in formula (31A-5) are each independently a hydrogen atom or a methyl group so that the solubility in organic solvents is high.

Preferably, m31 in formula (31A-5) is 1 in terms of sensitivity and resolution.

The monomer containing a lactone skeleton may be used alone or in combination of two or more.

More specific examples of monomers containing a lactone skeleton include monomers represented by the aforementioned formulas (32-1) to (32-24).

Of these, in terms of sensitivity, monomers represented by the aforementioned formulas (32-1) to (32-3) and formula (32-5) and geometric isomers and optical isomers thereof are more preferred. In terms of dry-etching resistance, monomers represented by the aforementioned formulas (32-7), (32-9), (32-10), (32-12), (32-14) and (32-24) to (32-26) and geometric isomers and optical isomers thereof are more preferred. In terms of the solubility in resist solvents, monomers represented by the aforementioned formulas (32-8), (32-13) and (32-16) to (32-23) and geometric isomers and optical isomers thereof are more preferred.

Specific examples of monomers represented by the aforementioned formula (11) include monomers containing a nonpolar alicyclic skeleton of the following formulas (33A-1) to (33A-4):

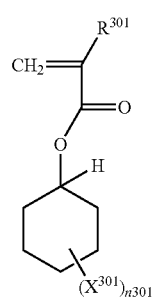
(33A-1)

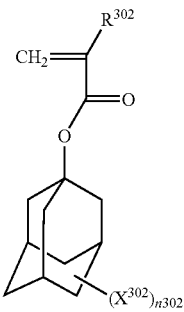
(33A-2)

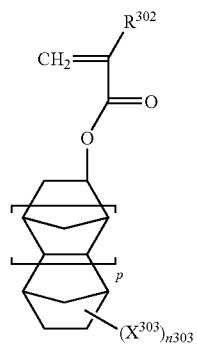
(33A-3)

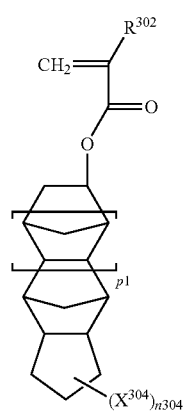
(33A-4)

In formulas, $R^{301}$, $R^{302}$, $R^{303}$, $R^{304}$, $X^{301}$, $X^{302}$, $X^{303}$, $X^{304}$, n301, n302, n303, n304, p and p1 are the same as those in the aforementioned formulas (33-1) to (33-4).

In formula (33A-1) to (33A-4), $X^{301}$, $X^{302}$, $X^{303}$ and $X^{304}$ may be bonded to any position in the cyclic structure.

Preferably, n301, n302, n303 and n304 in formulas (33A-1) to (33A-4) are 0 so that the dry-etching resistance is high.

Preferably, p in formula (33A-3) and p1 in formula (33A-4) are 0 so that the solubility in organic solvents is high, while they are 1 so that the dry-etching resistance is high.

To introduce such a structural unit into a polymer, a monomer containing a non-polar alicyclic skeleton may be copolymerized. The monomer containing a non-polar alicyclic skeleton may be used alone or in combination of two or more according to need.

Preferred examples of monomers containing a non-polar alicyclic skeleton include cyclohexyl (meth)acrylate, isobornyl (meth)acrylate, norbornyl (meth)acrylate, adamantyl (meth)acrylate, tricyclodecanyl (meth)acrylate, dicyclopentadienyl (meth)acrylate and derivatives which have a linear or branched alkyl group having 1 to 6 carbon atoms on the alicyclic skeleton of these compounds.

Specific examples of monomers containing a non-polar alicyclic skeleton include monomers represented by the aforementioned formulas (34-1) to (34-5).

Preferably, specific examples of monomers represented by the aforementioned formula (12) are at least one monomer selected from the group consisting of the following formulas (26A-1) to (26A-7):

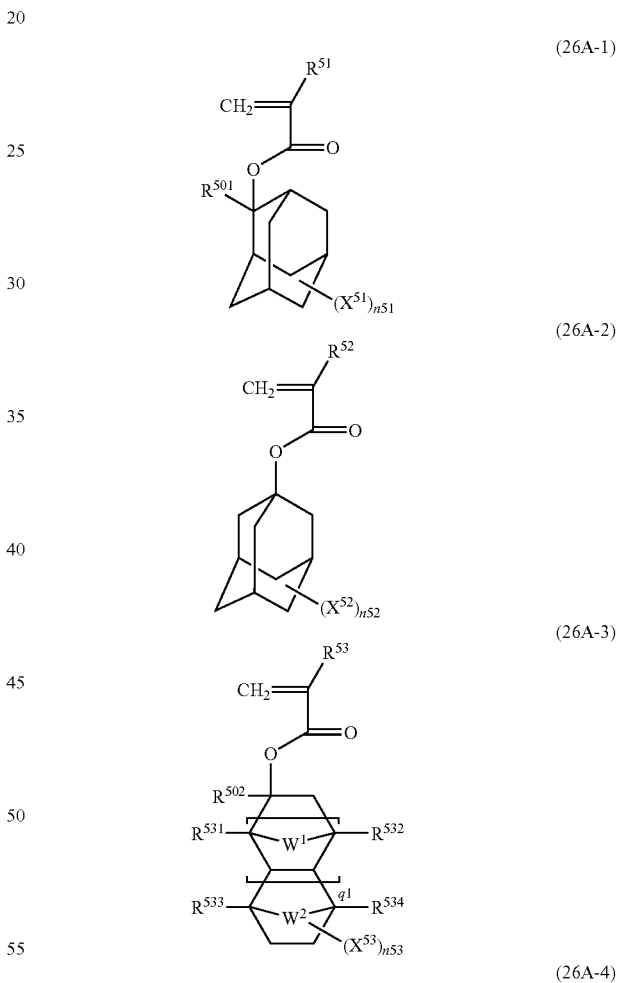

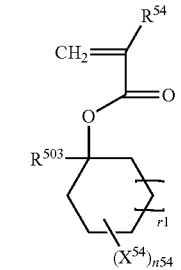

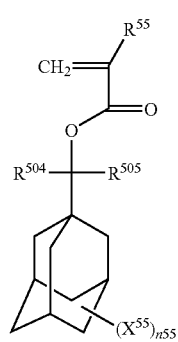 (26A-5)

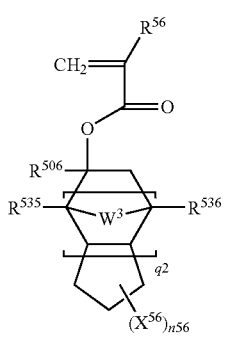 (26A-6)

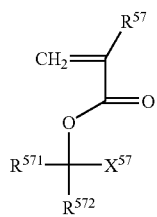 (26A-7)

In formulas, $R^{51}$, $R^{52}$, $R^{53}$, $R^{54}$, $R^{55}$, $R^{56}$, $R^{57}$, $R^{501}$, $R^{502}$, $R^{503}$, $R^{504}$, $R^{505}$, $R^{506}$, $R^{531}$, $R^{532}$, $R^{533}$, $R^{534}$, $R^{535}$, $R^{536}$, $R^{571}$, $R^{572}$, $W^1$, $W^2$, $W^3$, $X^{51}$, $X^{52}$, $X^{53}$, $X^{54}$, $X^{55}$, $X^{56}$, $X^{57}$, n51, n52, n53, n54, n55, n56, q1 and q2 are the same as those in the aforementioned formulas (26-1) to (26-7).

Preferably, $R^{501}$ in formula (26A-1), $R^{502}$ in formula (26A-3), $R^{503}$ in formula (26A-4) and $R^{506}$ in formula (26A-6) are a methyl group, an ethyl group or an isopropyl group in terms of sensitivity and resolution, while they are a hydrogen atom so that the solubility in organic solvents is high.

Preferably, n51, n52, n53, n54, n55 and n56 in formulas (26A-1) to (26A-6) are 1 so that the dry-etching resistance is high.

Preferably, $X^{51}$, $X^{52}$, $X^{53}$, $X^{54}$, $X^{55}$ and $X^{56}$ in formulas (26A-1) to (26A-6) are —C(CF$_3$)$_2$—OH, a hydroxyl group, a cyano group or a methoxy group so that excellent pattern shapes can be obtained. Preferably, $X^{57}$ in formula (26A-7) is —CH$_2$—C(CF$_3$)$_2$—OH, a —CH$_2$—OH group, a —CH$_2$—CN group, a —CH$_2$—O—CH$_3$ group, a —(CH$_2$)$_2$—O—CH$_3$ group so that excellent pattern shapes can be obtained.

Preferably, $W^1$ and $W^2$ in formula (26A-3) and $W^3$ in formula (26A-6) are —CH$_2$— or —CH$_2$CH$_2$— so that the dry-etching resistance is high.

Preferably, $R^{531}$, $R^{532}$, $R^{533}$ and $R^{534}$ in formula (26A-3) and $R^{535}$ and $R^{536}$ in formula (26A-6) are each independently a hydrogen atom, a methyl group, an ethyl group or an isopropyl group so that the solubility in organic solvents is high.

Preferably, q1 in formula (26A-3) and q2 in formula (26A-6) are 1 so that the dry-etching resistance is high, while they are 0 so that the solubility in organic solvents is excellent.

Preferably, r1 in formula (26A-4) is 1 so that the dry-etching resistance is high, while it is 0 so that the solubility in organic solvents is excellent.

Preferably, $R^{504}$ and $R^{505}$ in formula (26A-5) are each independently a methyl group, an ethyl group or an isopropyl group in terms of sensitivity and resolution.

Preferably, $R^{571}$ and $R^{572}$ in formula (26A-7) jointly form a structure of a crosslinked cyclic hydrocarbon group having 4 to 16 carbon atoms with carbon atoms bonded to each of $R^{571}$ and $R^{572}$ so that the dry-etching resistance is high. Further, in terms of excellent heat resistance and stability, the ring contained in a crosslinked cyclic hydrocarbon group jointly formed by $R^{571}$ and $R^{572}$ with carbon atoms bonded to each of $R^{571}$ and $R^{572}$ is preferably a camphor ring, an adamantane ring, a norbornane ring, a pinane ring, a bicyclo[2.2.2]octane ring, a tetracyclododecane ring, a tricyclodecane ring or a decahydronaphthalene ring.

In formulas (26A-1) to (26A-6), any position in the cyclic structure may be substituted with $X^{51}$, $X^{52}$, $X^{53}$, $X^{54}$, $X^{55}$ or $X^{56}$.

The structural unit containing a hydrophilic group may be used alone or in combination of two or more.

More specific examples of monomers represented by formula (12) include monomers represented by the aforementioned formulas (27-1) to (27-103).

Of these, in terms of excelling in the solubility in resist solvents, preferred are monomers represented by the aforementioned formulas (27-1) to (27-4), formulas (27-9) to (27-13), formulas (27-21) to (27-24), formulas (27-33) to (27-36), formulas (27-42) to (27-46), formulas (27-53) to (27-59), formulas (27-78) and (27-79), formulas (27-82) and (27-83), formulas (27-88) and (27-89), formulas (27-94) to (27-97), formula (27-100) and geometric isomers and optical isomers thereof. Further, because the dry-etching resistance is high, monomers represented by formulas (27-37) to (2742), formulas (27-60) to (27-77), formulas (27-84) and (27-85), formulas (27-90) and (27-91), formula (27-99), formulas (27-101) to (27-103) and geometric isomers and optical isomers thereof are more preferred. Further, in terms of sensitivity and resolution, monomers represented by the aforementioned formulas (27-5) to (27-8), formulas (27-17) to (27-20), formulas (27-29) to (27-32), formulas (2749) to (27-52), formulas (27-62) and (27-63), formulas (27-68) and (27-69), formulas (27-74) and (27-75), formulas (27-80) and (27-81), formulas (27-86) and (27-87), formulas (27-92) and (27-93), and geometric isomers and optical isomers thereof are more preferred.

Next, the resist composition of the present invention is now explained.

The resist composition of the present invention is obtained by dissolving the resist polymer of the present invention in a solvent. The chemically amplified resist composition of the present invention is obtained by dissolving the resist polymer of the present invention and a photo acid generator in a solvent. The resist polymer of the present invention may be used alone or in combination of two or more. A polymer solution prepared by solution polymerization or the like may be directly used as a resist composition without separating a polymer from the polymer solution, or the polymer solution is diluted with an appropriate solvent or concentrated and used as a resist composition.

Examples of solvents include linear or branched ketones such as methyl ethyl ketone, methyl isobutyl ketone, 2-pentanone and 2-hexanone; cyclic ketones such as cyclopentanone and cyclohexanone; propylene glycol monoalkyl acetates such as propylene glycol monomethyl ether acetate and propylene glycol monoethyl ether acetate; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; ethylene glycol monoalkyl ethers such as ethylene glycol monomethyl ether and ethylene glycol monoethyl ether; diethylene glycol alkyl ethers such as diethylene glycol dimethyl ether and diethylene glycol monomethyl ether; esters such as ethyl acetate and ethyl lactate; alcohols such as n-propyl alcohol, isopropyl alcohol, n-butyl alcohol, cyclohexanol and 1-octanol; 1,4-dioxane, ethylene carbonate and γ-butyrolactone. These solvents may be used alone or in combination of two or more.

The content of the solvent is generally 200 to 5000 parts by mass, preferably 300 to 2000 parts by mass based on 100 parts by mass of the resist polymer (polymer of the present invention).

When using the resist polymer of the present invention for a chemically amplified resist, a photo acid generator needs to be used.

The photo acid generator contained in the chemically amplified resist composition of the present invention may be optionally selected from those usable as an acid generator for a chemically amplified resist composition. The photo acid generator may be used alone or in combination of two or more.

Examples of such photo acid generators include onium salt compounds, sulfonimide compounds, sulfone compounds, sulfonate compounds, quinonediazido compounds and diazomethane compounds. In particular, onium salt compounds such as sulfonium salts, iodonium salts, phosphonium salts, diazonium salts and pyridinium salts are preferred as photo acid generators. Specific examples thereof include triphenylsulfonium triflate, triphenylsulfonium hexafluoroantimonate, triphenylsulfonium naphthalenesulfonate, (hydroxylphenyl) benzylmethylsulfonium toluenesulfonate, diphenyliodonium triflate, diphenyliodonium pyrene sulfonate, diphenyliodonium dodecylbenzene sulfonate, diphenyliodonium hexafluoro antimonate, p-methylphenyldiphenylsulfonium nonafluorobutanesulfonate and tri(tert-butylphenyl)sulfonium trifluoromethanesulfonate.

The content of the photo acid generator is accordingly determined based on the kind of the photo acid generator selected. The content is generally 0.1 parts by mass or more, more preferably 0.5 parts by mass or more based on 100 parts by mass of the resist polymer (polymer of the present invention). When the content of the photo acid generator is in this range, chemical reaction due to catalysis of acid generated upon exposure occurs sufficiently. The content of the photo acid generator is generally 20 parts by mass or less, preferably 10 parts by mass or less based on 100 parts by mass of the resist polymer (polymer of the present invention). When the content of the photo acid generator is in this range, the resist composition becomes more stable, and uneven coating upon coating of the composition or generation of scum upon development is sufficiently reduced.

A nitrogen-containing compound may be further added to the chemically amplified resist composition of the present invention. By adding a nitrogen-containing compound, shapes of resist patterns and post exposure stability over time are further improved. Specifically, the resist pattern almost has a rectangular cross section; and while it may happen that a resist film is subjected to exposure and post exposure bake (PEB) and left for several hours before the subsequent development step in mass production line of semiconductors, deterioration of the cross sectional shape of the resist pattern can be prevented even when the resist film is left in that way (even when the time has passed).

While any known nitrogen-containing compound may be used, amines are preferred. In particular, secondary lower aliphatic amines and tertiary lower aliphatic amines are more preferred.

Herein, "lower aliphatic amine" means alkylamine or alkyl alcohol amine having 5 or less carbon atoms.

Examples of secondary lower aliphatic amines and tertiary lower aliphatic amines include trimethylamine, diethylamine, triethylamine, di-n-propylamine, tri-n-propyl amine, tripentylamine, diethanolamine and triethanolamine. Of these, tertiary alkanolamines such as triethanolamine are preferred as a nitrogen-containing compound.

The nitrogen-containing compound may be used alone or in combination of two or more.

The content of the nitrogen-containing compound determined based on the kind of the nitrogen-containing compound selected, and is generally preferably 0.01 parts by mass or more based on 100 parts by mass of the resist polymer (polymer of the present invention). By setting the content of the nitrogen-containing compound at this range, it is possible to make the shape of the resist pattern more rectangular. The content of the nitrogen-containing compound is generally preferably 2 parts by mass or less based on 100 parts by mass of the resist polymer (polymer of the present invention). By setting the content of the nitrogen-containing compound at this range, decrease in sensitivity can be kept small.

Further, organic carboxylic acid, phosphorus oxo acid or a derivative thereof may be added to the chemically amplified resist composition of the present invention. By adding these compounds, decrease in sensitivity due to addition of a nitrogen-containing compound can be prevented, and shapes of resist patterns and post exposure stability over time are further improved.

Preferred examples of organic carboxylic acid include malonic acid, citric acid, malic acid, succinic acid, benzoic acid and salicylic acid.

Examples of phosphorus oxo acid and derivatives thereof include phosphoric acid and derivatives, e.g., esters thereof, such as phosphoric acid, phosphoric acid di-n-butyl ester and phosphoric acid diphenyl ester; phosphonic acid and derivatives, e.g., esters thereof, such as phosphonic acid, phosphonic acid dimethyl ester, phosphonic acid di-n-butyl ester, phenylphosphonic acid, phosphonic acid diphenyl ester and phosphonic acid dibenzyl ester; and phosphinic acid and derivatives, e.g., esters thereof, such as phosphinic acid and phenylphosphinic acid. Of these, phosphonic acid is preferred.

These compounds (organic carboxylic acid, phosphorus oxo acid or derivatives thereof) may be used alone or in combination of two or more.

The content of these compounds (organic carboxylic acid, phosphorus oxo acid or derivatives thereof) is accordingly determined based on the kind of the compound selected, and is generally preferably 0.01 parts by mass or more based on 100 parts by mass of the resist polymer (polymer of the present invention). By setting the content of these compounds at this range, it is possible to make the shape of the resist pattern more rectangular. The content of these compounds (organic carboxylic acid, phosphorus oxo acid or derivatives thereof) is generally preferably 5 parts by mass or less based on 100 parts by mass of the resist polymer (polymer of the present invention). By setting the content of these compounds at this range, decrease in film thickness in resist patterns can be kept small.

Both the nitrogen-containing compound and the organic carboxylic acid, phosphorus oxo acid or a derivative thereof or either of them may be added to the chemically amplified resist composition of the present invention.

Further, various additives such as surfactants, other quenchers, sensitizers, antihalation agents, storage stabilizer and defoaming agents may be added to the resist composition of the present invention according to need. Any additive known in the art may be used. The amount of these additives may be accordingly determined without particularly limitation.

The resist polymer of the present invention may be used as a resist composition for metal etching, photofabrication, plate making, holograms, color filters or retardation films.

An example of patterning process of the present invention is now described.

First, the resist composition of the present invention is applied on the surface of a substrate to be processed on which a pattern is formed, such as a silicon wafer, by spin coating or the like. The substrate to be processed on which the resist composition has been applied is dried by baking (prebake) or other methods to form a resist film on the substrate.

Then, the resist film thus formed is irradiated with light having a wavelength of 250 nm or less through a photomask (exposure). Preferably, light used for exposure includes KrF excimer laser, ArF excimer laser or $F_2$ excimer laser. In particular, ArF excimer laser is preferred. In addition, exposure with electron beam is also preferred.

After exposure, heat treatment is accordingly performed (post exposure bake, PEB), and the substrate is immersed in an alkaline developer to remove exposed portions by dissolving in the developer (development). Any known alkaline developer may be used. After development, the substrate is accordingly rinsed with pure water or the like. A resist pattern is formed on the substrate to be processed in this manner.

Generally, the substrate to be processed on which a resist pattern is formed is accordingly subjected to heat treatment (post-bake) to reinforce the resist, and portions without the resist are selectively etched. After etching, the resist is generally removed using a release agent.

Lastly, a compound represented by the following formula (6), which is a raw material for producing the resist polymer of the present invention, is described.

In formula (7), S represents a sulfur atom; and $K^1$, $K^2$, $L^1$, $L^2$, $M^1$, $M^2$, $M^3$, $Y^1$, $Y^2$, k1, k2, l1, l2, m1, m2, m3 and n1 are each the same as those in formula (1).

The compound represented by formula (7) is obtained by the following methods (a) to (c).

(a) Method comprising subjecting to addition of a compound represented by the following formula (15) to a compound represented by the following formula (14) to convert into a compound represented by the following formula (16) and then subjecting the same to dithiolation

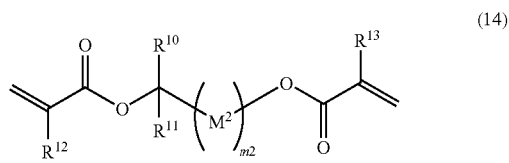

(14)

(15)

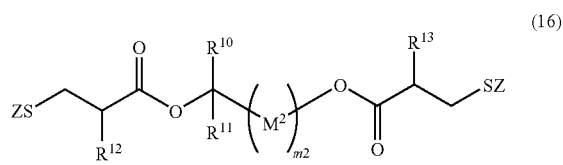

(16)

In formulas (14) and (16), $M^2$ represents alkylene, cycloalkylene, oxyalkylene or arylene; m2 represents 0 or 1, $R^{10}$ and $R^{11}$ each independently represent a linear, branched or cyclic alkyl group or alkenyl group having 1 to 18 carbon atoms or an aryl group; $R^{12}$ and $R^{13}$ each independently represent a hydrogen atom or a methyl group. In formulas (15) and (16), S represents a sulfur atom and Z represents an acyl group or alkali metal.

(b) Method comprising subjecting to dithiolation a compound of the following formula (19) obtained by coupling a diol compound represented by the following formula (17) with carboxylic acid chloride containing a sulfur atom represented by the following formula (18)

(6)

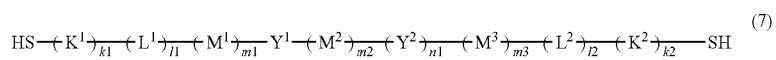

In formula (6), $E^1$ represents a functional group having polymerization termination ability or chain transfer ability; and J, $K^1$, $K^2$, $L^1$, $L^2$, $M^1$, $M^2$, $M^3$, $Y^1$, $Y^2$, k1, k2, l1, l2, m1, m2, m3, n1 and n are each the same as those in formula (1).

In particular, when n=2 and $E^1$ is a thiol group in formula (6), formula (6) is a structure represented by the following formula (7). When polymerization is performed using this compound, a resist polymer having a structure represented by the aforementioned formula (4) can be produced.

(17)

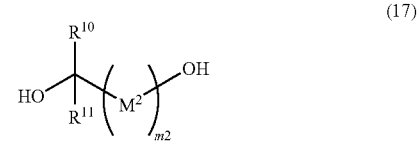

(7)

$$HS\text{---}(K^1)_{k1}^n(L^1)_{l1}^n(M^1)_{m1}^n Y^1\text{---}(M^2)_{m2}^n(Y^2)_{n1}^n(M^3)_{m3}^n(L^2)_{l2}^n(K^2)_{k2}^n\text{---}SH$$

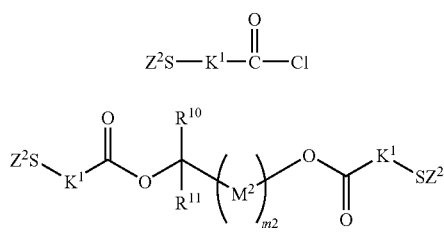

In formulas (17) and (19), $M^2$ represents alkylene, cycloalkylene, oxyalkylene or arylene, m2 represents 0 or 1, and $R^{10}$ and $R^{11}$ each independently represent a linear, branched or cyclic alkyl group or alkenyl group having 1 to 18 carbon atoms or an aryl group. In formula (18), Cl represents a chlorine atom. In formulas (18) and (19), S represents a sulfur atom, $Z^2$ represents an acyl group and $K^1$ represents at least one member of the group consisting of alkylene, cycloalkylene, oxyalkylene, arylene, a divalent thiazoline ring, a divalent oxazoline ring and a divalent imidazoline ring.

(c) Method comprising subjecting to dithiolation a compound of the following formula (22) obtained by adding carboxylic acid containing a sulfur atom represented by the following formula (21) to divinyl ether represented by the following formula (20)

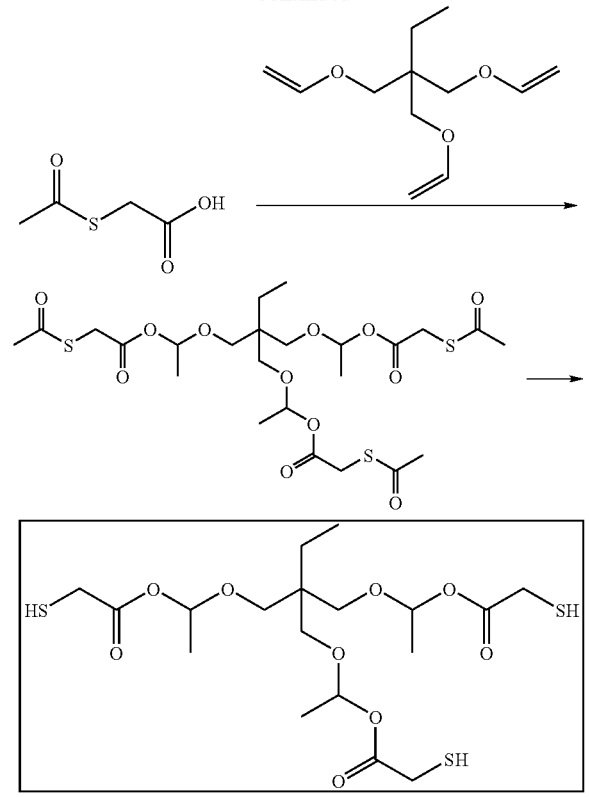

In formulas (20) and (22), $M^2$ represents alkylene, cycloalkylene, oxyalkylene or arylene, and m2 represents 0 or 1. In formulas (21) and (22), S represents a sulfur atom, $Z^2$ represents an acyl group and $K^1$ represents at least one member of the group consisting of alkylene, cycloalkylene, oxyalkylene, arylene, a divalent thiazoline ring, a divalent oxazoline ring and a divalent imidazoline ring.

Of the compounds represented by the above formula (6), compounds represented by the aforementioned formula (35-23), for example, can be each synthesized according to the following scheme:

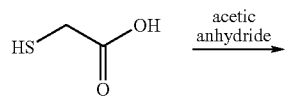

A method of producing the compound represented by formula (7) is now described.

(a) Method of Producing a Compound of Formula (7) Comprising Adding a Compound Represented by Formula (15) to a Compound Represented by the Aforementioned Formula (14) to Convert the Compound Represented by the Aforementioned Formula (14) to a Compound Represented by the Aforementioned Formula (16) and then Subjecting the Same to Dithiolation Examples of compounds represented by the aforementioned formula (14) include the following. In formulas, $R^{10}$, $R^{11}$, $R^{14}$ and $R^{15}$ each independently represent a linear, branched or cyclic alkyl group or alkenyl group having 1 to 18 carbon atoms or an aryl group; and $R^{12}$ and $R^{13}$ each independently represent a hydrogen atom or a methyl group.

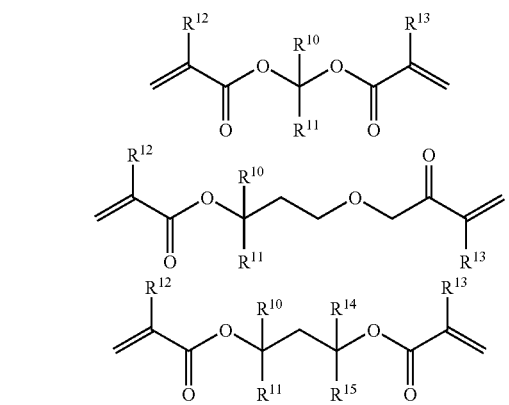

-continued

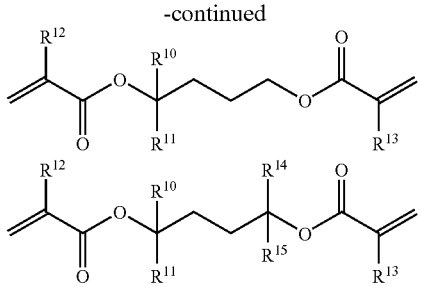

Specific examples of $R^{10}$, $R^{11}$, $R^{14}$ and $R^{15}$ include a methyl group, an ethyl group, a propyl group, a pentyl group, an octyl group and an isopropyl group. In terms of acid-decomposability, a methyl group and an ethyl group are preferred. Particularly, compounds in which $R^{10}$, $R^{11}$, $R^{14}$ and $R^{15}$ are all a methyl group are preferred.

Examples of compounds containing a sulfur atom represented by the aforementioned formula (15) include hydrogen sulfide, NaSH, KSH and the following compounds.

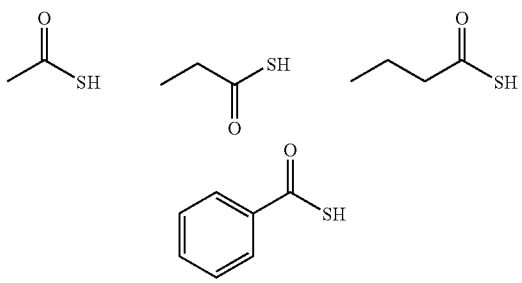

In the production method of the present invention, first a compound represented by formula (15) is subjected to addition to a compound represented by formula (14) to give a compound represented by formula (16). In this addition step, the compound represented by formula (15) is generally added to the compound represented by formula (14) in an amount of preferably 2 to 6 times the amount of the compound represented by formula (14) on a molar basis. While the reaction proceeds even at room temperature, the higher the reaction temperature, the faster the reaction. The reaction temperature in such cases is preferably −30 to 100° C. The reaction may be performed in a solvent or neat.

Then, by subjecting the compound represented by formula (16) to dithiolation, a chain transfer agent of formula (7) is obtained. The dithiolation step is performed in the presence of an aqueous alkaline solution. Examples of aqueous alkaline solutions include an aqueous sodium hydroxide solution, an aqueous potassium hydroxide solution, an aqueous potassium carbonate solution, an aqueous sodium carbonate solution, an aqueous sodium hydrogen carbonate solution, an aqueous potassium hydrogen carbonate solution and an aqueous ammonia solution. To prevent decomposition of an ester bond in formula (16) and eliminate Z alone, weak base such as an aqueous sodium hydrogen carbonate solution, an aqueous potassium hydrogen carbonate solution and an aqueous ammonia solution is preferred. By adding an organic solvent such as methanol to the reaction solution, the reaction system becomes homogeneous and the reaction proceeds faster. Generally, the reaction temperature is preferably −30° C. to 80° C. By setting the reaction temperature at −30° C. or higher, dithiolation can be facilitated. By setting the reaction temperature at 80° C. or lower, hydrolysis of ester moieties is prevented and thus intended compounds can be produced at high yield. Desirably, the resulting reaction product is purified by extraction, distillation, column chromatography or recrystallization.

(b) Method of Producing a Compound of the Above Formula (7) Comprising Subjecting to Dithiolation a Compound of the Aforementioned Formula (19) Obtained by Coupling a Diol Compound Represented by the Aforementioned Formula (17) with Carboxylic Acid Chloride Containing a Sulfur Atom Represented by the Aforementioned Formula (18)

In this method, first a diol compound represented by the aforementioned formula (17) is bonded with carboxylic acid chloride represented by the aforementioned formula (18) by coupling. Examples of diol compounds represented by the aforementioned formula (17) include the following. In formula, $R^{10}$, $R^{11}$, $R^{14}$ and $R^{15}$ each independently represent a linear, branched or cyclic alkyl group or alkenyl group having 1 to 18 carbon atoms or an aryl group. Particularly, compounds in which $R^{10}$, $R^{11}$, $R^{14}$ and $R^{15}$ are a methyl group are preferred.

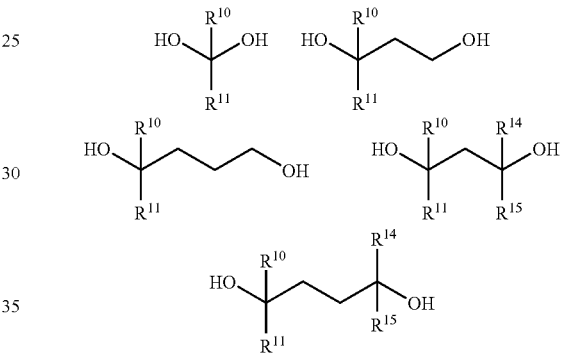

Examples of carboxylic acid chloride represented by the aforementioned formula (18) include the following.

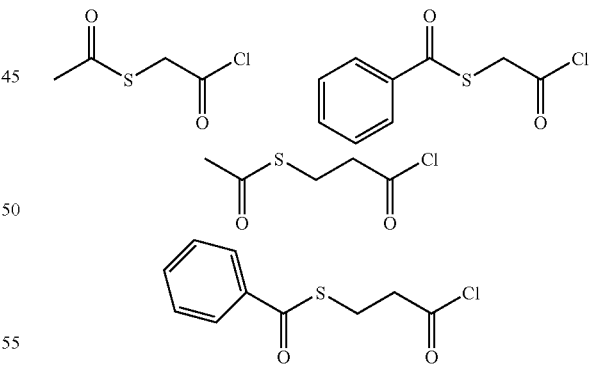

For coupling the diol compound of the aforementioned formula (17) with the carboxylic acid chloride of the aforementioned formula (18), reaction is generally performed in the presence of alkali. Examples of alkali include sodium hydrogen carbonate, pyridine, triethylamine and dimethylaminopyridine. Preferably, carboxylic acid chloride of formula (18) and alkali are each added to the diol compound of formula (17) in an amount of 2 to 30 times the amount of the diol compound of formula (17) on a molar basis. When the amount is twice or more on a molar basis, the reaction time can be shortened, and when the amount is 30 times or less on a molar basis, by-product is hardly produced and thus the yield can be improved.

While the reaction proceeds even at room temperature, the higher the reaction temperature, the faster the reaction. The reaction temperature in such cases is preferably −50° C. to 80° C. When the reaction temperature is −50° C. or higher, the reaction time can be shortened, and when the reaction temperature is 80° C. or lower, by-product is hardly produced and thus the yield can be improved. The reaction may be performed in a solvent or neat.

By coupling the diol compound of the aforementioned formula (17) with the carboxylic acid chloride of the aforementioned formula (18), a compound represented by the aforementioned formula (19) can be produced. Then, by subjecting the compound represented by formula (19) to dithiolation, a chain transfer agent of formula (7) is obtained. The dithiolation step is performed in the same manner as in the case of the compound represented by the aforementioned formula (16).

(c) Method of Producing a Compound of the Above Formula (7) Comprising Subjecting to Dithiolation a Compound of the Aforementioned Formula (22) Obtained by Adding Carboxylic Acid Containing a Sulfur Atom Represented by the Aforementioned Formula (21) to Divinyl Ether Represented by the Aforementioned Formula (20)

In this method, first carboxylic acid represented by the aforementioned formula (21) is subjected to addition to divinyl ether represented by the aforementioned formula (20). Examples of divinyl ether represented by the aforementioned formula (20) include the following.

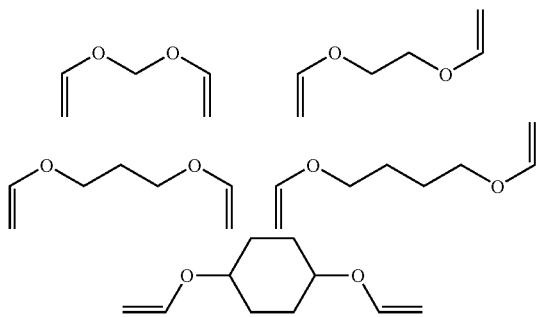

Examples of carboxylic acid represented by the aforementioned formula (21) include the following.

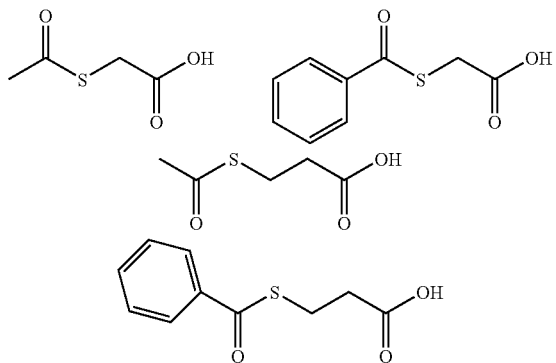

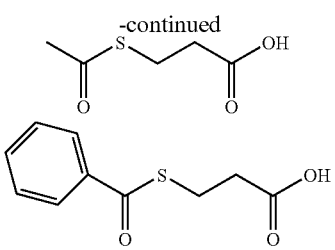

In the step of addition of carboxylic acid represented by the aforementioned formula (21) to divinyl ether represented by the aforementioned formula (20), preferably carboxylic acid is allowed to react with divinyl ether in an amount of 2 to 8 times the amount of divinyl ether on a molar basis. When the amount of carboxylic acid is twice or more on a molar basis, the reaction completely proceeds. While the reaction proceeds even at room temperature, the higher the reaction temperature, the faster the reaction, and the compound represented by formula (22) can be produced. The reaction temperature in such cases is preferably −30° C. to 100° C. When the reaction temperature is −30° C. or more, the reaction time can be shortened and when the reaction temperature is 100° C. or lower, the reaction proceeds efficiently. The reaction may be performed in a solvent or neat. By adding carboxylic acid represented by the aforementioned formula (21) to divinyl ether represented by the aforementioned formula (20), a compound represented by formula (22) can be obtained. Then, by subjecting the compound represented by formula (22) to dithiolation, a chain transfer agent of formula (7) is obtained. The dithiolation step is performed in the same manner as in the case of the compound represented by the aforementioned formula (16).

EXAMPLES

In the following, the present invention is described in detail by means of Examples, but the present invention is not limited thereto. "Part(s)" in Examples and Comparative Examples mean "part(s) by mass" unless otherwise specified.

In Examples and Comparative Examples, the resist polymer and the resist composition were evaluated by the following methods:

1. Evaluation of Resist Polymer
<Weight-Average Molecular Weight of Resist Polymer>

About 20 mg of a resist polymer was dissolved in 5 mL of THF, and the mixture was filtrated through a 0.5 μm membrane filter to prepare a sample solution. The sample solution was subjected to measurement using gel permeation chromatography (GPC) available from TOSOH CORPORATION. In the measurement, three of Shodex GPC K-805L (product name) available from SHOWA DENKO K.K. connected in series were used as separation columns. The measurement was performed in THF as a solvent at a flow rate of 1.0 mL/min at 40° C. in an injection volume of 0.1 mL using a differential refractometer as a detector and polystyrene as a standard polymer.

<Average Chemical Composition Ratio (% by Mole) of Resist Polymer>

The average chemical composition ratio was determined according to $^1$H-NMR measurement. The measurement was performed using GSX-400 FT-NMR (product name) made by JEOL Ltd. A solution containing about 5% by mass of a resist polymer sample in chloroform deuteride, acetone deuteride, or dimethyl sulfoxide deuteride was placed in a test tube with a diameter of 5 mmϕ, and subjected to measurement at a measurement temperature of 40° C. and an observation frequency of 400 MHz in a single pulse mode in an integration of 64 times.

2. Evaluation of Resist Composition

A resist composition was prepared in the following manner using the resist polymer, and a resist pattern was formed to evaluate properties.

<Preparation of Resist Composition>

100 parts of the resist polymer produced, 2 parts of triphenylsulfonium triflate, which is a photo acid generator, and 700 parts of PGMEA, which is a solvent, were mixed to prepare a homogeneous solution. A resist composition solution was prepared by filtrating the homogeneous solution through a membrane filter with a pore size of 0.1 μm.

<Formation of Resist Pattern>

The resist composition solution prepared was spin-coated on a silicon wafer (diameter: 200 mm) and pre-baked using a hot plate at 120° C. for 60 seconds to form a resist film having a film thickness of 0.4 μm. Subsequently, exposure was performed using an ArF excimer laser exposure machine (wavelength: 193 nm) and a mask, and then post exposure bake was performed using a hot plate at 120° C. for 60 seconds. A resist pattern was formed by developing the resist using a 2.38% by mass tetramethylammonium hydroxide aqueous solution at room temperature, washing with pure water and drying.

<Sensitivity>

A light exposure (mJ/cm$^2$) at which a line and space pattern of 0.16 μm of a mask was printed on a resist in a line width of 0.16 μm was measured and defined as sensitivity.

<Resolution>

The minimum dimension (μm) of a resist pattern projected onto a resist when exposure was performed at the aforementioned light exposure was defined as resolution.

<Line Edge Roughness>

The distance from the standard line where the pattern edge is to be located was measured at 50 points in the longitudinal direction in a 5 μm area from an edge portion of a resist pattern of 0.20 μm obtained by the minimum light exposure which reproduces a resist pattern of 0.20 μm of a mask using a field emission scanning electron microscope JSM-6340F (product name) made by JEOL Ltd. The standard deviation was determined and 3σ was calculated, and this was defined as a line edge roughness index. The results show that the smaller the value, the better the line edge roughness.

<Tailing>

The vertical cross-section of the 0.20 μm resist pattern was observed by a field emission scanning electron microscope JSM-6340F (product name) made by JEOL Ltd. at a magnification of 30,000. Patterns which had no tailing on the side near the substrate were evaluated as "◯" and those with tailing were evaluated as "x".

<Amount of Defect>

The number of defects in a resist pattern upon development was counted by using a surface defect inspection tool KLA2132 (product name) made by KLA-Tencor Corporation.

<Collapse of Resist Pattern>

Resist patterns without pattern collapse were evaluated as "⊚", those with a few collapses were evaluated as "◯", and those with many collapses were evaluated as "x".

Example 1

A flask equipped with a nitrogen inlet, a stirrer, a condenser and a thermometer was charged with 34.9 parts of PGMEA under nitrogen atmosphere, and the temperature of a water bath was increased to 80° C. with stirring.

A monomer solution obtained by mixing 13.3 parts of α-methacryloyloxy-γ-butyrolactone (hereinafter GBLMA) represented by the following formula (101), 19.2 parts of 2-methacryloyloxy-2-methyladamantyl (hereinafter, MAdMA) represented by the following formula (102), 9.4 parts of 1-methacryloyloxy-3-hydroxyladamantyl (hereinafter, HAdMA) represented by the following formula (103), 0.20 part (0.4% by mole based on the monomers) of a chain transfer agent (hereinafter CTA-1) represented by formula (35-3), 62.8 parts of PGMEA and 1.31 parts of 2,2'-azobisisobutyronitrile (hereinafter AIBN) was added dropwise to the flask from a dropping device at a constant rate over 6 hours.

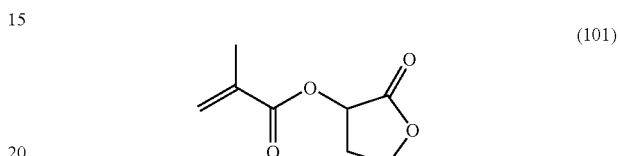

(101)

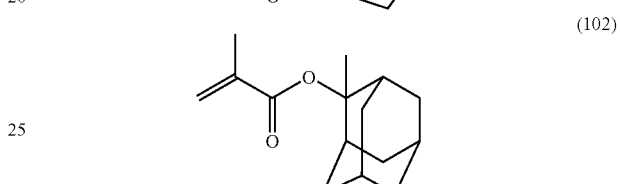

(102)

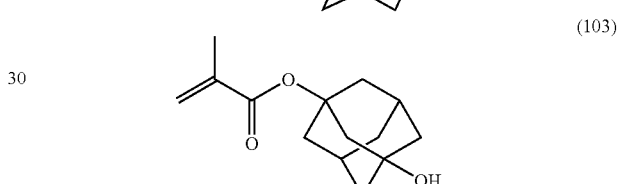

(103)

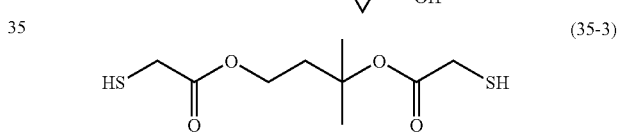

(35-3)

The temperature was then kept at 80° C. for an hour. The resulting reaction solution was then added dropwise to about 10 times volume of methanol with stirring to give a white precipitate (polymer A-1). The resulting precipitate was filtrated and dried at 60° C. for about 40 hours under reduced pressure. The inclusion of the structure derived from the chain transfer agent (CTA-1) of formula (35-3) in the polymer A-1 was observed from the change of —SH to —S— in $^{33}$S-NMR measurement. In short, the polymer A-1 obtained contains the structure of formula (104). The results of measurement of physical properties of the polymer are shown in Table 1.

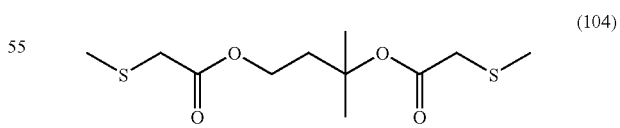

(104)

Example 2

The same flask as in Example 1 was charged with 31.2 parts of PGMEA under nitrogen atmosphere, and the temperature of the water bath was increased to 80° C. with stirring.

A monomer solution obtained by mixing 13.6 parts of GBLMA, 15.7 parts of 2-ethylcyclohexyl methacrylate (hereinafter ECHMA) represented by the following formula (105), 8.2 parts of a mixture of 2-cyano-5-norbornyl methacrylate and 3-cyano-5-norbornyl methacrylate (hereinafter CNNMA) represented by the following formula (106), 1.42 parts (2.2% by mole based on the monomers) of a chain transfer agent (hereinafter CTA-2) represented by formula (35-25), 56.2 parts of PGMEA and 1.84 parts of dimethyl-2,2'-azobisisobutyrate was added dropwise to the flask from a dropping device at a constant rate over 6 hours.

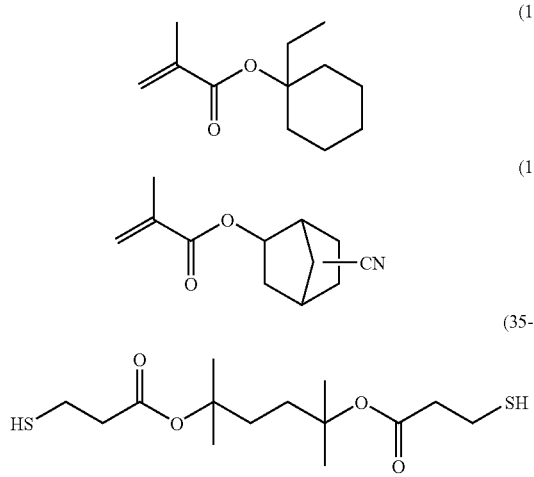

The temperature was then kept at 80° C. for an hour. The resulting reaction solution was then added dropwise to about 10 times volume of methanol with stirring to give a white precipitate (polymer A-2). The resulting precipitate was filtrated and dried at 60° C. for about 40 hours under reduced pressure. The inclusion of the structure of formula (107) derived from the chain transfer agent (CTA-2) of formula (35-25) in the polymer A-2 was observed in the same manner as in Example 1. The results of measurement of physical properties of the polymer are shown in Table 1.

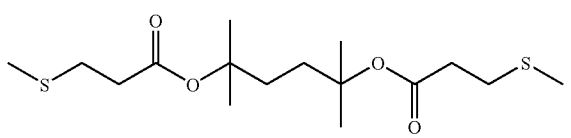

Example 3

The same flask as in Example 1 was charged with 31.2 parts of PGMEA under nitrogen atmosphere, and the temperature of the water bath was increased to 80° C. with stirring.

A monomer solution obtained by mixing 13.6 parts of a mixture of 8-acryloyloxy-4-oxatricyclo[5.2.1.0$^{2,6}$]decan-3-one and 9-acryloyloxy-4-oxatricyclo[5.2.1.0$^{2,6}$]decan-3-one (hereinafter OTDA) represented by the following formula (108), 15.7 parts of ECHMA, 8.2 parts of 1-acryloyloxy-3-hydroxyladamantyl (hereinafter HAdA) represented by the following formula (109), 1.42 parts (1.3% by mole based on the monomers) of a chain transfer agent (hereinafter CTA-3) represented by formula (110), 56.2 parts of PGMEA and 1.84 parts of AIBN was added dropwise to the flask from a dropping device at a constant rate over 6 hours.

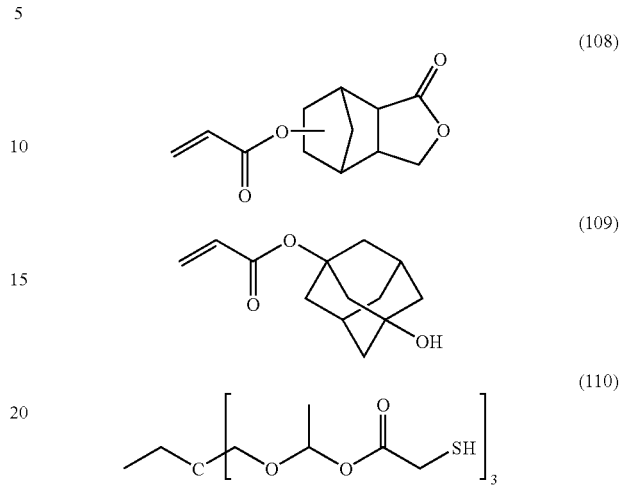

The temperature was then kept at 80° C. for an hour. The resulting reaction solution was then added dropwise to about 10 times volume of methanol with stirring to give a white precipitate (polymer A-3). The resulting precipitate was filtrated and dried at 60° C. for about 40 hours under reduced pressure. The inclusion of the structure derived from the chain transfer agent (CTA-3) of formula (110) in the polymer was observed in the same manner as in Example 1. The results of measurement of physical properties of the polymer A-3 obtained are shown in Table 1.

Example 4

The same flask as in Example 1 was charged with 30.6 parts of PGMEA under nitrogen atmosphere, and the temperature of the water bath was increased to 80° C. with stirring.

A monomer solution obtained by mixing 16.0 parts of GBLMA, 20.8 parts of ECHMA, 2.13 parts (3.3% by mole based on the monomers) of CTA-2, 55.1 parts of PGMEA and 0.16 part of AIBN was added dropwise to the flask from a dropping device at a constant rate over 6 hours. The temperature was then kept at 80° C. for an hour. The resulting reaction solution was then added dropwise to about 10 times volume of methanol with stirring to give a white precipitate (polymer A-4). The resulting precipitate was filtrated and dried at 60° C. for about 40 hours under reduced pressure. The inclusion of the structure of formula (107) derived from the chain transfer agent (CTA-2) of formula (35-25) in the polymer was observed in the same manner as in Example 1. The results of measurement of physical properties of the polymer A-4 obtained are shown in Table 1.

Comparative Example 1

Polymer B-1 was prepared in the same manner as in Example 1 except that 0.06 part of n-octyl mercaptan (hereinafter nOM) was used as a chain transfer agent instead of CTA-1. The results of measurement of physical properties of the polymer B-1 obtained are shown in Table 1.

TABLE 1

| | | Example | | | | Comparative Example |
|---|---|---|---|---|---|---|
| | | 1 | 2 | 3 | 4 | 1 |
| Copolymer | | A-1 | A-2 | A-3 | A-4 | B-1 |
| Weight-average molecular weight (Mw) | | 9,500 | 7,000 | 10,500 | 8,500 | 10,000 |
| Molecular distribution (Mw/Mn) | | 1.58 | 1.46 | 1.82 | 1.59 | 1.56 |
| Chain transfer agent used for producing polymer (% by mole based on the monomers) | CTA-1 | 0.4 | | | | |
| | CTA-2 | | 2.2 | | 3.3 | |
| | CTA-3 | | | 1.3 | | |
| | nOM | | | | | 0.4 |
| Chemical composition ratio of structural units in polymer (% by mole) | GBLMA | 40 | 40 | | 50 | 40 |
| | OTDA | | | 40 | | |
| | MAdMA | 40 | | | | 40 |
| | ECHMA | | 40 | 40 | 50 | |
| | HAdMA | 20 | | | | 20 |
| | HAdA | | | 20 | | |
| | CNNMA | | 20 | | | |
| Sensitivity (mJ/cm$^2$) | | 4.6 | 4.4 | 4.8 | 4.2 | 4.8 |
| Resolution (μm) | | 0.12 | 0.12 | 0.12 | 0.13 | 0.14 |
| Number of defects (defects) | | 4 | 3 | 3 | 3 | 23 |
| Line edge roughness (nm) | | 5 | 5 | 4 | 4 | 12 |
| Pattern collapse | | ◎ | ◎ | ◎ | ○ | ◎ |

The resist compositions of the present invention using the resist polymer containing the acid-decomposable unit of formula (1) produced by using the compound of formula (6) or (7) as a structural unit have sufficient sensitivity, high resolution, small line edge roughness and few defects (Examples 1 to 4). Although small collapse of resist patterns was observed in Example 4, this did not cause any practical problems.

On the other hand, the resist composition using a polymer which does not contain the structure represented by formula (1) produced by polymerization using nOM alone as a chain transfer agent has significant line edge roughness and a large number of defects (Comparative Example 1).

Synthetic Example 1

The same flask as in Example 1 was charged with 35.3 parts of dimethylacetamide (hereinafter DMAc) under nitrogen atmosphere. The temperature of the water bath was increased to 80° C. with stirring.

A monomer solution obtained by mixing 11.9 parts of GBLMA, 21.1 parts of MAdMA, 9.4 parts of HAdMA, 63.6 parts of DMAc, 2.24 parts of 4,4'-azobis(4-cyanovaleric acid) (hereinafter ACVA) and 0.85 part of 3-mercaptopropionic acid was added dropwise to the flask from a dropping device at a constant rate over 6 hours. The temperature was then kept at 80° C. for an hour. The resulting reaction solution was then added dropwise to about 10 times volume of methanol/water=9/1 (volume ratio, 25° C.) with stirring to give a white precipitate (polymer precursor P-1). The resulting precipitate was filtrated and dried at 60° C. for about 40 hours under reduced pressure. The bonding of an ACVA residue to a molecular chain terminal of the polymer precursor P-1 was observed from the change of quaternary carbon bonded to an azo group =N—C(CH$_3$)(CN)— to —C(CH$_3$)(CN)— in $^{13}$C-NMR measurement. Likewise, the bonding of 3-mercaptopropionic acid residue was observed from the change of —SH to —S— in $^{33}$S-NMR measurement. The polymer precursor P-1 obtained contains structures represented by formula (111) and formula (112). The results of measurement of physical properties of the polymer are shown in Table 2.

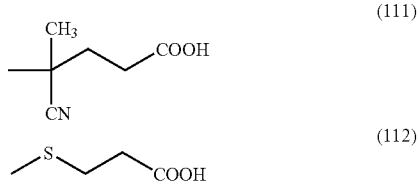

Synthetic Example 2

The same flask as in Example 1 was charged with 34.6 parts of DMAc under nitrogen atmosphere. The temperature of the water bath was increased to 80° C. with stirring.

A monomer solution obtained by mixing 17.8 parts of OTDA, 17.6 parts of ECHMA, 6.2 parts of CNNMA, 62.3 parts of DMAc, 1.84 parts of dimethyl-2,2'-azobisisobutyrate (hereinafter DAIB) and 0.64 parts of mercaptoacetic acid was added dropwise to the flask from a dropping device at a constant rate over 6 hours. The temperature was then kept at 80° C. for an hour. The resulting reaction solution was then added dropwise to about 10 times volume of methanol with stirring to give a white precipitate (polymer precursor P-2). The resulting precipitate was filtrated and dried at 60° C. for about 40 hours under reduced pressure. The inclusion of the structure of formula (113) in the resulting polymer precursor was observed in the same manner as in Synthetic Example 1. The results of measurement of physical properties of the polymer are shown in Table 2.

Synthetic Example 3

Polymer precursor P-3 was prepared in the same manner as in Synthetic Example 1 except that 1.84 parts of DAIB was used instead of 2.24 parts of the polymerization initiator ACVA and the chain transfer agent 3-mercaptopropionic acid was not used. The results of measurement of physical properties of the polymer are shown in Table 2.

TABLE 2

| Synthetic Example | | 1 | 2 | 3 |
|---|---|---|---|---|
| Polymer precursor | | P-1 | P-2 | P-3 |
| Weight-average molecular weight (Mw) | | 5,300 | 6,100 | 13,900 |
| Molecular weight distribution (Mw/Mn) | | 1.29 | 1.37 | 1.78 |
| Chemical composition ratio of structural units in polymer (% by mole) | GBLMA | 45 | | 45 |
| | OTDA | | 40 | |
| | MAdMA | 35 | | 35 |
| | ECHMA | | 45 | |
| | HAdMA | 20 | | 20 |
| | CNNMA | | 15 | |

Example 5

20 g of the polymer precursor P-1 obtained in Synthetic Example 1 was dissolved in 100 g of PGMEA. A catalytic amount of camphorsulfonic acid was added to the solution and then remaining water was distilled off with PGMEA under reduced pressure to adjust the solid concentration to 20% by mass. Subsequently, 1.6 g of a bifunctional divinyl ether compound of formula (36-1) was added to the solution, and the mixture was allowed to react at 25° C. for 12 hours with stirring, and then neutralized with triethylamine. Reprecipitation was then performed as in Synthetic Example 1 to give polymer A-5. The results of measurement of physical properties of the polymer are shown in Table 3.

Example 6

Polymer A-6 was prepared in the same manner as in Example 5 except that the polymer precursor P-2 obtained in Synthetic Example 2 was used instead of the polymer precursor P-1. The results of measurement of physical properties of the polymer are shown in Table 3.

Example 7

Polymer A-7 was prepared in the same manner as in Example 5 except that 2.6 g of a bifunctional divinyl ether compound of formula (36-4) was used instead of 1.6 g of the bifunctional divinyl ether compound of formula (36-1). The results of measurement of physical properties of the polymer are shown in Table 3.

Example 8

Polymer A-8 was prepared in the same manner as in Example 6 except that 2.2 g of a trifunctional divinyl ether compound of formula (36-9) was used instead of 1.6 g of the bifunctional divinyl ether compound of formula (36-1). The results of measurement of physical properties of the polymer are shown in Table 3.

Comparative Example 2

A resist composition was prepared using the polymer precursor P-3 obtained in Synthetic Example 3 as is and physical properties thereof were measured. The results are shown in Table 3.

TABLE 3

| | Example | | | | Comparative Example |
|---|---|---|---|---|---|
| | 5 | 6 | 7 | 8 | 2 |
| Copolymer | A-5 | A-6 | A-7 | A-8 | P-3 |
| Polymer precursor used | P-1 | P-2 | P-1 | P-2 | P-3 |
| Multifunctional vinyl ether compound used | formula (36-1) | formula (36-1) | formula (36-4) | formula (36-9) | none |
| Weight-average molecular weight (Mw) | 14,200 | 15,000 | 11,400 | 15,300 | 13,900 |
| Molecular weight distribution (Mw/Mn) | 1.97 | 1.99 | 1.66 | 1.71 | 1.78 |
| Sensitivity (mJ/cm$^2$) | 5.4 | 5.5 | 4.8 | 4.7 | 5.5 |
| Resolution (µm) | 0.12 | 0.12 | 0.12 | 0.12 | 0.13 |
| Number of defects (defects) | 5 | 4 | 6 | 4 | 18 |
| Line edge roughness (nm) | 5 | 4 | 5 | 3 | 10 |

The resist compositions of the present invention using the resist polymer containing, as a structural unit, the acid-decomposable unit of formula (1) produced by reacting the polymer precursor (P) containing at least one structure selected from the group consisting of formulas (8-1) to (8-4) at one or more molecular chain terminal and the vinyl ether compound represented by formula (9) have sufficient sensitivity, high resolution, small line edge roughness and few defects (Examples 5 to 8).

On the other hand, the resist composition using a polymer that does not contain the structure represented by formula (1) has significant line edge roughness and a large number of defects (Comparative Example 2).

Example 9

The same flask as in Example 1 was charged with 175.8 parts of PGMEA under nitrogen atmosphere. The temperature of the water bath was increased to 80° C. with stirring. A monomer solution obtained by mixing 41.0 parts of CNNMA, 68.0 parts of GBLMA, 93.6 parts of MAdMA, 8.4 parts of 2-methyl-2,4-butanediol dimethacrylate (hereinafter MBDMA) represented by formula (40-1), 316.5 parts of PGMEA, 6.56 parts of AIBN and 5.11 parts of nOM was added dropwise to the flask using a dropping device at a constant rate over 6 hours. The temperature was then kept at 80° C. for an hour. The resulting reaction solution was then added dropwise to about 30 times volume of methanol with stirring to give a white precipitate (polymer A-9). The resulting precipitate was filtrated and washed in about 30 times volume of methanol based on the monomers used for polymerization to remove monomers remaining in the precipitate. The precipitate was then filtrated and dried at 50° C. for about 40 hours under reduced pressure. The results of measurement of physical properties of the polymer A-9 obtained are shown in Table 4.

Example 10

The same flask as in Example 1 was charged with 180.0 parts of PGMEA under nitrogen atmosphere. The temperature of the water bath was increased to 80° C. with stirring. A monomer solution obtained by mixing 47.2 parts of HAdMA, 93.6 parts of MAdMA, 68.0 parts of GBLMA, 7.2 parts of MBDMA, 324.0 parts of PGMEA, 6.56 parts of AIBN and 4.38 parts of nOM was added dropwise to the flask using a dropping device at a constant rate over 6 hours. The temperature was then kept at 80° C. for an hour. The resulting reaction solution was then added dropwise to about 30 times volume of methanol with stirring to give a white precipitate (polymer A-10). The subsequent procedures were performed in the same manner as in Example 9 to give polymer A-10. The results of measurement of physical properties of the polymer A-10 obtained are shown in Table 4.

Example 11

The same flask as in Example 1 was charged with 168.3 parts of PGMEA under nitrogen atmosphere. The temperature of the water bath was increased to 80° C. with stirring. A monomer solution obtained by mixing 117.0 parts of MAdMA, 85.0 parts of GBLMA, 0.3 part of 2,5-dimethyl-2,5-hexanediol diacrylate (hereinafter DMHDA) represented by the following formula (40-2), 303.0 parts of PGMEA, 6.56 parts of AIBN and 1.46 parts of nOM was added dropwise to the flask using a dropping device at a constant rate over 6 hours. The temperature was then kept at 80° C. for an hour. The resulting reaction solution was then added dropwise to about 30 times volume of methanol with stirring to give a white precipitate (polymer A-11). The subsequent procedures were performed in the same manner as in Example 9 to give polymer A-11. The results of measurement of physical properties of the polymer A-11 obtained are shown in Table 4.

Example 12

The same flask as in Example 1 was charged with 176.2 parts of PGMEA under nitrogen atmosphere. The temperature of the water bath was increased to 80° C. with stirring. A monomer solution obtained by mixing 41.0 parts of CNNMA, 93.6 parts of MAdMA, 68.0 parts of GBLMA, 8.9 parts of DMHDA, 317.2 parts of PGMEA, 6.56 parts of AIBN and 5.11 parts of nOM was added dropwise to the flask using a dropping device at a constant rate over 6 hours. The temperature was then kept at 80° C. for an hour. The resulting reaction solution was then added dropwise to about 30 times volume of methanol with stirring to give a white precipitate (polymer A-12). The subsequent procedures were performed in the same manner as in Example 9 to give polymer A-12. The results of measurement of physical properties of the polymer A-12 obtained are shown in Table 4.

Example 13

The same flask as in Example 1 was charged with 180.4 parts of PGMEA under nitrogen atmosphere. The temperature of the water bath was increased to 80° C. with stirring. A monomer solution obtained by mixing 47.2 parts of HAdMA, 93.6 parts of MAdMA, 68.0 parts of GBLMA, 7.6 parts of DMHDA, 324.6 parts of PGMEA, 6.56 parts of AIBN and 4.38 parts of nOM was added dropwise to the flask using a dropping device at a constant rate over 6 hours. The temperature was then kept at 80° C. for an hour. The resulting reaction solution was then added dropwise to about 30 times volume of methanol with stirring to give a white precipitate (polymer A-13). The subsequent procedures were performed in the same manner as in Example 9 to give polymer A-13. The results of measurement of physical properties of the polymer A-13 obtained are shown in Table 4.

Example 14

The same flask as in Example 1 was charged with 39.0 parts of PGMEA under nitrogen atmosphere. The temperature of the water bath was increased to 80° C. with stirring.

A monomer solution obtained by mixing 13.3 parts of GBLMA, 19.2 parts of MAdMA, 9.4 parts of HAdMA, 5.1 parts of DMHDA, 68.8 parts of PGMEA and 6.56 parts of AIBN was added dropwise to the flask from a dropping device at a constant rate over 6 hours. The temperature was then kept at 80° C. for an hour. The resulting reaction solution was then added dropwise to about 10 times volume of methanol with stirring to give a white precipitate (polymer A-14). The resulting precipitate was filtrated and dried at 60° C. for about 40 hours under reduced pressure. The results of measurement of physical properties of the polymer A-14 obtained are shown in Table 4.

TABLE 4

|  |  | Example | | | | | |
|---|---|---|---|---|---|---|---|
|  |  | 9 | 10 | 11 | 12 | 13 | 14 |
| Copolymer | | A-9 | A-10 | A-11 | A-12 | A-13 | A-14 |
| Weight-average molecular weight (Mw) | | 8,500 | 11,000 | 10,000 | 10,000 | 12,000 | 10,000 |
| Molecular weight distribution (Mw/Mn) | | 1.75 | 1.80 | 1.74 | 1.80 | 1.85 | 1.75 |
| Feed ratio of cross- | DMHDA | | | 0.1 | 3.5 | 3 | 10 |
| linking agent used for producing polymer (% by mole based on the monomers) | MBDMA | 3.5 | 3 | | | | |

TABLE 4-continued

| | | Example | | | | | |
|---|---|---|---|---|---|---|---|
| | | 9 | 10 | 11 | 12 | 13 | 14 |
| Feed ratio of monomers used for producing polymer (% by mole) | GBLMA | 40 | 40 | 50 | 40 | 40 | 39 |
| | MAdMA | 40 | 40 | 50 | 40 | 40 | 41 |
| | HAdMA | | 20 | | | 20 | 20 |
| | CNNMA | 20 | | | 20 | | |
| Sensitivity (mJ/cm$^2$) | | 4.6 | 5.0 | 5.2 | 4.9 | 5.1 | 5.1 |
| Resolution (μm) | | 0.11 | 0.13 | 0.13 | 0.11 | 0.12 | 0.13 |
| Number of defects (defects) | | 7 | 10 | 15 | 8 | 12 | 7 |
| Line edge roughness (nm) | | 5 | 8 | 10 | 6 | 8 | 6 |
| Tailing | | ○ | ○ | ○ | ○ | ○ | ○ |

Example 15

Polymer A-15 was prepared in the same manner as in Example 14 except that 6.3 parts of a cross-linking agent represented by formula (115) (hereinafter BDADMA) was used instead of DMHDA. The polymer A-15 contains the structure of formula (116). The results of measurement of physical properties of the polymer are shown in Table 5.

(115)

(116)

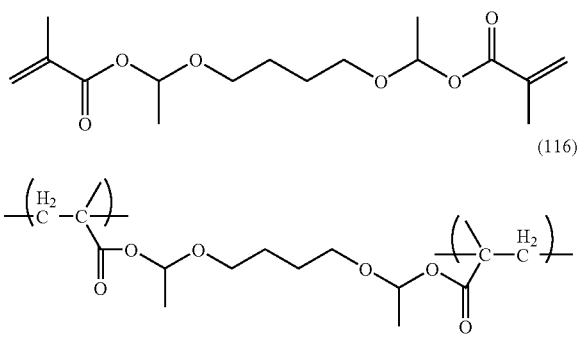

Example 16

The same flask as in Example 1 was charged with 35.4 parts of PGMEA under nitrogen atmosphere. The temperature of the water bath was increased to 80° C. with stirring.

A monomer solution obtained by mixing 13.6 parts of GBLMA, 15.7 parts of ECHMA, 6.3 parts of BDADMA, 8.2 parts of CNNMA, 62.5 parts of PGMEA and 11.50 parts of DAIB was added dropwise to the flask from a dropping device at a constant rate over 6 hours. The temperature was then kept at 80° C. for an hour. The resulting reaction solution was then added dropwise to about 10 times volume of methanol with stirring to give a white precipitate (polymer A-16). The resulting precipitate was filtrated and dried at 60° C. for about 40 hours under reduced pressure. The polymer A-16 obtained contains the structure of formula (116). The results of measurement of physical properties of the polymer are shown in Table 5.

Example 17

The same flask as in Example 1 was charged with 35.9 parts of PGMEA under nitrogen atmosphere. The temperature of the water bath was increased to 80° C. with stirring.

A monomer solution obtained by mixing 15.6 parts of GBLMA, 21.2 parts of MAdMA, 6.3 parts of BDADMA, 64.6 parts of PGMEA and 3.94 parts of AIBN was added dropwise to the flask from a dropping device at a constant rate over 6 hours. The temperature was then kept at 80° C. for an hour. The resulting reaction solution was then added dropwise to about 10 times volume of methanol with stirring to give a white precipitate (polymer A-16). The resulting precipitate was filtrated and dried at 60° C. for about 40 hours under reduced pressure. The polymer A-16 obtained contains the structure of formula (116). The results of measurement of physical properties of the polymer are shown in Table 5.

TABLE 5

| | | Example | | |
|---|---|---|---|---|
| | | 15 | 16 | 17 |
| Copolymer | | A-15 | A-16 | A-17 |
| Weight-average molecular weight (Mw) | | 10,000 | 10,500 | 10,000 |
| Molecular weight distribution (Mw/Mn) | | 1.68 | 1.72 | 1.64 |
| Chemical composition ratio of structural unit derived from cross-linking agent in polymer (% by mole) | BDADMA | 10 | 10 | 1 |
| Chemical composition ratio of structural units in polymer (% by mole) | GBLMA | 40 | 40 | 50 |
| | MAdMA | 40 | | 50 |
| | ECHMA | | 40 | |
| | HAdMA | 20 | | |
| | CNNMA | | 20 | |
| Sensitivity (mJ/cm$^2$) | | 4.2 | 4.3 | 4.7 |
| Resolution (μm) | | 0.12 | 0.12 | 0.13 |
| Number of defects (defects) | | 2 | 2 | 10 |
| Line edge roughness (nm) | | 2 | 3 | 7 |
| Tailing | | ○ | ○ | ○ |

Comparative Example 3

Polymerization reaction was performed in the same manner as in Example 11 except that DMHDA was used in an amount of 38.0 parts. The mixture in the flask gelled during polymerization and therefore no polymer was obtained.

Comparative Example 4

The same flask as in Example 9 was charged with 168.8 parts of PGMEA under nitrogen atmosphere. The temperature of the water bath was increased to 80° C. with stirring. A monomer solution obtained by mixing 41.0 parts of CNNMA, 93.6 parts of MAdMA, 68.0 parts of GBLMA, 303.9 parts of PGMEA, 6.56 parts of AIBN and 1.75 parts of nOM was added dropwise to the flask using a dropping device at a constant rate over 6 hours. The temperature was then kept at 80° C. for an hour. The resulting reaction solution was then added dropwise to about 30 times volume of methanol with stirring to give a white precipitate (polymer B4). The subsequent procedures were performed in the same manner as in Example 9 to give polymer B4. The results of measurement of physical properties of the polymer B4 obtained are shown in Table 6.

Comparative Example 5

The same flask as in Example 9 was charged with 174.0 parts of PGMEA under nitrogen atmosphere. The temperature of the hot water bath was increased to 80° C. with stirring. A monomer solution obtained by mixing 47.2 parts of HAdMA, 93.6 parts of MAdMA, 68.0 parts of GBLMA, 313.2 parts of PGMEA, 6.56 parts of AIBN and 0.58 part of nOM was added dropwise to the flask using a dropping device at a constant rate over 6 hours. The temperature was then kept at 80° C. for an hour. The resulting reaction solution was then added dropwise to about 30 times volume of methanol with stirring to give a white precipitate (polymer B-5). The subsequent procedures were performed in the same manner as in Example 9 to give polymer B-5. The results of measurement of physical properties of the polymer B-5 obtained are shown in Table 6.

TABLE 6

| | | Comparative Example | | |
|---|---|---|---|---|
| | | 3 | 4 | 5 |
| Copolymer | | B-3 | B-4 | B-5 |
| Weight-average molecular weight (Mw) | | cannot be evaluated because of gelation | 8,500 | 10,500 |
| Molecular weight distribution (Mw/Mn) | | | 1.60 | 1.75 |
| Feed ratio of cross-linking agent used for producing polymer (% by mole based on the monomers) | DMHDA MBDMA | 15 | | |
| Feed ratio of monomers used for producing polymer (% by mole) | GBLMA MAdMA HAdMA CNNMA | 50 50 | 40 40 20 | 40 40 20 |
| Sensitivity (mJ/cm$^2$) | | cannot be evaluated because of gelation | 4.7 | 5.0 |
| Resolution (μm) | | | 0.13 | 0.14 |
| Number of defects (defects) | | | 19 | 25 |
| Line edge roughness (nm) | | | 13 | 14 |
| Tailing | | | X | X |

The resist compositions of the present invention (Examples 9 to 17) using the resist polymer containing the acid-decomposable unit of formula (3) produced by using the monomer of formula (13) as a structural unit have sufficient sensitivity, high resolution and small line edge roughness. In addition, the compositions produce few defects and no tailing.

In particular, the resist compositions using the resist polymer containing the acid-decomposable unit of formula (3) as a structural unit and a structural unit containing a hydrophilic group (Examples 9, 10, 12, 13, and 14) have smaller line edge roughness. In addition, the compositions produce fewer defects.

Further, the resist compositions using the resist polymer in which the acid-decomposable unit of formula (3) is the structure of formula (5) and which contains a structural unit containing a hydrophilic group (Examples 15, 16) have still smaller line edge roughness and produce still fewer defects.

On the other hand, the resist compositions using a polymer that does not contain the structure represented by formula (3) (Comparative Examples 4, 5) have significant line edge roughness and a large number of defects, and also suffer from tailing.

When the amount of the monomer of formula (13) was large, the resulting product could not be used as a resist polymer due to gelation of the polymer (Comparative Example 3).

Example 18

Synthesis of Chain Transfer Agent

CTA-2

A 100 mL flask was charged with 12.716 g (50 mmol) of diacrylate represented by the following formula (120) under argon atmosphere. The temperature of the system was adjusted to 25° C. and 5.0 mL of toluene was added thereto followed by stirring to dissolve the diacrylate. 16.31 g (150 mmol) of thioacetic acid was added thereto and the mixture was aged at 25° C. for 8 hours. The reaction solution was then concentrated to give 20.3 g of concentrate. 5.0 g of the concentrate was weighed and placed in a 500 mL round bottom flask and 50 mL of methanol was added thereto. 50 mL of a saturated sodium bicarbonate solution was then added thereto dropwise over 30 minutes with cooling on an ice bath. Four hours after completion of the addition, 100 mL of pure water and 100 mL of ethyl acetate were added thereto and the mixture was stirred. The oil phase of the reaction solution was concentrated. The concentrate was recrystallized using hexane to give 2.91 g of CTA-2 shown below (yield 75%).

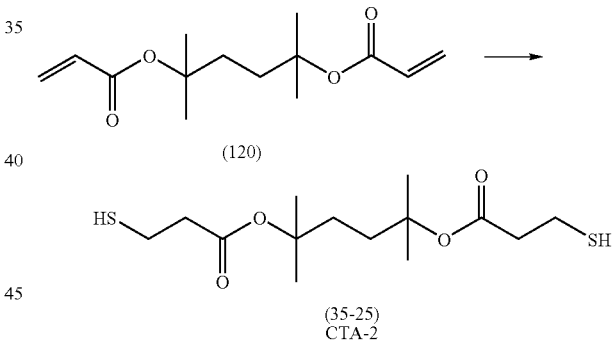

(120)

(35-25)
CTA-2

Example 19

Synthesis of Chain Transfer Agent

CTA-1

4.17 g (40 mmol) of 3-methyl-1,3-butanediol and 20.0 mL of tetrahydrofuran (THF) were weighed and placed in a 500 mL round bottom flask. The temperature of the system was adjusted to 25° C. and the mixture was stirred. After adding 18.98 g (240 mmol) of pyridine, 36.6 g (240 mmol) of S-acetyl mercaptoacetic acid chloride were added thereto dropwise over 30 minutes. After the addition, the mixture was aged at 25° C. for 5 hours. Subsequently, 20 mL of toluene and 20 mL of pure water were added thereto followed by stirring and the oil phase was concentrated. 35.0 g of the concentrate was weighed and placed in a 500 mL round bottom flask and 100 mL of methanol was added thereto. 200 mL of a saturated sodium bicarbonate solution was then added thereto dropwise over 30 minutes with cooling on an ice bath. Four hours after completion of the addition, 50 mL of pure water and 100 mL of ethyl acetate were added thereto and the mixture was stirred. The oil phase of the reaction solution was concentrated. The concentrate was recrystallized using hexane to give 5.04 g of CTA-1 shown below (yield 50%).

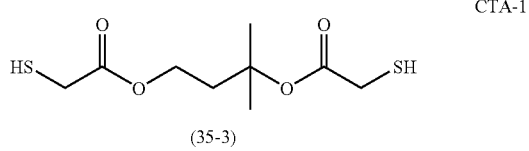

CTA-1

(35-3)

Example 20

Synthesis of Chain Transfer Agent

CTA-4

A 500 mL round bottom flask was charged with 7.10 g (50 mmol) of butyl divinyl ether. The temperature of the system was adjusted to 25° C. and the mixture was stirred. 20.1 g (150 mmol) of S-acetyl mercaptoacetic acid was added thereto and the mixture was aged at 70° C. for 6 hours. Subsequently, 136 mL of a saturated sodium bicarbonate solution and 50 mL of toluene were added thereto, and the toluene layer was concentrated to give 10.1 g of concentrate. 10.1 g of the concentrate was weighed and placed in a 500 mL round bottom flask and 100 mL of a saturated sodium bicarbonate solution was added thereto dropwise over 60 minutes with cooling on an ice bath. Four hours after completion of the addition, 100 mL of pure water and 100 mL of ethyl acetate were added thereto followed by stirring and the oil phase was concentrated. The concentrate was recrystallized using hexane to give 1.14 g of CTA-4 shown below (yield 70%).

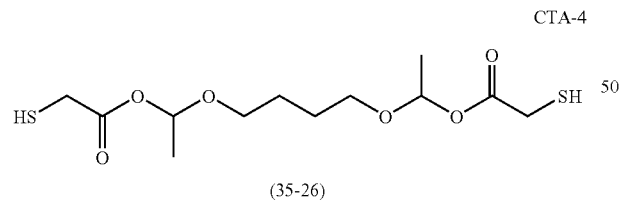

CTA-4

(35-26)

The invention claimed is:

1. A compound represented by formula (6):

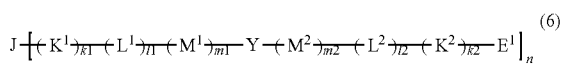

(6)

wherein

J is selected from the group consisting of:

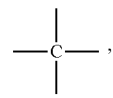

(24-1)

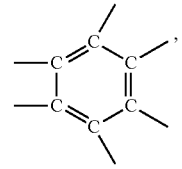

(24-61)

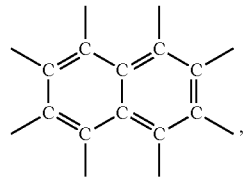

(24-179)

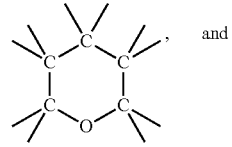

(24-190)

and

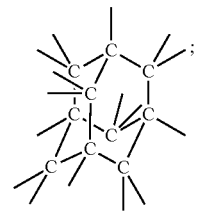

(24-198)

$E^1$ represents a functional group having polymerization termination ability or chain transfer ability;

$K^1$ and $K^2$ each independently represent at least one selected from the group consisting of alkylene, cycloalkylene, oxyalkylene, arylene, a divalent thiazoline ring, a divalent oxazoline ring and a divalent imidazoline ring;

$L^1$ and $L^2$ each independently represent at least one selected from the group consisting of —C(O)O—, —C(O)— and —OC(O)—;

$M^1$ and $M^2$ each independently represent at least one selected from the group consisting of alkylene, cycloalkylene, oxyalkylene and arylene;

Y represents an acid-decomposable linkage;

n represents an integer corresponding to the valencies of J; and k1, k2, l1, l2, m1 and m2 each represent the number of $K^1$, $K^2$, $L^1$, $L^2$, $M^1$ and $M^2$, respectively, and are each independently 0 or 1.

2. The compound represented by formula (6) according to claim 1, wherein $E^1$ is at least one member selected from the group consisting of a hydroxyl group, a thiol group, an alkyl group substituted with a halogen atom, and a nitroxide radical.

3. The compound according to claim 1, wherein J is

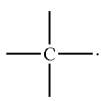
(24-1)

4. The compound according to claim 1, wherein J is

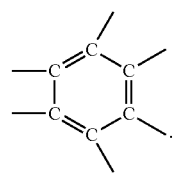
(24-61)

5. The compound according to claim 1, wherein J is

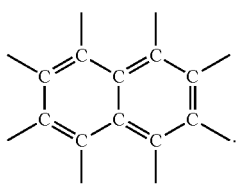
(24-179)

6. The compound according to claim 1, wherein J is

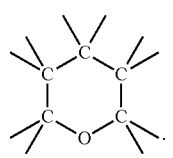
(24-190)

7. The compound according to claim 1, wherein J is

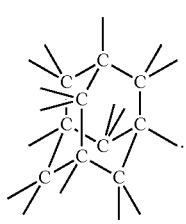
(24-198)

8. A compound represented by formula (7):

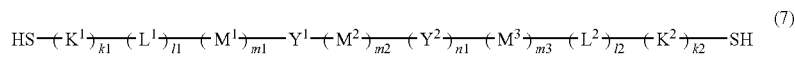
(7)

wherein
S represents a sulfur atom;
$K^1$ and $K^2$ each independently represent at least one selected from the group consisting of alkylene, cycloalkylene, oxyalkylene, arylene, a divalent thiazoline ring, a divalent oxazoline ring and a divalent imidazoline ring;
$L^1$ and $L^2$ each independently represent at least one selected from the group consisting of —C(O)O—, —C(O)— and —OC(O)—;
$M^1$ to $M^3$ each independently represent at least one selected from the group consisting of alkylene, cycloalkylene, oxyalkylene and arylene;
$Y^1$ and $Y^2$ each independently represent an acid-decomposable linkage;
k1, k2, l1, l2, m1, m2, and m3 each represent the number of $K^1$, $K^2$, $L^1$, $L^2$, $M^1$, $M^2$, $M^3$ and $Y^2$, respectively, and are each independently 0 or 1; and
n1 represents the number of $Y^2$ and is 1.

9. The compound according to claim 8, which is obtained by a method comprising adding a carboxylic acid having a sulfur atom represented by formula (21) to a divinyl ether represented by formula (20) to obtain a compound represented by formula (22), and thereafter dithiolating the compound represented by formula (22):

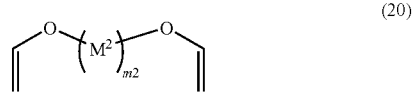
(20)

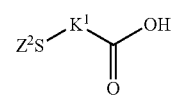
(21)

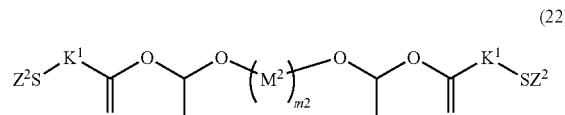
(22)

wherein
$M^2$ represents alkylene, cycloalkylene, oxyalkylene or arylene;
m2 represents 1;
S represents a sulfur atom;
$Z^2$ represents an acyl group; and
$K^1$ represents at least one selected from the group consisting of alkylene, cycloalkylene, oxyalkylene, arylene, a divalent thiazoline ring, a divalent oxazoline ring and a divalent imidazoline ring.

10. The compound according to claim 9, wherein said divinyl ether represented by formula (20) is at least one member selected from the group consisting of:

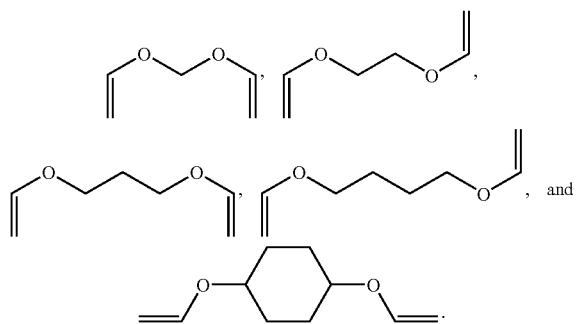

11. The compound according to claim 9, wherein said carboxylic acid having a sulfur atom represented by formula (21) is at least one member selected from the group consisting of:

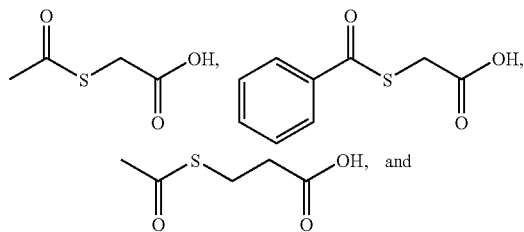

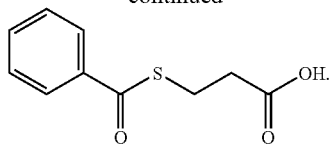

12. The compound according to claim 9, wherein said carboxylic acid having a sulfur atom represented by formula (21) is present in an amount of from 2 to 8 times the amount of said divinyl ether on a per molar basis.

13. A compound selected from the group consisting of:

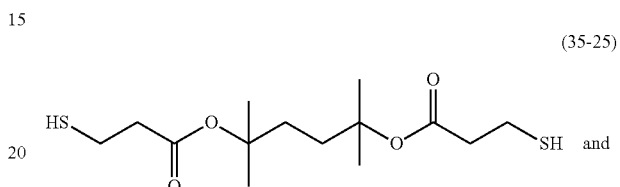
(35-25)

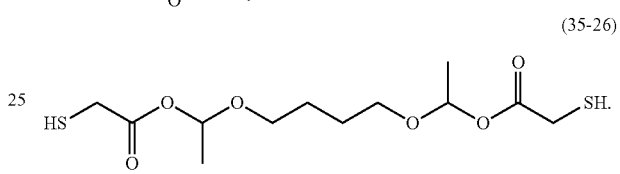
(35-26)

* * * * *